US006353563B1

(12) United States Patent
Hii et al.

(10) Patent No.: US 6,353,563 B1
(45) Date of Patent: Mar. 5, 2002

(54) BUILT-IN SELF-TEST ARRANGEMENT FOR INTEGRATED CIRCUIT MEMORY DEVICES

(75) Inventors: Kuong Hua Hii, Singapore (SG); Danny R. Cline; Theo J. Powell, both of Dallas, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/268,281

(22) Filed: Mar. 15, 1999

Related U.S. Application Data

(63) Continuation of application No. 08/846,922, filed on Apr. 30, 1997, now Pat. No. 5,883,843
(60) Provisional application No. 60/061,516, filed on Apr. 30, 1996.

(51) Int. Cl.$^7$ ............................................. G01R 31/28
(52) U.S. Cl. .......................... 365/201; 714/30; 714/37; 714/39; 714/25; 714/48; 714/724; 714/733; 714/734; 371/22.3; 371/22.01
(58) Field of Search ................................ 365/200, 201; 371/22.1, 22.3; 714/30, 37, 25, 48, 39, 724, 733, 734

(56) References Cited

U.S. PATENT DOCUMENTS

| 5,006,787 A | * | 4/1991 | Katircioglu et al. ....... 324/73.1 |
| 5,138,619 A | * | 8/1992 | Fasang et al. ............. 371/21.1 |
| 5,329,533 A | * | 7/1994 | Lin ........................... 371/22.3 |
| 5,568,437 A | * | 10/1996 | Jamal ........................ 365/201 |
| 5,640,404 A | * | 6/1997 | Satish ........................ 371/22.3 |
| 5,751,987 A | * | 5/1998 | Mahant-Shetti et al. .... 395/405 |
| 5,875,153 A | | 2/1999 | Hii |
| 5,878,051 A | * | 3/1999 | Sharma et al. ............. 371/21.1 |
| 5,883,843 A | * | 3/1999 | Hii et al. .................... 365/201 |
| 5,923,599 A | | 7/1999 | Hii et al. |
| 5,925,144 A | * | 7/1999 | Sebaa ......................... 714/733 |
| 5,936,900 A | | 8/1999 | Hii et al. |
| 5,953,272 A | | 9/1999 | Powell et al. |
| 5,959,912 A | | 9/1999 | Powell et al. |
| 5,991,213 A | * | 11/1999 | Cline et al. ................. 365/201 |
| 6,137,734 A | * | 10/2000 | Schnoner et al. .......... 365/194 |

FOREIGN PATENT DOCUMENTS

| JP | 409127206 | * | 5/1997 |
| JP | 410143386 A | * | 5/1998 |
| JP | 10302499 | * | 11/1998 |

OTHER PUBLICATIONS

U.S. application No. 09/005,081, Powell et al., filed Jan. 9, 1998.
U.S. application No. 09/004,973, Powell et al., filed Jan. 9, 1998.
U.S. application No. 09/005,398, Hii, filed Jan. 9, 1998.
U.S. application No. 09/004,998, Kline et al., filed Jan. 9, 1998.
Takeshima et al.; A 55–ns 16–Mb DRAM with Built–In Self–Test Function Using Microprogram ROM; IEEE Journal of Solid–State Circuits, vol. 25, No. 4, Aug. 1990; pp. 903–911.
Takeshima et al.; A 55ns 16Mb DRAM; 1989 IEEE International Solid–State Circuits Conference; Feb. 17, 1989; pp. 246–247.
Voss et al.; A 14–ns 256K × 1CMOS SRAM with Multiple Test Modes; IEEE Journal of Solid–State Circuits, vol. 24, No., Aug. 1989; pp. 874–880.
Miyaji et al.; A Multibit Test Trigger Circuit for Megabit SRAMs; IEE Journal of Solid–State Circuits, vol. 25, No. 1, Feb. 1990; pp. 68–71.

\* cited by examiner

*Primary Examiner*—Viet Q. Nguyen
(74) *Attorney, Agent, or Firm*—Frank D. Cimino; W. James Brady; Frederick J. Telecky, Jr.

(57) ABSTRACT

An integrated circuit has a built-in self-test (BIST) arrangement (60). The built-in self-test arrangement includes a read only memory (ROM), (140) that stores test algorithm instructions. A ROM logic circuit (410) receives an instruction read from the read only memory and produces a group of output signals dependent upon the instruction. A BIST register 420 receives and stores the group of output signals from the logic circuit for controlling self-test of the integrated circuit.

43 Claims, 94 Drawing Sheets

FIG. 19B    FROM FIG. 19A
B_ADDRNG
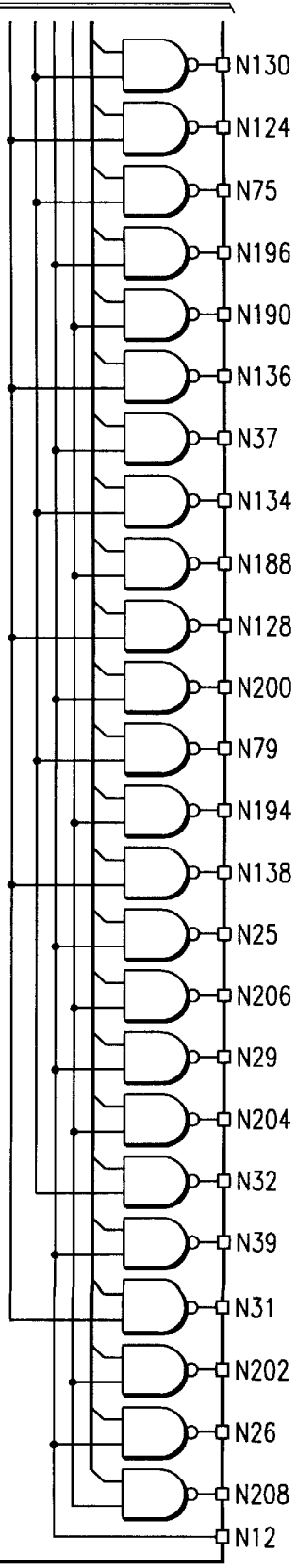

256 M SDRAM BIST ALGORITHM STORAGE CONFIGURATION

| Algorithm | Hex add | ROM | | | | | | | | | | | | MICRO CODE |
|---|---|---|---|---|---|---|---|---|---|---|---|---|---|---|
| | | Read | Write | Xen | Yen | Test1 | Test0 | D5 Tset0 | D4 Tset1 | D3 Data | D2 ED | D1 Ckbd | D0 Alt | Program Control / Array Access |
| gross | 0 | 0 | 0 | 0 | 0 | 0 | 0 | 0 | 0 | 0 | 0 | 0 | 0 | zron: jnte paus |
| gross | 1 | 0 | 1 | 1 | 1 | 0 | 0 | 0 | 0 | 0 | 0 | 0 | 1 | z1: write all w0 tsetA d01 |
| gross | 2 | 1 | 0 | 1 | 1 | 0 | 0 | 1 | 1 | 0 | 0 | 0 | 1 | read all r0 tsetA dec d01 |
| gross | 3 | 0 | 0 | 0 | 0 | 0 | 1 | 0 | 0 | 0 | 0 | 0 | 1 | dinvj z1 |
| pause | 4 | 0 | 0 | 0 | 0 | 1 | 0 | 0 | 0 | 0 | 0 | 0 | 0 | paus: jnte xmarch |
| pause | 5 | 0 | 1 | 1 | 1 | 0 | 0 | 0 | 0 | 0 | 0 | 1 | 0 | ps1: write all w0 ckbd tsetA |
| pause | 6 | 0 | 0 | 0 | 0 | 0 | 0 | 0 | 0 | 0 | 0 | 0 | 0 | ps2: pause |
| pause | 7 | 0 | 0 | 0 | 0 | 1 | 0 | 0 | 0 | 0 | 0 | 0 | 0 | jtnc ps2 |
| pause | 8 | 1 | 0 | 1 | 1 | 0 | 0 | 0 | 0 | 0 | 1 | 1 | 0 | read all ckbd tsetA |
| pause | 9 | 0 | 0 | 0 | 0 | 0 | 1 | 0 | 0 | 0 | 0 | 0 | 1 | dinvj ps1 |
| xmarch | a | 0 | 0 | 0 | 0 | 1 | 0 | 0 | 0 | 0 | 0 | 0 | 0 | xmarch: jnte ymarch |
| xmarch | b | 0 | 1 | 1 | 1 | 0 | 0 | 0 | 1 | 0 | 0 | 0 | 0 | write all w0 tsetB |
| xmarch | c | 1 | 1 | 1 | 1 | 0 | 0 | 1 | 0 | 1 | 1 | 0 | 0 | x1: read row r0 write w1 tsetA |
| xmarch | d | 0 | 0 | 1 | 0 | 0 | 0 | 0 | 0 | 0 | 0 | 0 | 0 | inc col janc x1 |
| xmarch | e | 1 | 1 | 1 | 0 | 0 | 0 | 1 | 0 | 1 | 1 | 0 | 0 | x2: read row r1 write w0 tsetB |
| xmarch | f | 0 | 0 | 1 | 0 | 0 | 0 | 0 | 0 | 0 | 0 | 0 | 0 | inc col janc x2 |
| xmarch | 10 | 1 | 0 | 1 | 1 | 0 | 0 | 0 | 0 | 0 | 0 | 0 | 0 | read all r0 tsetA |
| ymarch | 11 | 0 | 0 | 0 | 0 | 1 | 0 | 0 | 0 | 0 | 0 | 0 | 0 | ymarch: jnte sdist |
| ymarch | 12 | 0 | 1 | 1 | 1 | 0 | 0 | 0 | 0 | 0 | 0 | 0 | 0 | write all w0 |
| ymarch | 13 | 1 | 1 | 1 | 1 | 0 | 0 | 1 | 0 | 0 | 0 | 1 | 0 | y1: read col r0 write w1 |
| ymarch | 14 | 0 | 0 | 0 | 1 | 0 | 0 | 0 | 0 | 0 | 0 | 0 | 1 | inc row janc y1 |
| ymarch | 15 | 1 | 1 | 1 | 1 | 0 | 0 | 0 | 1 | 0 | 0 | 0 | 0 | y2: read col r1 write w0 |
| ymarch | 16 | 0 | 0 | 0 | 1 | 0 | 0 | 0 | 0 | 0 | 0 | 0 | 0 | inc row janc y2 |
| ymarch | 17 | 1 | 0 | 1 | 1 | 0 | 0 | 0 | 0 | 0 | 0 | 0 | 0 | read all r0 tsetA |
| sdist | 18 | 0 | 0 | 0 | 0 | 1 | 0 | 0 | 0 | 0 | 0 | 0 | 1 | sdist: jnte ldist |
| sdist | 19 | 0 | 1 | 1 | 1 | 0 | 0 | 0 | 0 | 0 | 0 | 0 | 0 | sd1: write all w0 tsetA |
| sdist | 1a | 1 | 0 | 1 | 1 | 0 | 0 | 0 | 0 | 1 | 0 | 0 | 0 | sd2: read col r0 tsetA |
| sdist | 1b | 0 | 1 | 0 | 1 | 0 | 0 | 1 | 0 | 0 | 0 | 0 | 0 | sd3: write col w1 tsetA |
| sdist | 1c | 0 | 0 | 0 | 1 | 0 | 0 | 0 | 1 | 0 | 1 | 1 | 1 | jtnc sd3 |
| sdist | 1d | 0 | 0 | 0 | 0 | 0 | 0 | 0 | 0 | 0 | 0 | 0 | 0 | write col w0 tsetA |

FROM FIG. 28A

| State | # | | | | | | | | | | | Instruction |
|---|---|---|---|---|---|---|---|---|---|---|---|---|
| sdist | 1e | 1 | 0 | 0 | 0 | 0 | 0 | 0 | 0 | 0 | 0 | refresh |
| sdist | 1f | 0 | 0 | 1 | 1 | 1 | 1 | 1 | 1 | 1 | 0 | inc row janc sd2 |
| sdist | 20 | 1 | 0 | 0 | 0 | 0 | 0 | 0 | 0 | 0 | 0 | read all r0 tsetA |
| sdist | 21 | 0 | 0 | 0 | 0 | 0 | 0 | 0 | 0 | 1 | 1 | dinvj sd1 |
| ldist | 22 | 0 | 1 | 0 | 1 | 1 | 1 | 1 | 1 | 0 | 0 | ldist: jnte pdist |
| ldist | 23 | 0 | 0 | 0 | 0 | 0 | 0 | 0 | 0 | 0 | 0 | ld1: write all w0 tsetB |
| ldist | 24 | 1 | 0 | 0 | 1 | 1 | 1 | 1 | 1 | 0 | 0 | ld2: read col r0 tsetB |
| ldist | 25 | 0 | 0 | 1 | 0 | 0 | 0 | 0 | 0 | 0 | 0 | ld3: write col w1 tsetB |
| ldist | 26 | 0 | 0 | 0 | 1 | 1 | 1 | 1 | 1 | 0 | 0 | jtnc ld3 |
| ldist | 27 | 0 | 0 | 0 | 0 | 0 | 0 | 0 | 0 | 1 | 0 | write col w0 tsetB |
| ldist | 28 | 1 | 0 | 0 | 0 | 0 | 0 | 0 | 0 | 0 | 0 | refresh |
| ldist | 29 | 0 | 0 | 1 | 1 | 1 | 1 | 1 | 1 | 1 | 0 | inc row janc ld2 |
| ldist | 2a | 1 | 0 | 0 | 1 | 1 | 1 | 1 | 1 | 0 | 0 | read all r0 tsetB |
| ldist | 2b | 0 | 0 | 0 | 0 | 0 | 0 | 0 | 0 | 1 | 1 | dinvj ld1 |
| pdist | 2c | 0 | 1 | 1 | 1 | 1 | 1 | 1 | 1 | 0 | 0 | pdist: jnte burnin |
| pdist | 2d | 0 | 0 | 0 | 0 | 0 | 0 | 0 | 0 | 0 | 0 | pd1: write all w0 tsetA |
| pdist | 2e | 1 | 0 | 0 | 1 | 1 | 1 | 1 | 1 | 0 | 0 | pd2: read col r0 tsetC |
| pdist | 2f | 0 | 0 | 1 | 0 | 0 | 0 | 0 | 0 | 0 | 0 | pd3: write col w1 tsetC |
| pdist | 30 | 0 | 0 | 0 | 1 | 1 | 1 | 1 | 1 | 0 | 0 | jtnc pd3 |
| pdist | 31 | 0 | 0 | 0 | 0 | 0 | 0 | 0 | 0 | 1 | 0 | write col w0 tsetC |
| pdist | 32 | 1 | 0 | 0 | 0 | 0 | 0 | 0 | 0 | 0 | 0 | refresh |
| pdist | 33 | 0 | 0 | 1 | 1 | 1 | 0 | 1 | 1 | 1 | 0 | inc row janc pd2 |
| pdist | 34 | 1 | 0 | 0 | 1 | 1 | 1 | 1 | 1 | 0 | 0 | pd4: read col r0 tsetC |
| pdist | 35 | 0 | 0 | 0 | 0 | 0 | 1 | 0 | 0 | 0 | 0 | inc row janc pd4 |
| pdist | 36 | 0 | 0 | 0 | 0 | 0 | 0 | 0 | 0 | 1 | 1 | dinvj pd1 |
| burnin | 37 | 0 | 1 | 1 | 1 | 1 | 1 | 1 | 1 | 0 | 0 | burnin: jnte wrlrw |
| burnin | 38 | 0 | 0 | 0 | 0 | 0 | 0 | 0 | 0 | 0 | 1 | brn1: write all w0 tsetB ckbd |
| burnin | 39 | 0 | 0 | 0 | 0 | 0 | 0 | 0 | 0 | 0 | 1 | write all w1 tsetB ckbd |
| burnin | 3a | 1 | 0 | 0 | 0 | 0 | 0 | 0 | 0 | 0 | 0 | ju brn1 |
| wrlrw | 3b | 0 | 1 | 1 | 1 | 1 | 1 | 1 | 1 | 0 | 0 | wrlrw: jnte rd0cl |
| wrlrw | 3c | 0 | 0 | 0 | 0 | 0 | 0 | 0 | 0 | 0 | 1 | write row w1 tsetA |
| rd0cl | 3d | 0 | 1 | 1 | 1 | 1 | 1 | 1 | 1 | 0 | 0 | rd0cl: jnte finish |
| rd0cl | 3e | 0 | 0 | 0 | 0 | 0 | 0 | 0 | 0 | 1 | 0 | read col r0 tsetA |
| finish | 3f | 1 | 1 | 1 | 1 | 1 | 1 | 1 | 1 | 1 | 1 | finish: idle |

Mask Rev Number

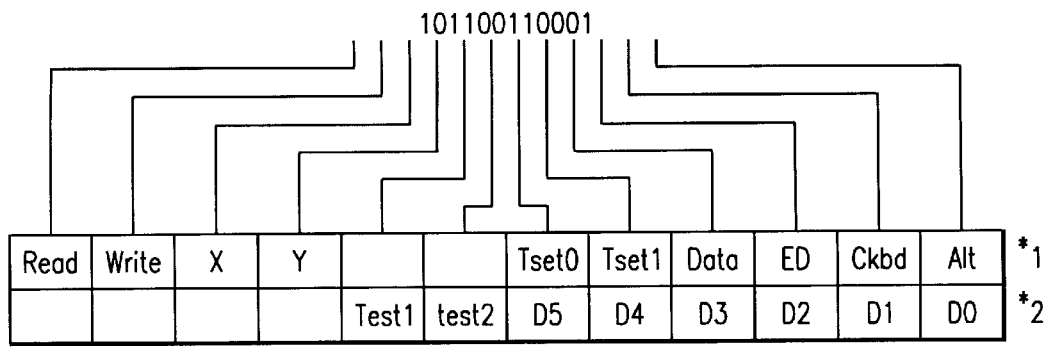

| Read | Write | X | Y | | | Tset0 | Tset1 | Data | ED | Ckbd | Alt | *1 |
|------|-------|---|---|---|---|-------|-------|------|-----|------|-----|----|
|      |       |   |   | Test1 | test2 | D5 | D4 | D3 | D2 | D1 | D0 | *2 |

<u>Test1</u> <u>Test2</u> <u>Comments</u>
0     0     Test if the test is enabled in enabled tests register 330.
0     1     Test for inverted pattern
1     0     Increment address by 1, and check for overflow (array address)
1     1     Increment counter and check if required value is reached (timing counter)

<u>Test0</u> <u>Test1</u> <u>Comments</u>
0     0     Timing set A
0     1     Timing set C
1     0     Timing set B
1     1     Timing set A, decrement

*FIG. 29*

*1 Memory Access Instruction
*2 Program Control Instruction

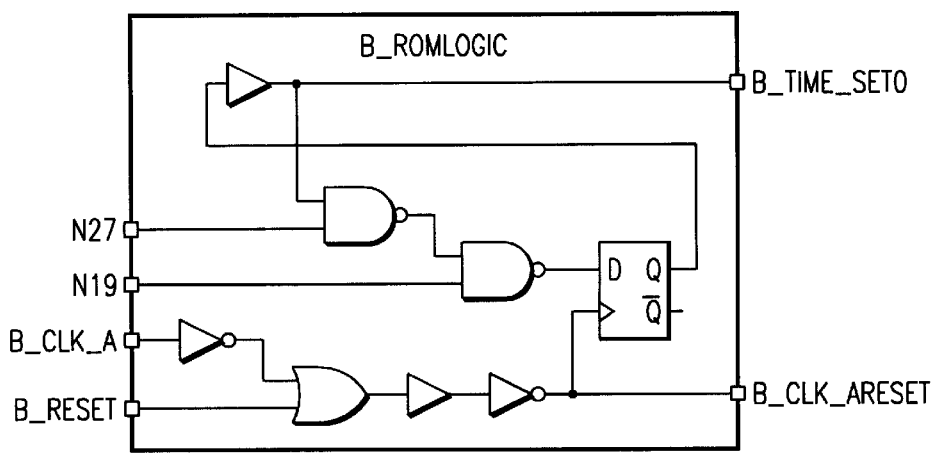

*FIG. 30*

```
architecture behav of b_passfail is
signal B_EXPECT_DATA : std_logic_vector (3 downto 0);
signal B_EXPECT_DATAB : std_logic_vector (3 downto 0);
signal B_WRITE_DATA : std_logic_vector (3 downto 0);
signal CKBDI, TRUEWRITE, B_REVNVAL, B_RODDVAL, B_WEVNVAL, B_WODDVAL : std_logic;
begin
  CKBDI <= B_CKBD and (B_LSB_XADD xor B_LSB_YADD);
  pass_fail_check : process(B_CLK, B_OEB, B_RESET)
            begin
              if (B_RESET = '1') then
                B_PF_RESULT <= '0';
              elsif (B_CLK'EVENT and B_CLK = '1') then
                if (B_OEB = '0' and (B_DQ(31 downto 28) /= B_EXPECT_DATA
                    or B_DQ(27 downto 24) /= B_EXPECT_DATAB)) then
                  B_PF_RESULT <= '1';
                end if;
              end if;
            end process pass_fail_check;
  B_REVNVAL <= B_RDATA xor CKBDI;
  B_RODDVAL <= B_ALTERNATE xor B_RDATA xor CKBDI;
  B_WEVNVAL <= B_WDATA xor CKBDI;
  B_WODDVAL <= B_ALTERNATE xor B_WDATA xor CKBDI;
  B_EXPECT_DATA(0) <= B_REVNVAL;
  B_EXPECT_DATA(1) <= B_RODDVAL;
  B_EXPECT_DATA(2) <= B_REVNVAL;
  B_EXPECT_DATA(3) <= B_RODDVAL;
  B_EXPECT_DATAB <= not B_EXPECT_DATA;

B_WRITE_DATA(0) <= B_WEVNVAL;
  B_WRITE_DATA(1) <= B_WODDVAL;
  B_WRITE_DATA(2) <= B_WEVNVAL;
  B_WRITE_DATA(3) <= B_WODDVAL;
  monitor_data_values : process(B_WRITE, B_REVNVAL, B_RODDVAL, B_WEVNVAL, B_WODDVAL)
      begin
          if (B_WRITE = '1') then
            B_DEVEN <= B_WEVNVAL;
            B_DODD <= B_WODDVAL;
          else
            B_DEVEN <= B_REVNVAL;
            B_DODD <= B_RODDVAL;
          end if;
      end process monitor_data_values;
  TRUEWRITE <= B_WRITE and (not B_WDATA_TIMB) and (not TLBMON) and
               (not TLBROMR);
  guarded_block : block (TRUEWRITE ='1')
  begin
      B_DQ(31 downto 28) <= guarded B_WRITE_DATA;
      B_DQ(27 downto 24) <= guarded B_WRITE_DATA;
  end block guarded_block;
end behav;
```

*FIG. 32*

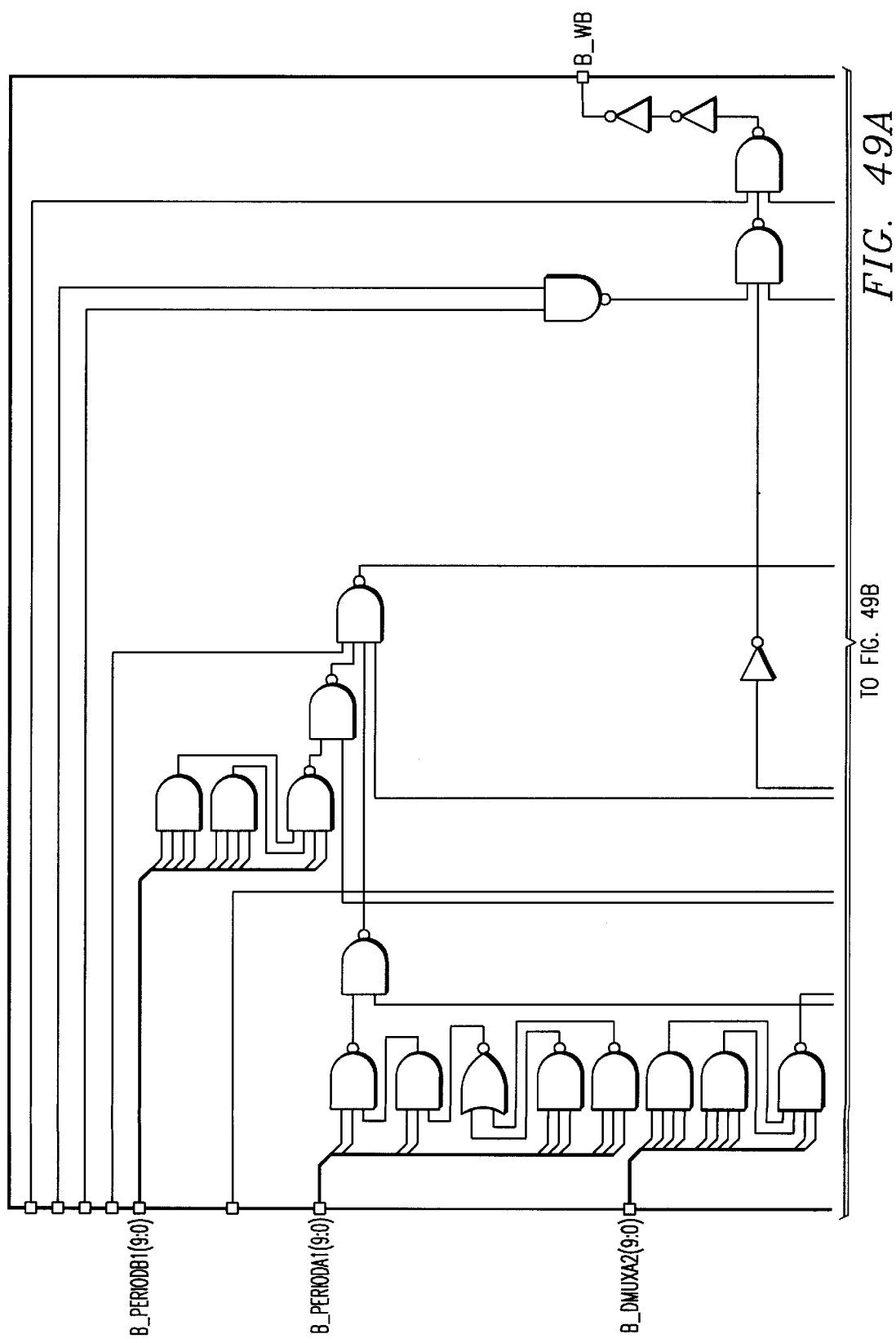

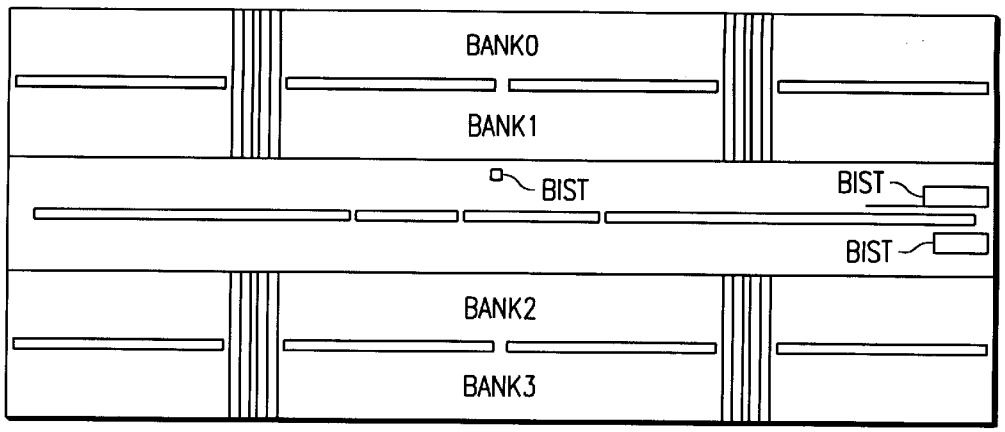

FIG. 61

| ALGORITHMS | TIMING SET | ADDR ACCESS | ARRAY ACCESS | DATA PATTERN | MISC OPTION |
|---|---|---|---|---|---|
| GROSS | SHORT | X, INC, DEC | R, W | 0, 1 | CKBD, ALT |
| PAUSE | SHORT | X, INC | R, W | 0, 1 | CKBD, PAUSE |
| XMARCH | LONG | X, INC | RW | 0, 1 | |
| YMARCH | SHORT | Y, INC | RW | 0, 1 | |
| SDIST | SHORT | X, Y, INC | R, W | 0, 1 | REFRESH |
| LDIST | LONG | X, Y, INC | R, W | 0, 1 | REFRESH |
| PDIST | PAGE | Y, INC | R, W | 0, 1 | REFRESH |
| BURN IN | LONG | X, Y, INC | W | 0, 1 | CKBD |
| ENG1 | SHORT | Y, INC, 1 ROW | W | 1 | |
| ENG2 | SHORT | X, INC, 1 COL | R | 0 | |

SHORT-300ns PERIOD   R-READ      INC-INCREMENT
LONG-10,000ns PERIOD  W-WRITE    DEC-DECREMENT

FIG. 62

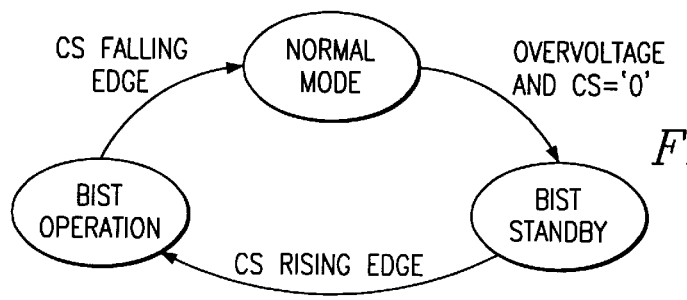

FIG. 63

| | NORMAL MODE | BIST: INT CLK (B_CLKMUX=0) | BIST: Ex CLK (B_CLKMUX=1) |
|---|---|---|---|
| B_CLK | LOW | 20ns CLOCK | SAME AS EXT CLK |
| B_IRCLK | 0.5Us CLOCK | LOW | LOW |

256M SDRAM

| Left Signal | Pin Name | Pin # | Pin # | Pin Name | Right Signal |
|---|---|---|---|---|---|
| 3.3V | VDD | 1 | 88 | VSS | 0.0V |
| NO CONNECT | DQ0 | 2 | 87 | DQ15 | NO CONNECT |
| 3.3V | VDDQ | 3 | 86 | VSSQ | 0.0V |
| NO CONNECT | DQ1 | 4 | 85 | DQ14 | NO CONNECT |
| NO CONNECT | DQ2 | 5 | 84 | DQ13 | NO CONNECT |
| 0.0V | VSSQ | 6 | 83 | VDDQ | 3.3V |
| NO CONNECT | DQ3 | 7 | 82 | DQ12 | NO CONNECT |
| NO CONNECT | DQ4 | 8 | 81 | DQ11 | NO CONNECT |
| 3.3V | VDDQ | 9 | 80 | VSSQ | 0.0V |
| NO CONNECT | DQ5 | 10 | 79 | DQ10 | NO CONNECT |
| NO CONNECT | DQ6 | 11 | 78 | DQ9 | NO CONNECT |
| 0.0V | VSSQ | 12 | 77 | VDDQ | 3.3V |
| NO CONNECT | DQ7 | 13 | 76 | DQ8 | NO CONNECT |
| 0.0V | DQM0 | 14 | 75 | DQM1 | 0.0V |
| 3.3V | VDD | 15 | 74 | VSS | 0.0V |
| NO CONNECT | NC | 16 | 73 | NC | NO CONNECT |
| 3.3V | W | 17 | 72 | NC | NO CONNECT |
| 3.3V | CE | 18 | 71 | Vref | 1.65V |
| 3.3V | RE | 19 | 70 | NC | NO CONNECT |
| 0.0V/3.3V | S | 20 | 69 | CLK | 0.0V |
| 0.0V/3.3V | BA1 | 21 | 68 | CKE | 3.3V |
| 0.0V/3.3V | A11 | 22 | 67 | BA0 | 0.0V/3.3V |
| 3.3V | VDD | 23 | 66 | VSS | 0.0V |
| 0.0V/3.3V | A0 | 24 | 65 | NC | NO CONNECT |
| 0.0V/3.3V | A1 | 25 | 64 | A10 | 0.0V/3.3V |
| 0.0V/3.3V | A2 | 26 | 63 | A9 | 0.0V/3.3V |
| 0.0V/3.3V | A3 | 27 | 62 | A8 | 0.0V/3.3V |
| 0.0V/5.4V | A4 | 28 | 61 | A7 | 0.0V/3.3V |
| 0.0V/3.3V | A5 | 29 | 60 | A6 | 0.0V/3.3V |
| 3.3V | VDD | 30 | 59 | VSS | 0.0V |
| 0.0V | DQM2 | 31 | 58 | DQM3 | 0.0V |
| DONE | DQ16 | 32 | 57 | DQ31 | NO CONNECT |
| 0.0V | VSSQ | 33 | 56 | VDDQ | 3.3V |
| PASSFAIL | DQ17 | 34 | 55 | DQ30 | NO CONNECT |
| NO CONNECT | DQ18 | 35 | 54 | DQ29 | NO CONNECT |
| 3.3V | VDDQ | 36 | 53 | VSSQ | 0.0V |
| NO CONNECT | DQ19 | 37 | 52 | DQ28 | NO CONNECT |
| NO CONNECT | DQ20 | 38 | 51 | DQ27 | NO CONNECT |
| 0.0V | VSSQ | 39 | 50 | VDDQ | 3.3V |
| NO CONNECT | DQ21 | 40 | 49 | DQ26 | NO CONNECT |
| NO CONNECT | DQ22 | 41 | 48 | DQ25 | NO CONNECT |
| 3.3V | VDDQ | 42 | 47 | VSSQ | 0.0V |
| NO CONNECT | DQ23 | 43 | 46 | DQ24 | NO CONNECT |
| 3.3V | VDD | 44 | 45 | VSS | 0.0V |

*FIG. 65*

1. INSTRUCTIONS APPEARS AT CLK_A R/E
2. RESULTS OF OPERATIONS APPEARS AT CLK_A F/E
3. AT CLK_B R/E, DECIDE ON NEW PC ADDRESS
4. AT RISING EDGE OF CLK_C, RESETS ALL SIGNALS
5. NEW INSTRUCTIONS APPEARS AT CLK_A R/E

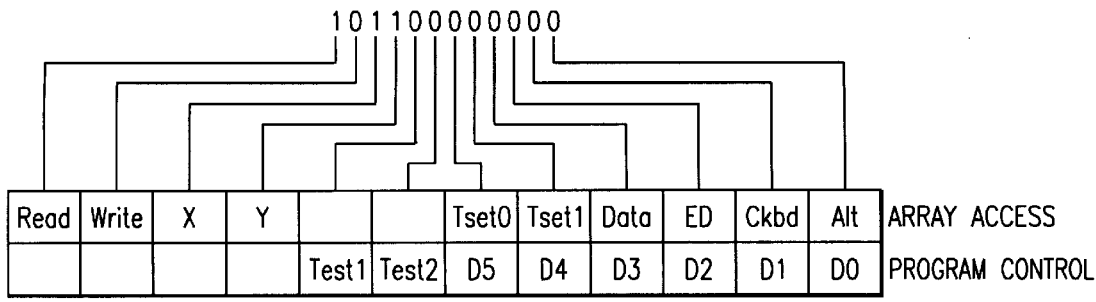

| TEST1 | TEST2 | COMMENTS |
|---|---|---|
| 0 | 0 | TEST IF THE TEST IS ENABLED |
| 0 | 1 | TEST FOR INVERTED PATTERN |
| 1 | 0 | INCREMENT ADDRESS BY 1, AND CHECK FOR OVERFLOW |
| 1 | 1 | INCREMENT COUNTER AND CHECK IF REQUIRED VALUE IS REACHED |

| TSET0 | TSET1 | COMMENTS |
|---|---|---|
| 0 | 0 | TIMING SET A |
| 0 | 1 | TIMING SET C |
| 1 | 0 | TIMING SET B |
| 1 | 1 | TIMING SET A, DECREMENT |

*FIG. 72*

| TIMING SETS | ACCESS MODE | ADDRESSING | ARRAY SIZE | '0' OR '1' | DATA PATTERN |
|---|---|---|---|---|---|
| TSETA<br>TSETB<br>TSETC | READ<br>WRITE<br>RMW | INC<br>DEC | FULLA<br>ROW<br>COL | PATTERN0<br>PATTERN1 | CKBD<br>ALTERNATE |

*FIG. 73*

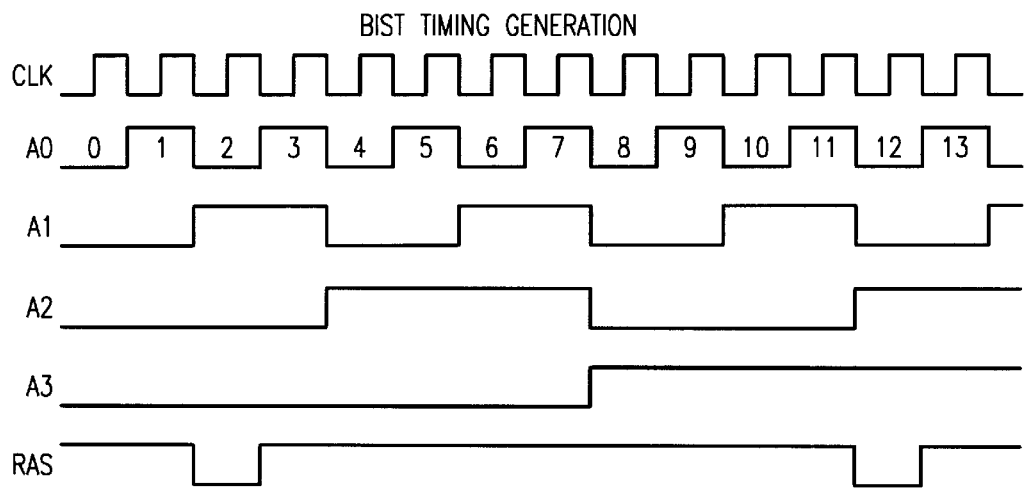

*FIG. 74*

BIST TIMING SETS

| TIMING SET | CYCLE TIME | DESCRIPTION |
|---|---|---|
| A | 300ns | SHORT TIMING, USED IN GROSS, PAUSE, YMARCH, SDIST, ENG1, ENG2 |
| B | 10,000ns | LONG TIMING, USED IN XMARCH, LDIST, BURN IN |
| C | 300ns | MULTIPLE COLUMNS, USED IN PDIST |

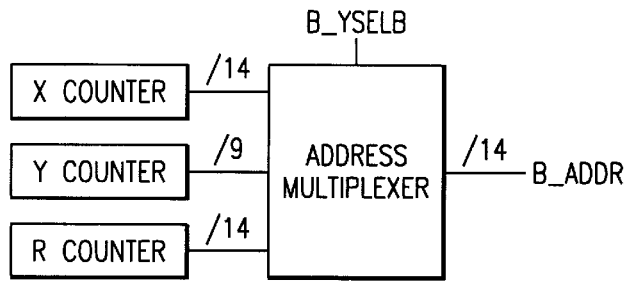

FIG. 76

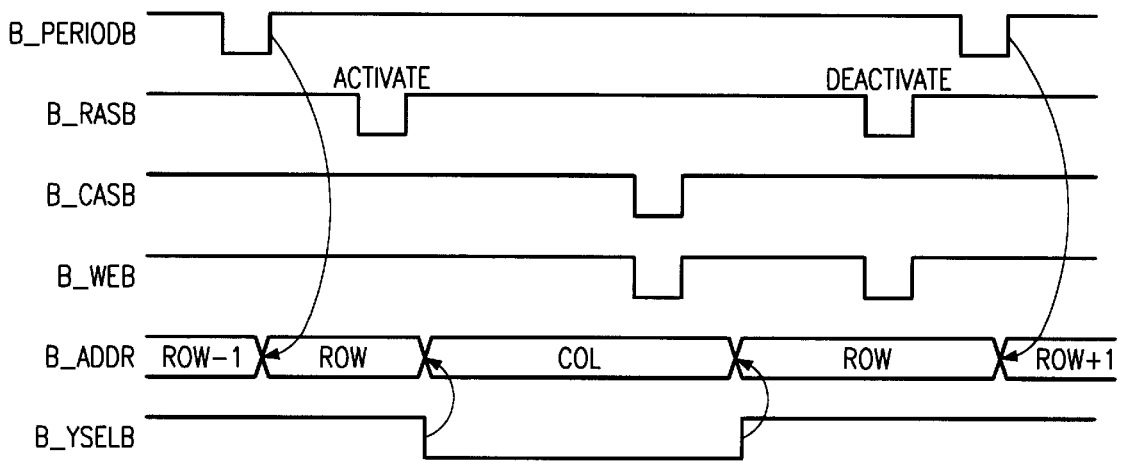

FIG. 77

| BA1 | BA0 | A11 | A10 | A9 | A8 | A7 | A6 | A5 | A4 | A3 | A2 | A1 | A0 |
|---|---|---|---|---|---|---|---|---|---|---|---|---|---|
| Int/Ext CLK | Sub Array | Output Enable | R1C | W1R | BI | Pdist | Ldist | Sdist | OV | Ymar | Xmar | Pause | Gross |

FOR A0 TO A3, '1' = TEST OF CONCERNED ENABLED '0' = TEST OF CONCERNED NOT ENABLED
FOR A4 = OVERVOLTAGE, 2 TO 2 1/2 TIMES VCC
FOR A5 TO A10, '1' = TEST OF CONCERNED ENABLED '0' = TEST OF CONCERNED NOT ENABLED
FOR BA0, '1' INDICATE SUB ARRAY SELECTED. '0' INDICATE FULL ARRAY TEST.
FOR BA1, '1' INDICATE EXTERNAL CLOCK. '0' INDICATE INTERNAL CLOCK.
FOR A11, '1' INDICATE OUTPUT ENABLE, 0 INDICATE OUTPUT NOT ENABLED.
    ONLY MEANINGFUL AFTER BIST IS DONE.

FIG. 78

|  | NORMAL | TLROMR | MON1 | MON2 | MON3 |
|---|---|---|---|---|---|
| B_DQ(31) | HIGH Z | ROMBIT 11 | BA1 | BA1 | BA1 |
| B_DQ(30) | HIGH Z | ROMBIT 10 | BA0 | BA0 | BA0 |
| B_DQ(29) | HIGH Z | ROMBIT 9 | ADDR11 | ADDR11 | ADDR11 |
| B_DQ(28) | HIGH Z | ROMBIT 8 | ADDR10 | ADDR10 | ADDR10 |
| B_DQ(27) | HIGH Z | ROMBIT 7 | ADDR9 | ADDR9 | ADDR9 |
| B_DQ(26) | HIGH Z | ROMBIT 6 | BIST_CMP | ADDR8 | BIST_CMP ADDR8 |
| B_DQ(25) | HIGH Z | ROMBIT 5 | B_DODD | ADDR7 | B_DODD ADDR7 |
| B_DQ(24) | HIGH Z | ROMBIT 4 | B_DEVEN | ADDR6 | B_DEVEN ADDR6 |
| B_DQ(23) | HIGH Z | ROMBIT 3 | B_RASB | ADDR5 | B_RASB ADDR5 |
| B_DQ(22) | HIGH Z | ROMBIT 2 | B_CASB | ADDR4 | B_CASB ADDR4 |
| B_DQ(21) | HIGH Z | ROMBIT 1 | B_WB | ADDR3 | B_WB ADDR3 |
| B_DQ(20) | HIGH Z | ROMBIT 0 | B_CLK | ADDR2 | B_CLK ADDR2 |
| B_DQ(19) | HIGH Z | LOW | ADDR1 | ADDR1 | ADDR1 |
| B_DQ(18) | HIGH Z | LOW | ADDR0 | ADDR0 | ADDR0 |
| B_DQ(17) | PASSFAIL | HIGH Z | HIGH Z | HIGH Z | HIGH Z |
| B_DQ(16) | B_DONE | HIGH Z | HIGH Z | HIGH Z | HIGH Z |

FIG. 79

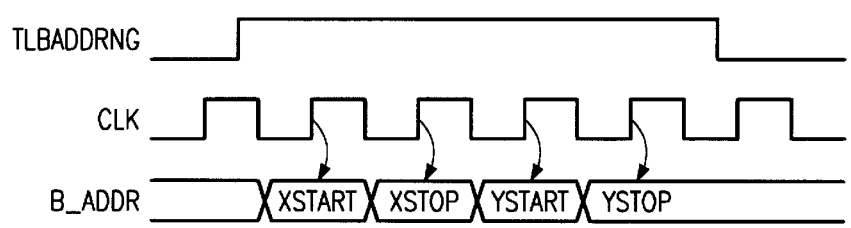

FIG. 80

BUILT-IN SELF-TEST ARRANGEMENT FOR INTEGRATED CIRCUIT MEMORY DEVICES

This is a continuation of Ser. No. 08/846,922 filed Apr. 30, 1997, now U.S. Pat. No. 5,883,843, which claims priority from provisional application No. 60/061,516 filed Apr. 30, 1996.

FIELD OF THE INVENTION

This invention, relates to the field of testing an integrated circuit device and more particularly to a built-in self-test (BIST) arrangement for an integrated circuit device.

BACKGROUND OF THE INVENTION

In conventional testing of memory devices, a tester is used to supply the control signals such as RAS, CAS and WE, address signals, such as Ao-An, and data to the device under test. Outputs from the device under test are sampled by the tester to determine whether the device passes or fails. Testing of memories requires longer tester times, as device density increases. This results in escalating test cost. As the capacity of integrated circuit memory devices increases to 256 Mbits and above, testing time per device becomes a major component of cost of integrated circuit memory devices.

One way to test integrated circuit memory devices in less time per device is to apply a single test data bit to several cells concurrently by multiplexing the single bit to the several cells in parallel. Some failures, however, cannot be screened unless a single cell is accessed at a time. With limited parallelism, i.e., a number of units being tested simultaneously, high test time also translates into a long manufacturing cycle time. Testing of one batch of memory devices requires most of the other devices to be waiting in queue to be tested while some of the memory devices are actually undergoing functional test. One solution would be to get more testers, but this is not practical as it involves even higher cost. The time to deliver a batch of tested memory devices to a customer increases as a result. Another solution is to apply the test from the testers in parallel to the devices under test. The problem with this solution is that the parallel leads occasionally cause good devices to fail because of cross talk among the parallel leads.

Thus there is a problem in finding some way to efficiently test large capacity memory devices without requiring an enormous amount of time on a tester per memory device.

SUMMARY OF THE INVENTION

This problem and others are resolved by an integrated circuit which has a built-in self-test (BIST) arrangement. The built-in self-test arrangement includes a read only memory that stores test algorithm instructions. A logic circuit, receives an instruction read from the read only memory and produces a group of output signals dependent upon the instruction. A BIST register receives and stores the group of output signals from the logic circuit for controlling self-test of the integrated circuit. A pass/fail comparator circuit compares expected data bits with data bits written into and read from a memory array to determine whether the integrate circuit passes or fails the test.

BRIEF DESCRIPTION OF THE DRAWINGS

FIG. 28 is a table of data stored in the BIST ROM for determining the operating sequences for several DRAM tests that can be run;

FIG. 29 is a table showing functions of bit stored in separate columns of the BIST ROM;

FIGS. 30 and 31 are logic schematics for an exemplary ROM logic circuit;

FIG. 31 is a logic schematic for a ROM logic circuit;

FIG. 32 is table of VHDL language description of a Pass/Fail comparator; and

FIG. 61 shows a diagram of the BIST layout location;

FIG. 62 shows a diagram Algorithms and Timing sets;

FIG. 63 shows a diagram the entry/exit state transitions;

FIG. 65 shows a diagram of the pin out key signals for BIST;

FIG. 72 shows a diagram of the control words;

FIG. 73 shows a table of the timing sets;

FIG. 74 shows a diagram of the Timing Generator;

FIG. 76 shows a diagram of the Multiplexor;

FIG. 77 shows a diagram of the DUT (Device Under Test) Timing;

FIG. 78 shows a diagram of the Address Control Bits for entry and test control;

FIG. 79 shows a diagram of the DQ (Data/Output) multiplexing;

FIG. 80 shows a diagram of the address range selection;

DETAILED DESCRIPTION

Figure 1:
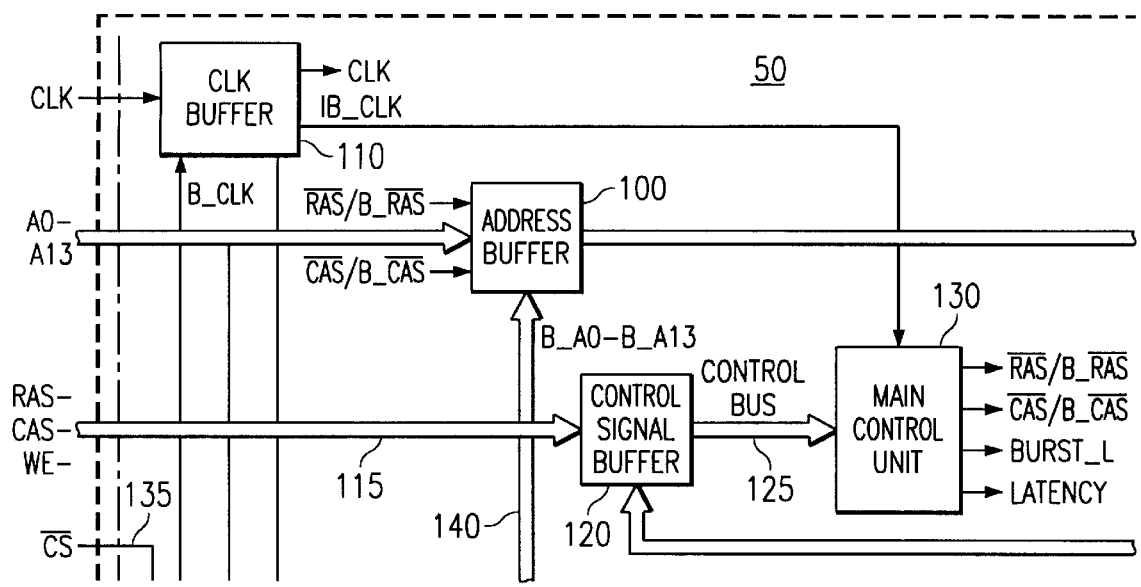
FIGS. 1–4 when positioned as shown in FIG. 5 present a block diagram of an integrated circuit memory device arranged with built-in self-test circuitry.
Figure 2:
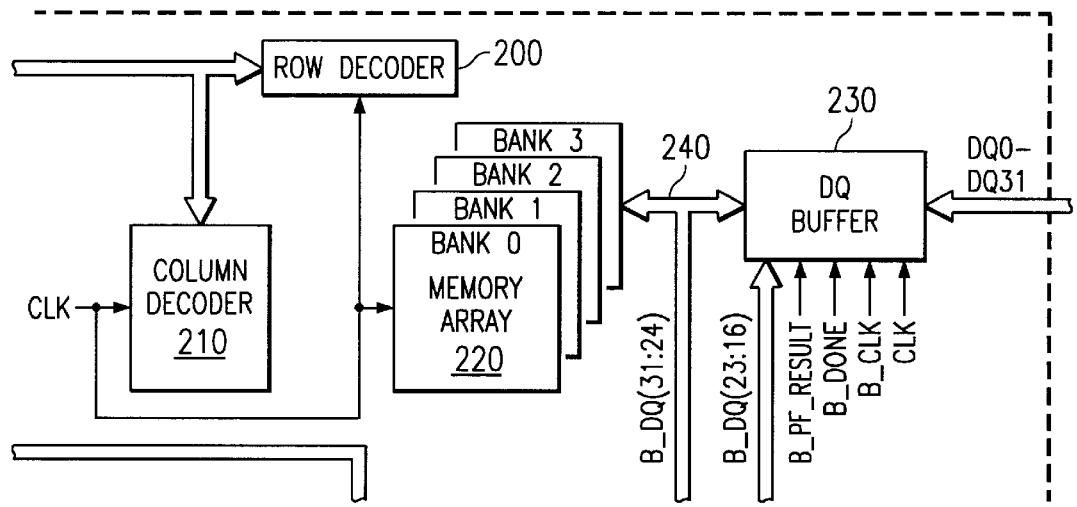
Figure 5:
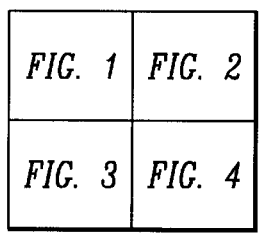

Referring now to FIGS. 1–4, there is shown the block diagram of an integrated circuit dynamic random access memory device 50 including a built-in self-test (BIST) arrangement 60. The device 50 is designed to operate as a synchronous random access memory during normal operation. Alternatively the built-in self-test arrangement operates in a distinctive, self-test mode at times while the device 50 is not operating in the normal mode. The built-in self-test arrangement is designed such that all the test signals 10 are generated internally to a device, and the arrangement only takes a simple setup to get the device into a self-test mode to perform a self test. With the simple setup up, the built-in self-test arrangement performs a memory self-test in a cost effective procedure. The arrangement also allows many devices to be tested in parallel without being limited by tester resources.

While the device 50 operates in the normal mode, it operates like a well-known synchronous dynamic random access memory device. Row and column addresses produced by a digital processor, such as a microprocessor, are time multiplexed by way of the address bus A0–A13 into an address buffer 100 until control signals RAS__ and CAS__, respectively, which load them. Thereafter they are decoded either by the row decoder 200 or the column decoder 210. The control signals RAS__ and CAS__ also are produced by the digital processor, which is not shown.

Depending upon the state of the write enable signal WE__ from the digital processor, data is either written into or read out from storage cells located in the banks of the memory array 220. Data, to be written into the banks of the memory array 220, is applied to the device 50 by way of a data bus DQ0–DQ31. This in-coming data is buffered in a data buffer circuit 230 and forwarded by way of an internal data bus 240 to the memory array 220 where it is stored until it is written over or until it is no longer refreshed at specified intervals. While data is stored in the memory array 220, that data can be addressed and read out of the array 220 through the internal data bus 240 and the data buffer 230 to the data bus DQ0–DQ31. This data bus DQ0–DQ31 typically is connected to the data receiving and sending terminals of a digital processor, such as a microprocessor that is not shown.

Because the memory device 50 is a synchronous dynamic random access memory, a system clock signal CLK is applied to the device from an eternal source for synchronizing its operation with the digital processor, peripheral devices, and control circuitry that are connected in a system. The system clock is the clock which controls operation of the digital processor. The clock signal CLK is applied to a clock buffer 110, which outputs an internal clock signal CLK for operating the memory array 220 during normal operation. This internal clock signal CLK controls operation of address decoding, writing data to the memory array, and reading data out of the memory array during such normal synchronous memory operations.

The control signals RAS__, CAS__, and WE__, which are applied to the memory device 50 from the digital processor, are applied to a control signal buffer 120. During normal mode operation, these control signals pass through the control buffer 120 and a control bus 125 to the main control unit 130 of the memory array 220. At the memory array 220 during normal operation, these control signals RAS__, CAS__, and WE__ together with the internal system clock signal CLK control operations of the array 220, as previously described.

Normal mode operation and self-test mode operation are two separate and distinct operations of the memory device 50. Those two modes occur alternatively. Thus while the device 50 operates in its normal mode it is not able to inadvertently go into its self-test mode. Also while it is in its active self-test mode, it cannot inadvertently go into its normal mode. These are conditions that are imposed upon the operation of the device 50 by the built-in self-test arrangement 60 to be described.

As just mentioned, the self-test mode of operation is different from the normal mode of operation. Self-test mode is entered only upon power up of the memory device 50. Special signal conditions are applied at that time to put the device 50 into the self-test mode.

In this proposed BIST scheme, only DC signals are needed eternal to the device to enter the self-test mode and to actually proceed through the self-test. The following types of eternal DC signals are supplied:

a) An overvoltage on one of the multiplexed address pins (e.g., pin A4.)
b) A switch on CS_ which allows both a '0' and a '1' to be connected to it.
c) A logic level of '0' or a '1' on the rest of the address pins for tests and options selections.
d) Pass, fail detection on one of the output pins.
e) An output detector pin to identify completion of the self-test operations.

With the above set up, only DC signals are involved. No complex timing is needed. Thus there is no need to be concerned with signal quality. The signal quality to the device is always good since the signals are DC. Multiple devices can be put on a BIST board and self tested simultaneously. Test cycle time can be reduced per device since BIST can be applied to all devices on the BIST board in parallel.

Figure 6:
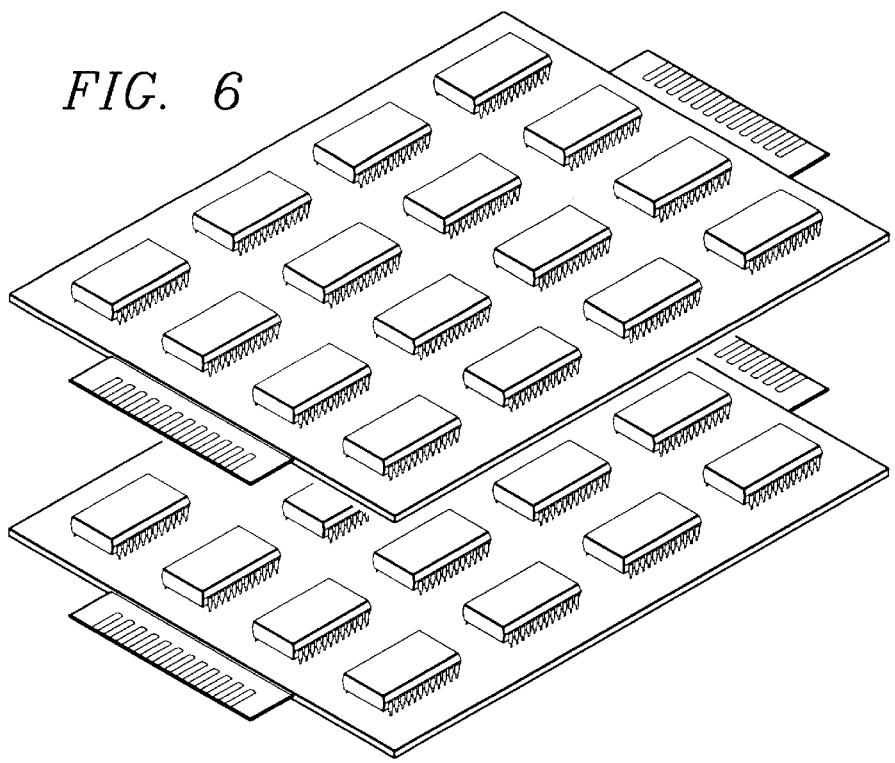
FIG. 6 shows a plurality of devices mounted for concurrent testing.

FIG. 6 shows an arrangement for mounting several integrated circuit devices which are interconnected in parallel so that they all can be set up at once for self-test. Once set up the self-test can be run concurrently on some of or all of the devices.

While in self test operations, BIST circuits take over control of all the signals such as CLK, RAS_, CAS_, WE_, the address bits, and the data bits. For example, a BIST address bit B_Ax is generated by the BIST circuits. During a self-test operation, the BIST address bits replace the eternally generated address bits Ax. The BIST address bits B_Ax interface with the main circuit right out of the address buffer.

Figure 7A:
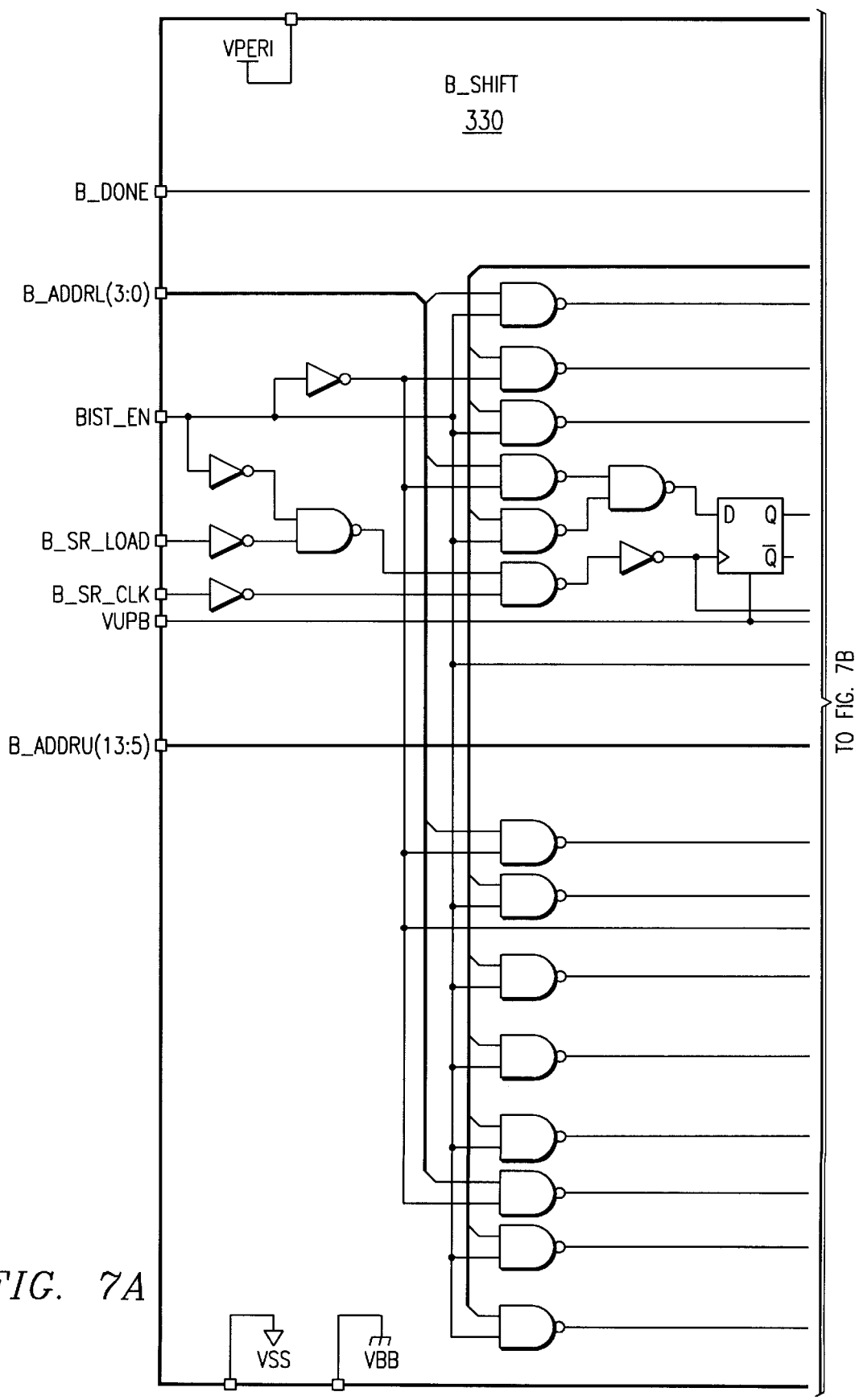
FIG. 7 is a logic schematic of a test enabled shift register for BIST operation.
Figure 7B:
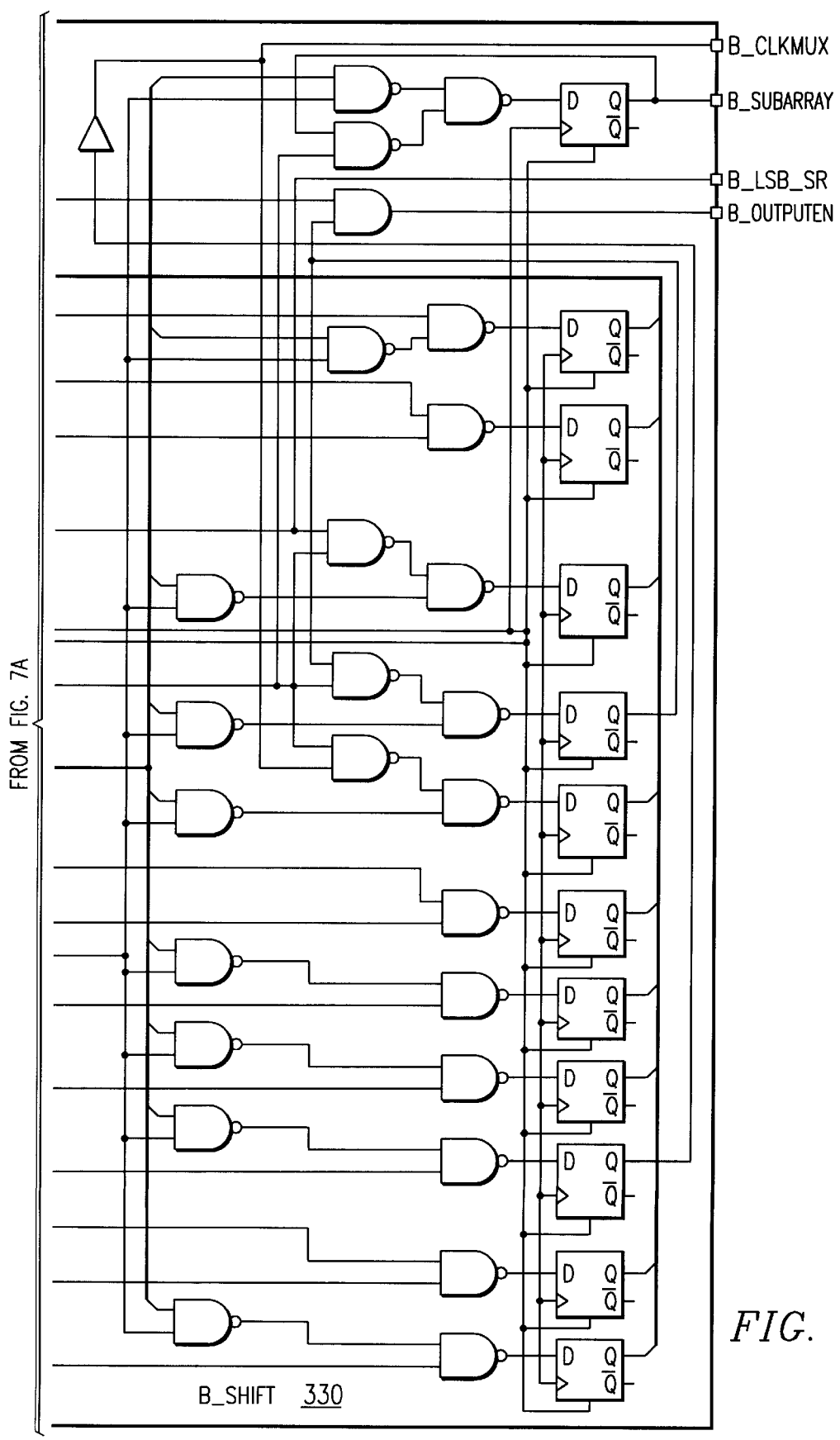

During normal mode operation, the BIST address bits B_Ax are not generated and are ignored. During power up, if a BIST request is detected, the address lines are used to bring in information into the BIST arrangement. Referring now to FIG. 7, a test enabled shift register 330 receives and stores data that determines whether or not specific tests are enabled. The data are stored in the shift register at the righthand side of FIG. 3. During active self-test mode, BIST generated address signals are used for operating the device and externally applied address signals Ax are ignored.

Figure 8:
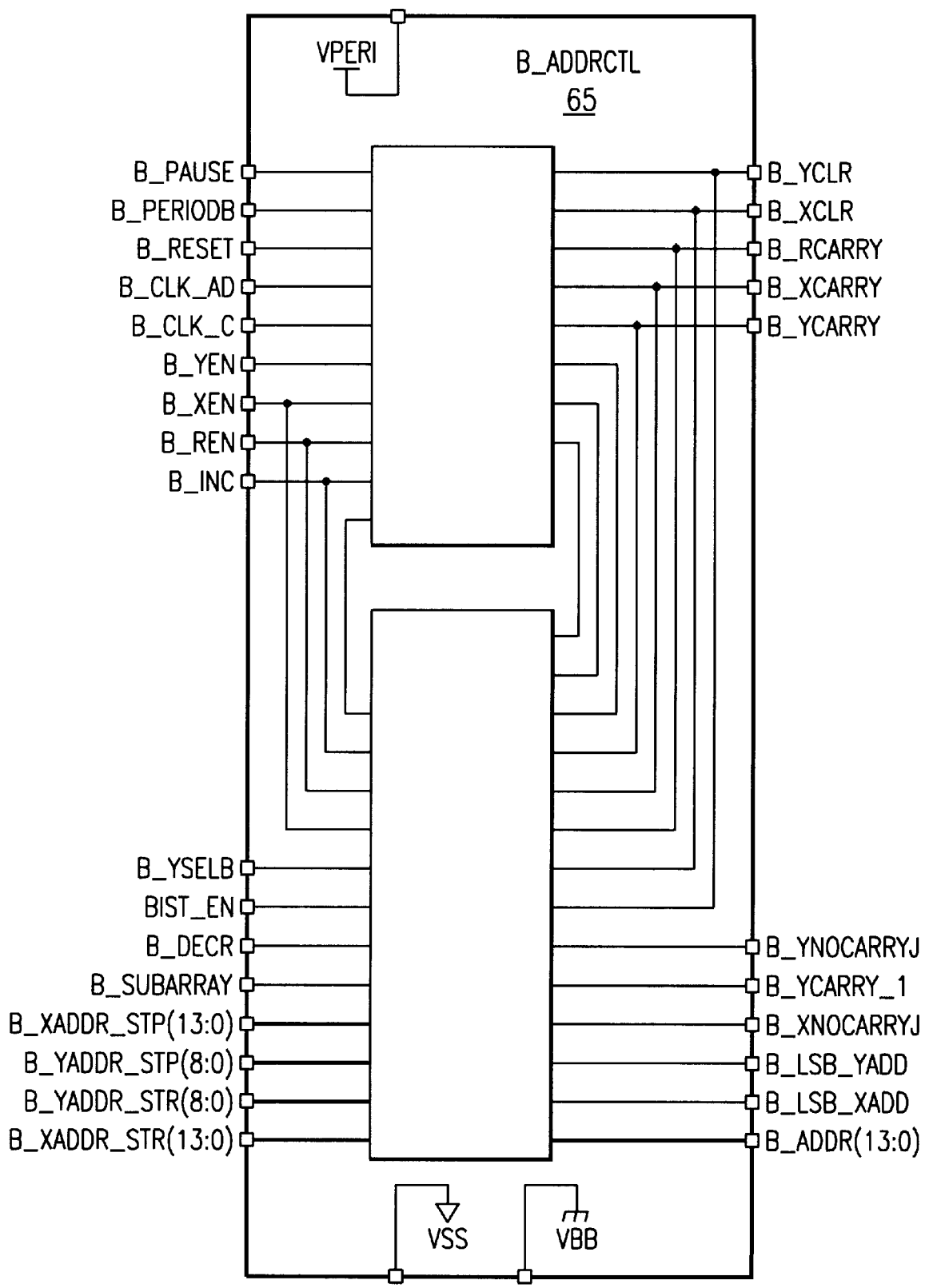
FIG. 8 is a block diagram of an address control circuit for the BIST arrangement.
Figure 9A:
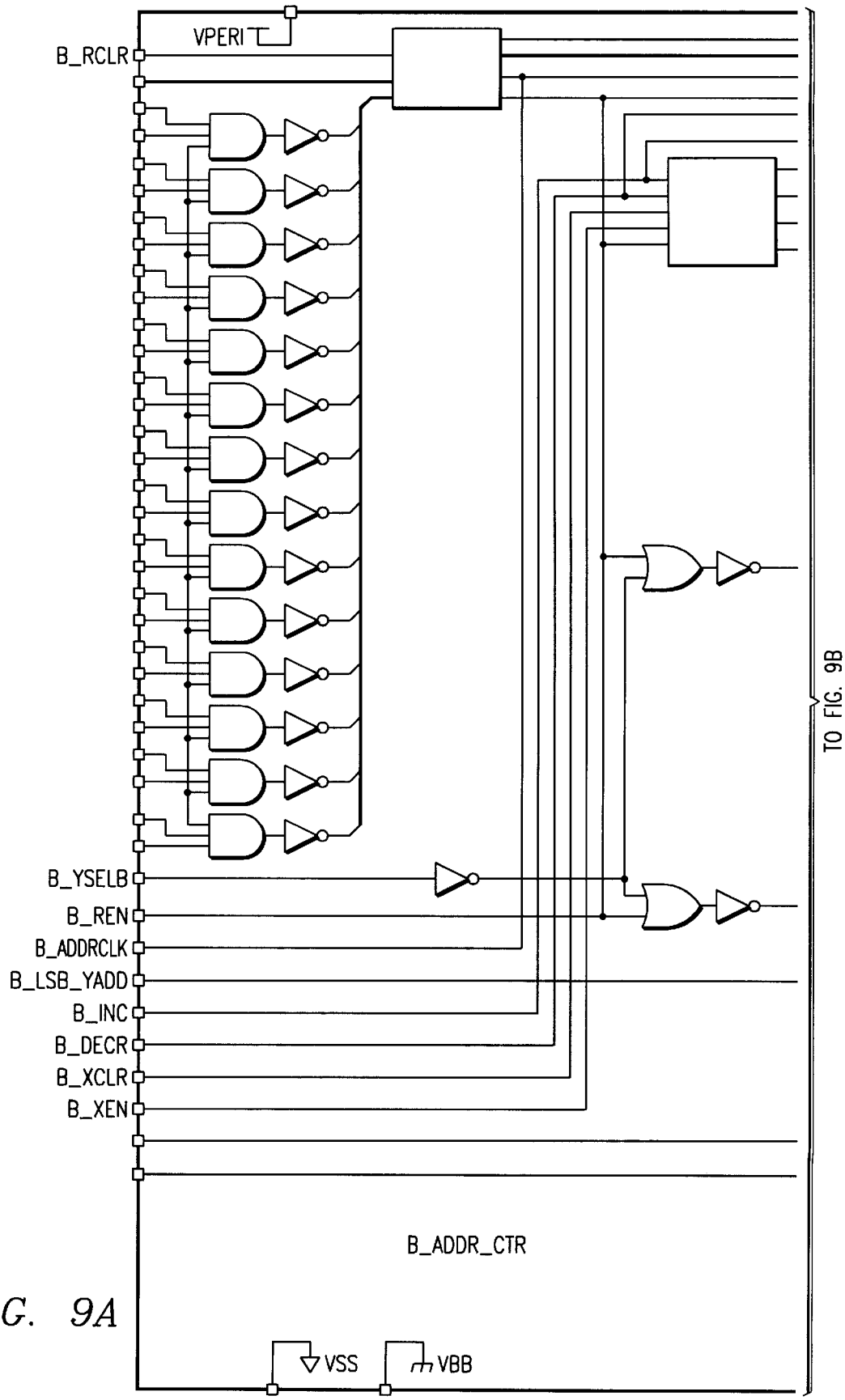
FIGS. 9–12 are logic schematics used in the address control circuit of FIG. 8.
Figure 9B:
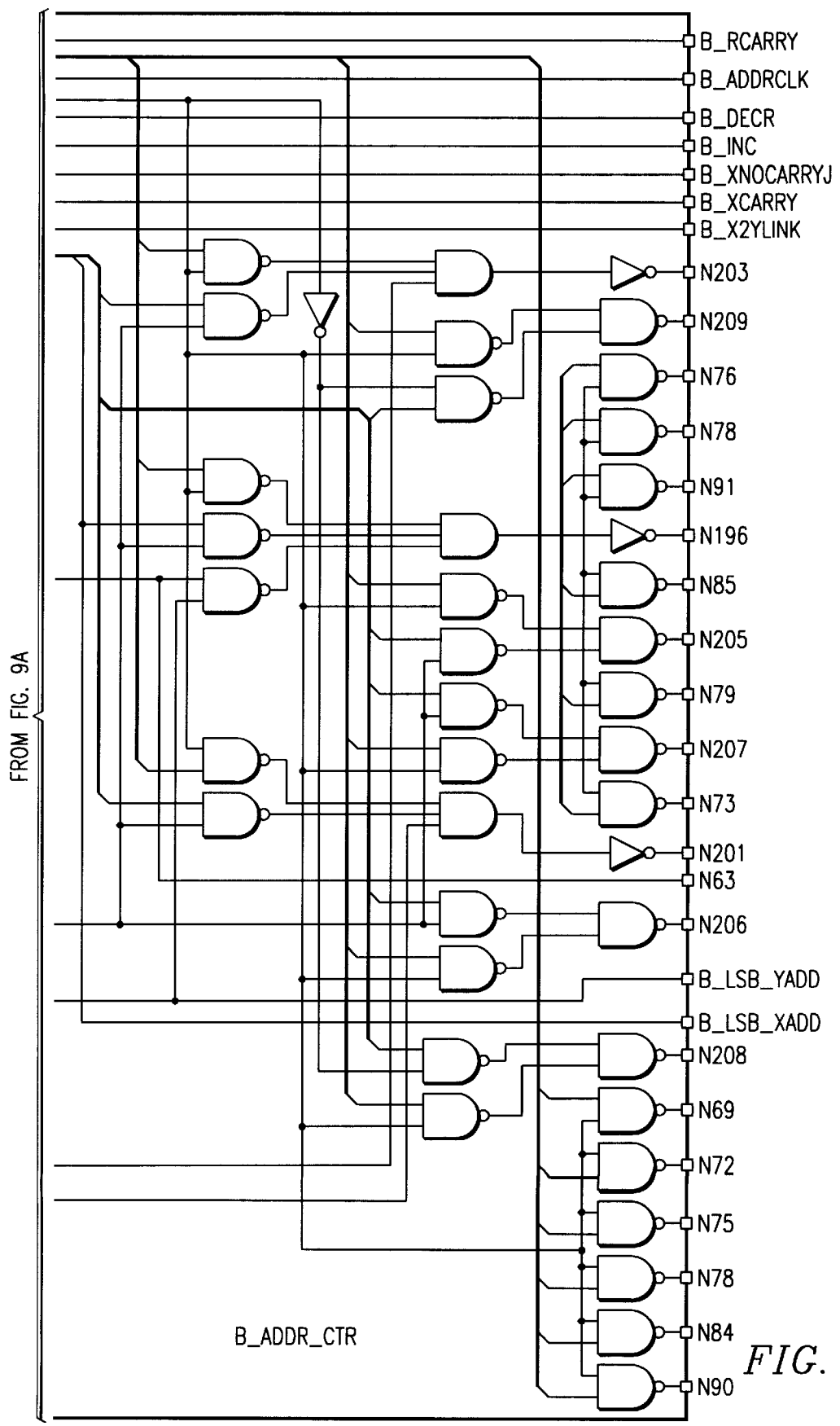
Figure 10A:
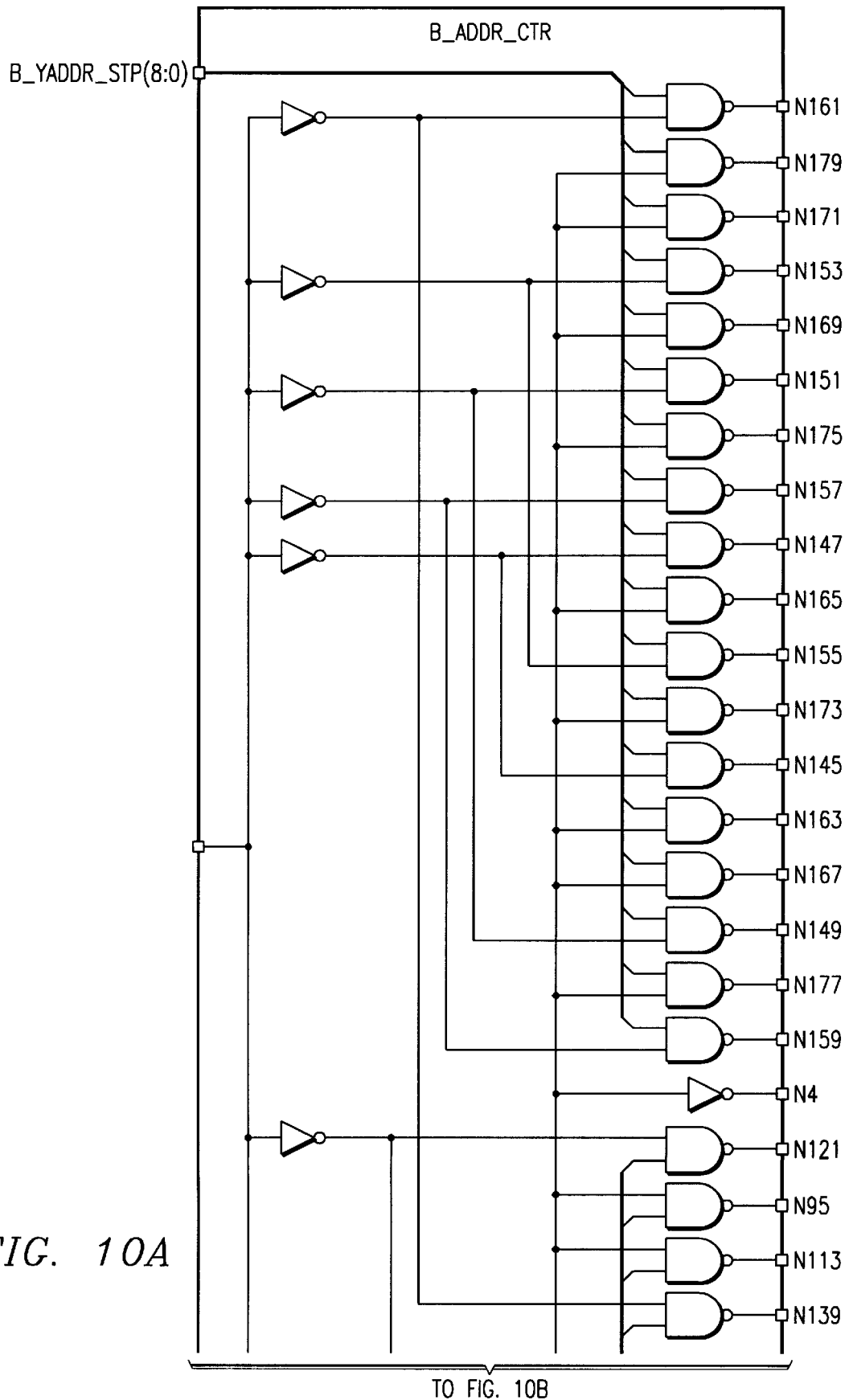
Figure 10B:
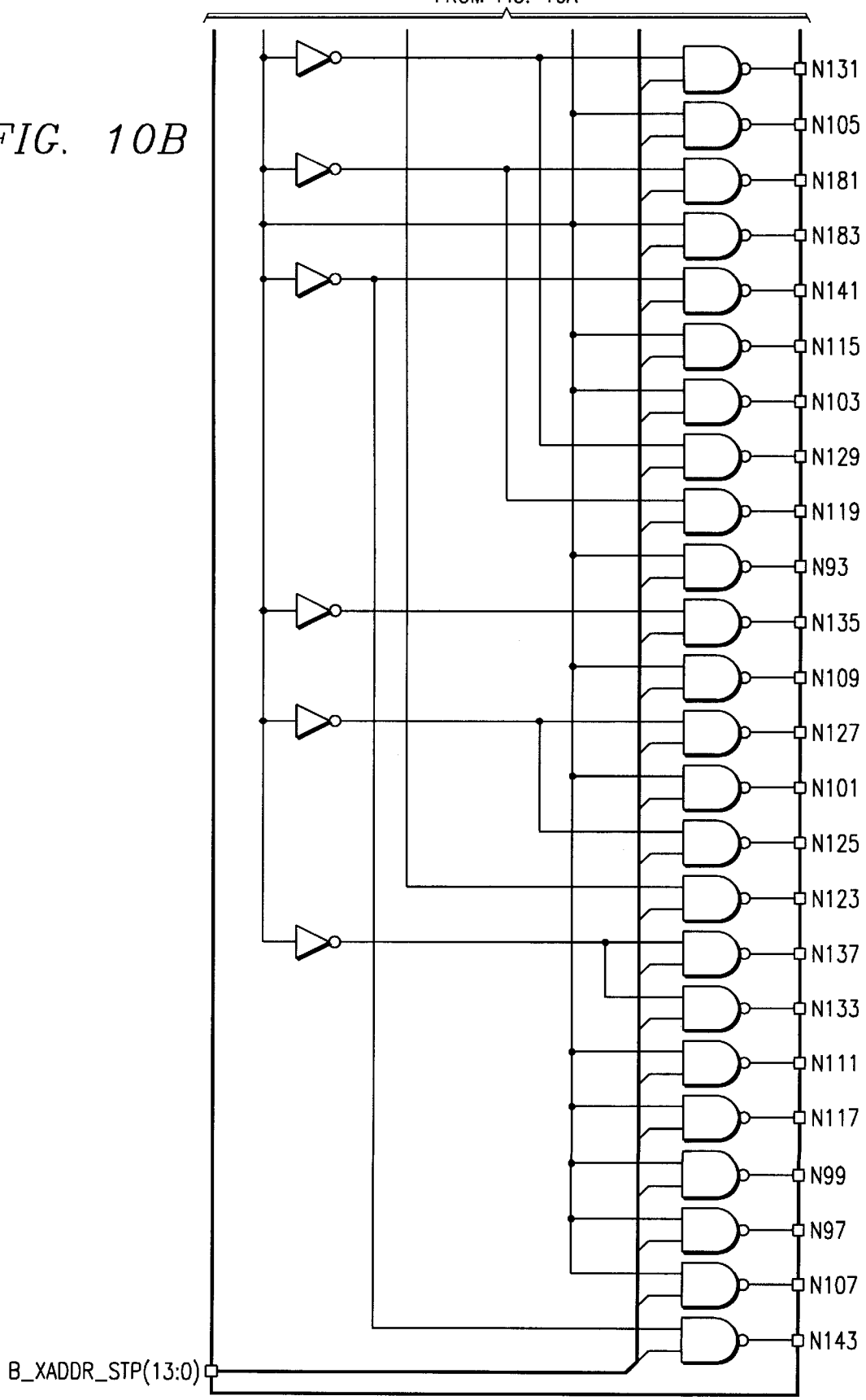
Figure 11A:
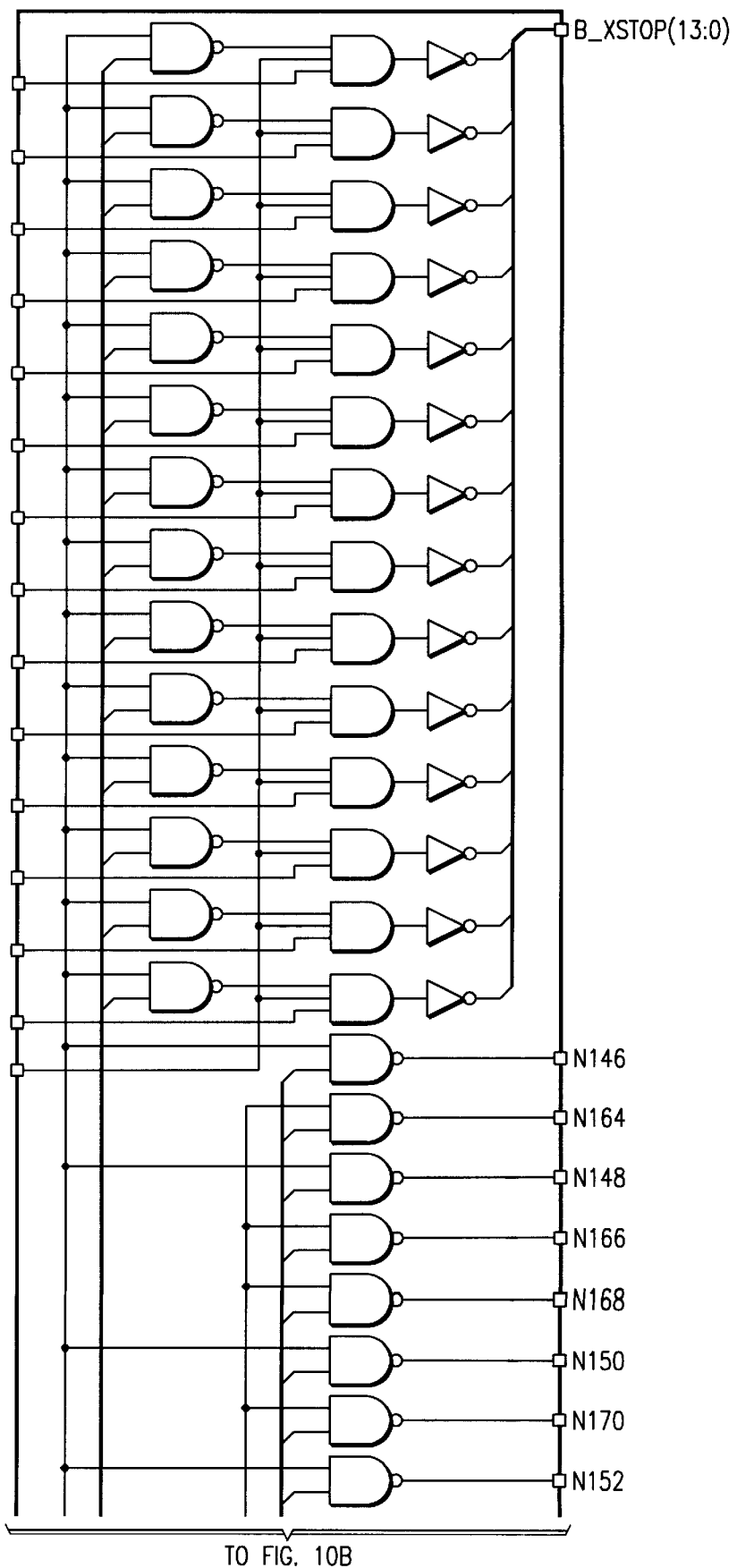
Figure 11B:
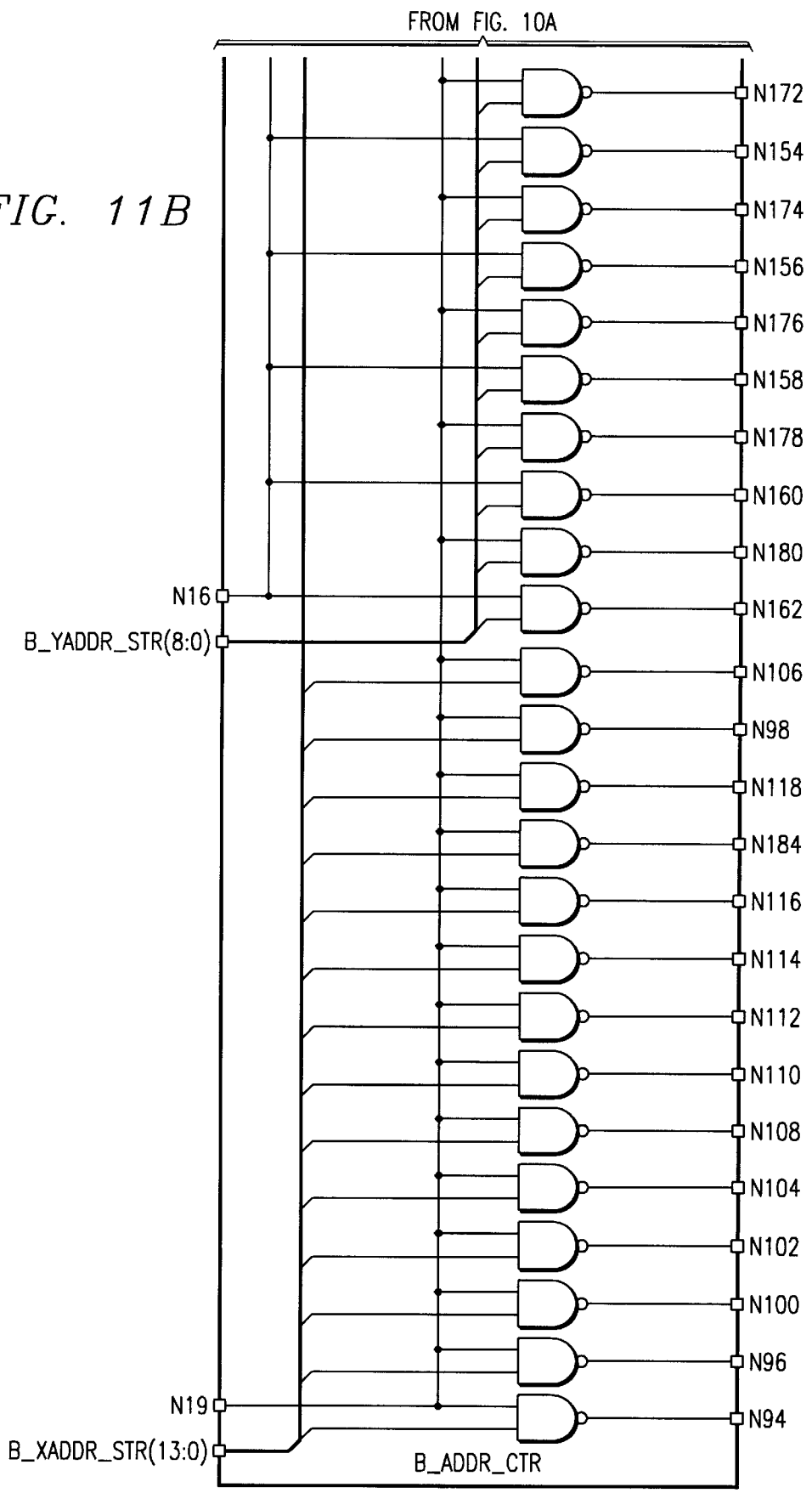
Figure 12A:
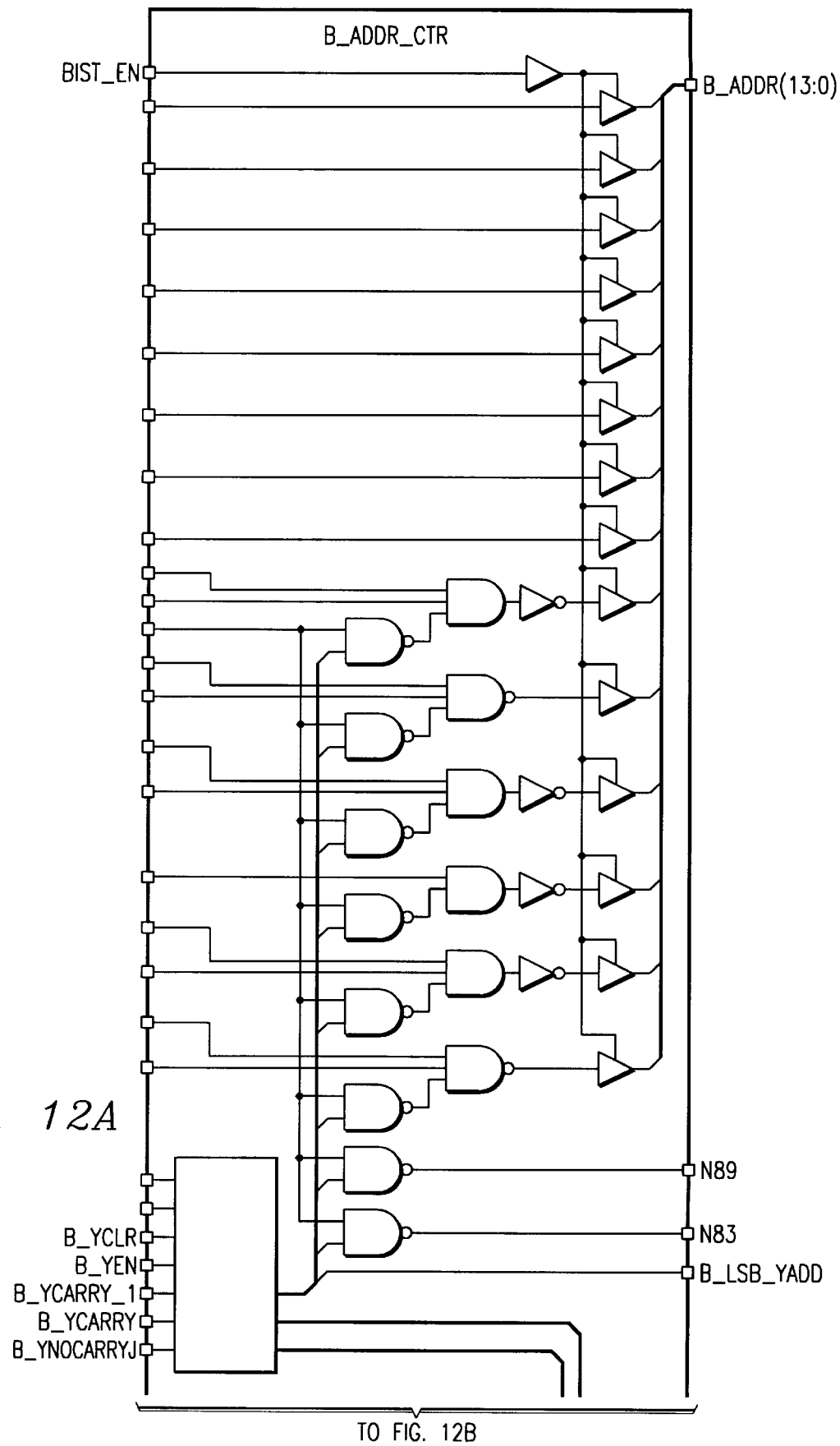
Figure 12B:
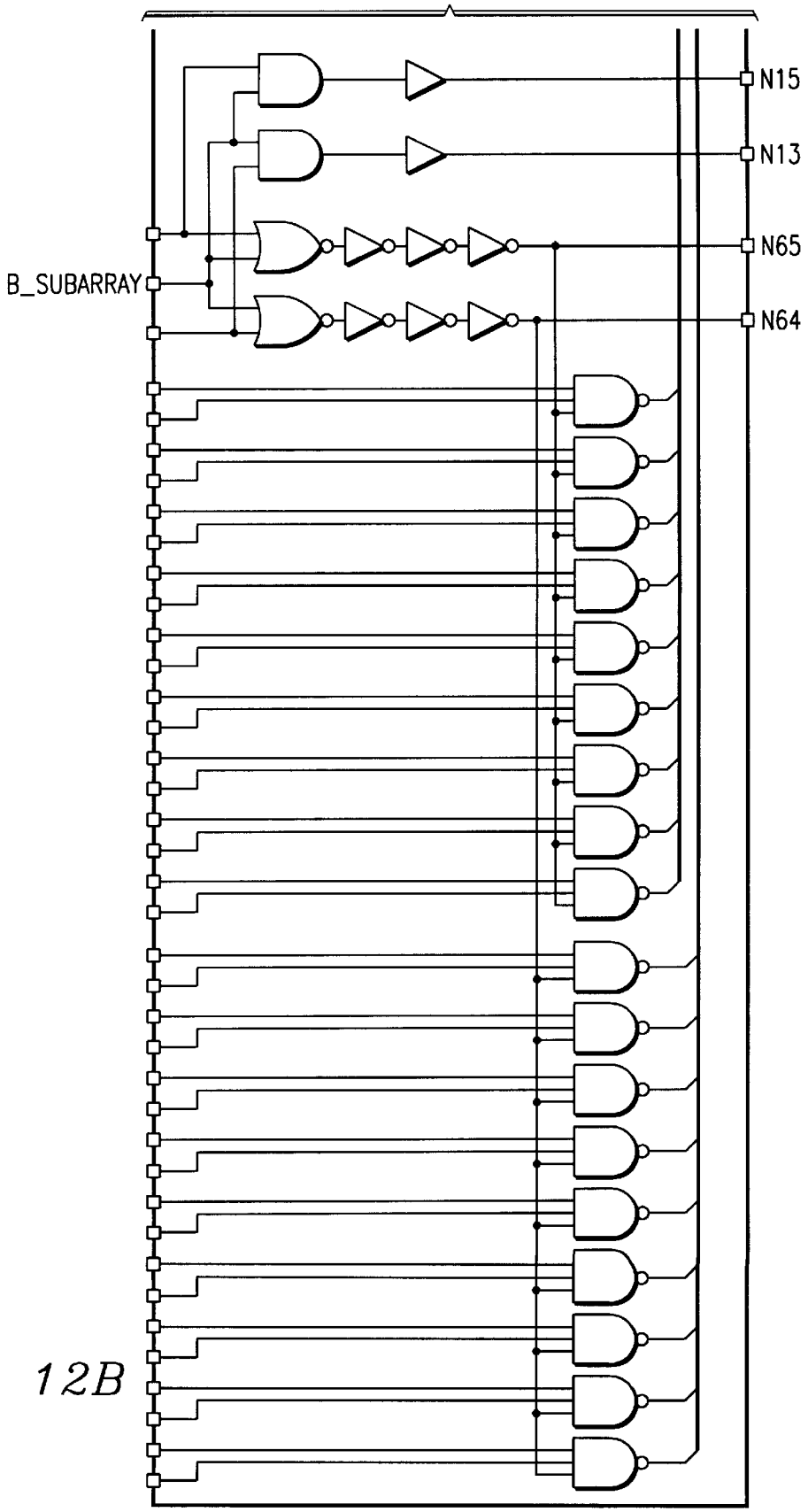

Referring now to FIG. 8 there is a block diagram of a BIST address control circuit 65 that controls generation of array addresses during an active self-test operation. FIGS. 9, 10, 11 and 12 are logic schematics of circuits included within the address control circuit 65 of FIG. 8.

The BIST signals interface with the main circuit as close to the buffer as possible to ensure that they closely simulate conventional test conditions. This will allow the BIST circuits to test as much of the memory device circuitry as possible.

Figure 13A:
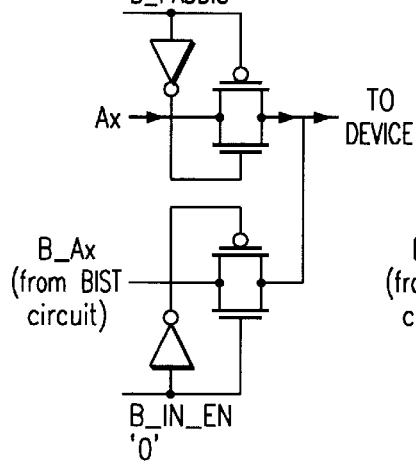
FIGS. 13A–13C are schematic diagrams showing the operation of the address buffer of the memory device.
Figure 13B:
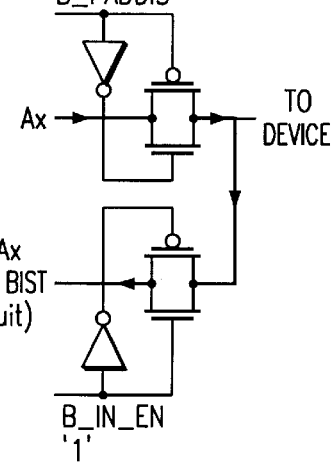
Figure 13C:
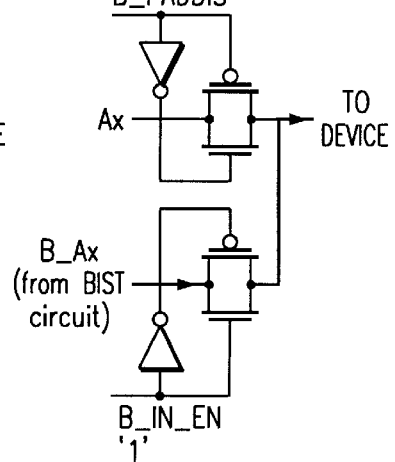

FIGS. 13A_13C show the interface between BIST generated signals and the main devices. The main function of the BIST generated signals is to replace the external signals that the memory device receives. Thus at the BIST interface there is a multiples circuit which chooses between the BIST generated signals B-Ax and the external signals Ax from outside. The address lines are being used for multiple purposes, besides the above two cases, they are also used in power up to bring information into the BIST circuit, as illustrated in FIG. 13B. Control signals B_PADDIS and B_IN_EN, generated by the self-test arrangement control how the multiplexer operates at anytime.

The address bus A0–A13 of FIG. 1 is used for applying the special signal conditions for the self-test mode during and after power up. An overvoltage signal is applied by way of one lead of the address bus A0–A13 to a BIST detector circuit 300, which responds to the overvoltage condition by putting itself in a standby self-test condition. In this description the address lead A4 is used as an exemplary over voltage lead. While the BIST detector circuit 300 remains in its standby condition, it allows the built-in self-test arrangement to prepare for testing by accumulating information about a specific test to be run. Typically the specific test will be selected from a large group of tests which might be run. The built-in self-test arrangement will remain in the self-test standby condition until another input signal is applied. Meanwhile data can be written into or read out of the memory array 220, as if it were in the normal mode because the built-in self-test arrangement 60 is in standby rather than in active self-test mode.

The self-test arrangement 60 is put into the active self-test mode from standby by applying a high level signal CS_ by way of a lead 135 to the BIST detector circuit 300. The built-in self-test arrangement 60 and the memory device 50 will operate in the active self-test mode as long as the signal CS_ remains at the high level and then return to normal operation when the signal CS_ goes to its low level.

Figure 14:
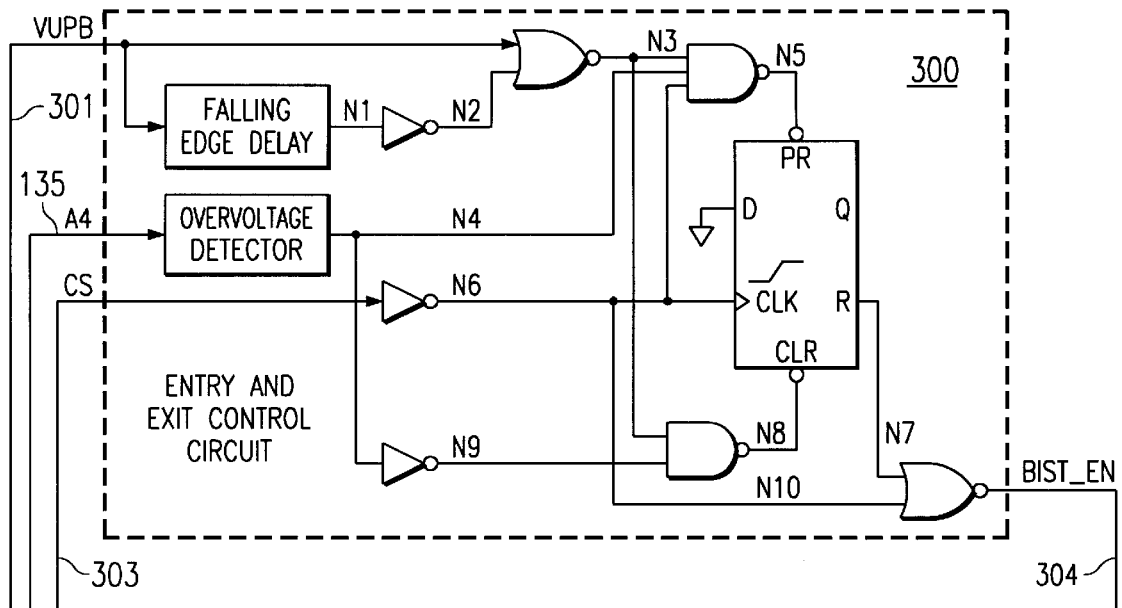
FIG. 14 is a logic diagram of a BIST detector circuit.

Referring now to FIG. 14, the BIST detector circuit 300 includes input terminals 301, 135, and 303 for receiving, respectively, a signal VUPB, an over voltage signal A4 from the lead of the address bus A0–A13, and the control signal CS_. An output lead 304 carries a built-in self-test enable signal BIST_EN that indicates when the device 50 is operating in its self-test mode. The BIST detector circuit 300 detects a BIST request during power up only. To detect a BIST request requires an overvoltage to be detected at power up and the signal CS_ having a value of '0' at that time. When the circuit 300 detects these two conditions at power up, the chip goes into a BIST standby mode. While the circuit 300 is in BIST standby mode and the signal CS_ goes high, the circuit 300 enters the self-test active mode.

Figure 15:
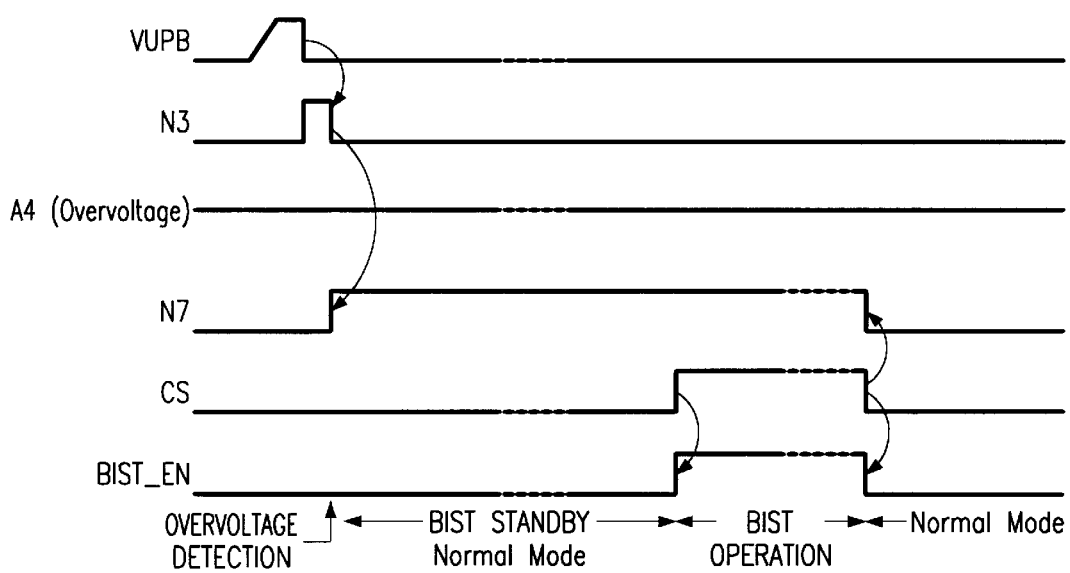
FIG. 15 is a timing diagram showing operating conditions of the detector circuit of FIG. 14.
Figure 16:
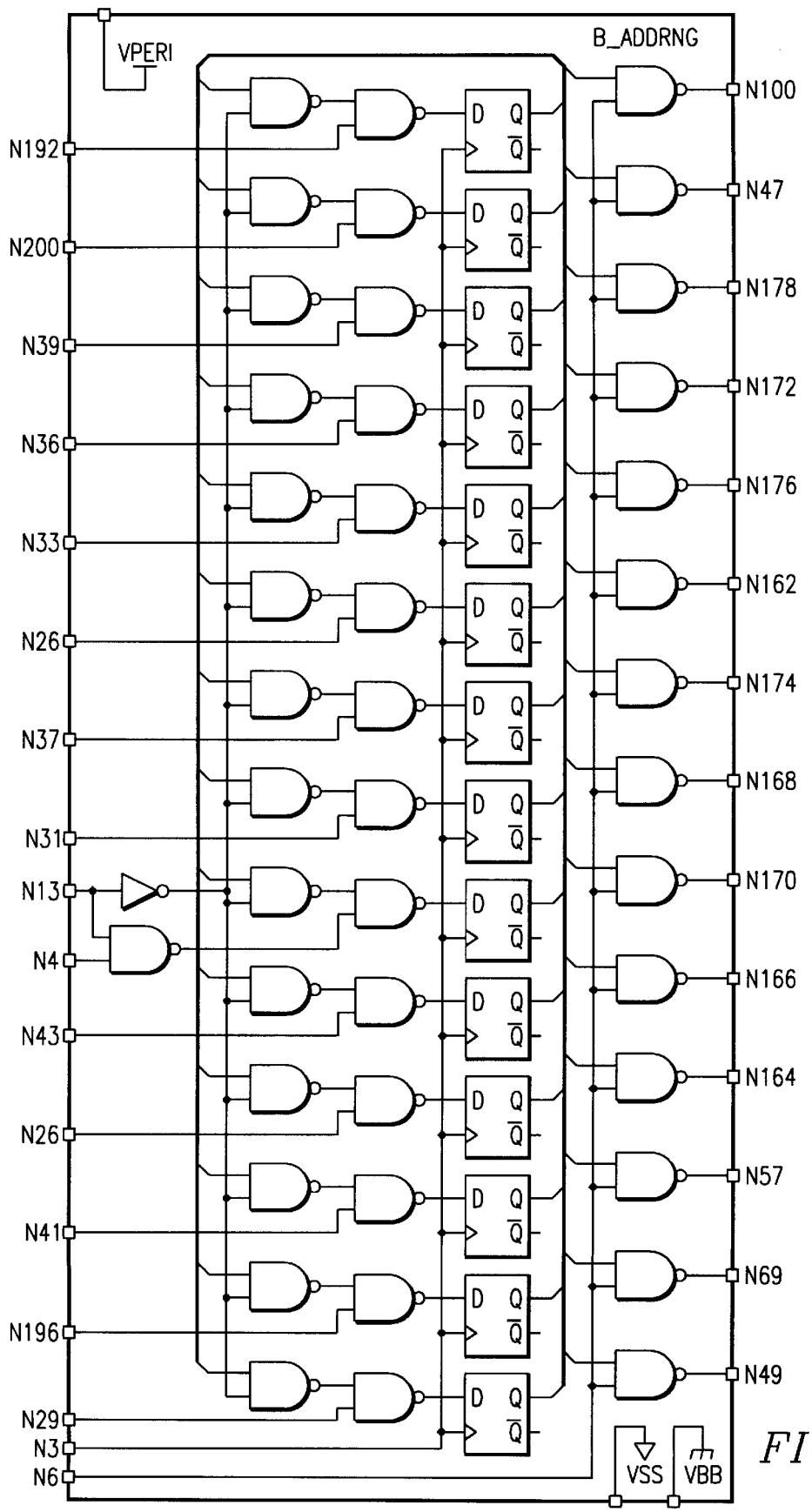
FIGS. 16–21 are logic schematics of BIST address register circuits.
Figure 17:
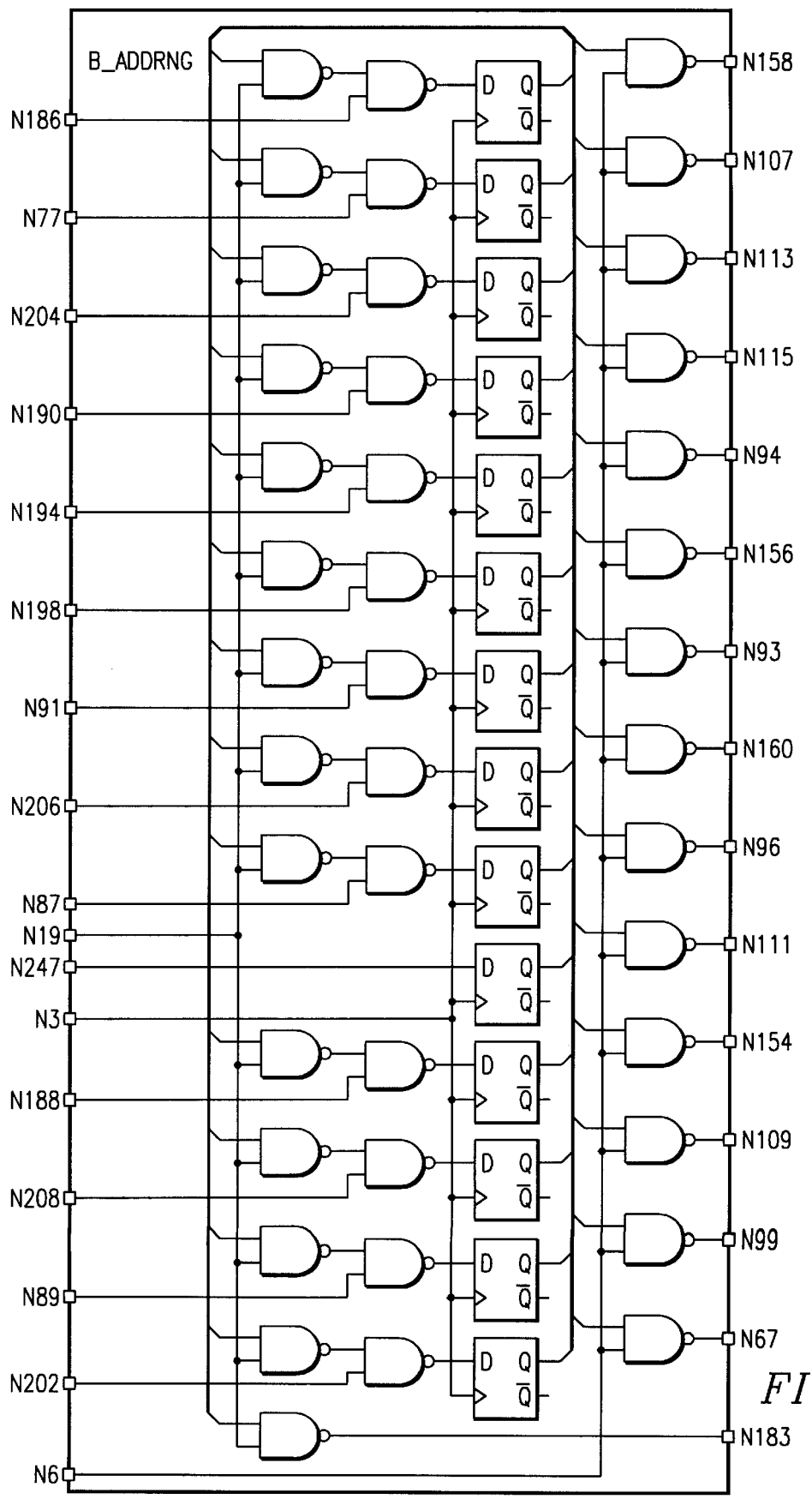
Figure 18:
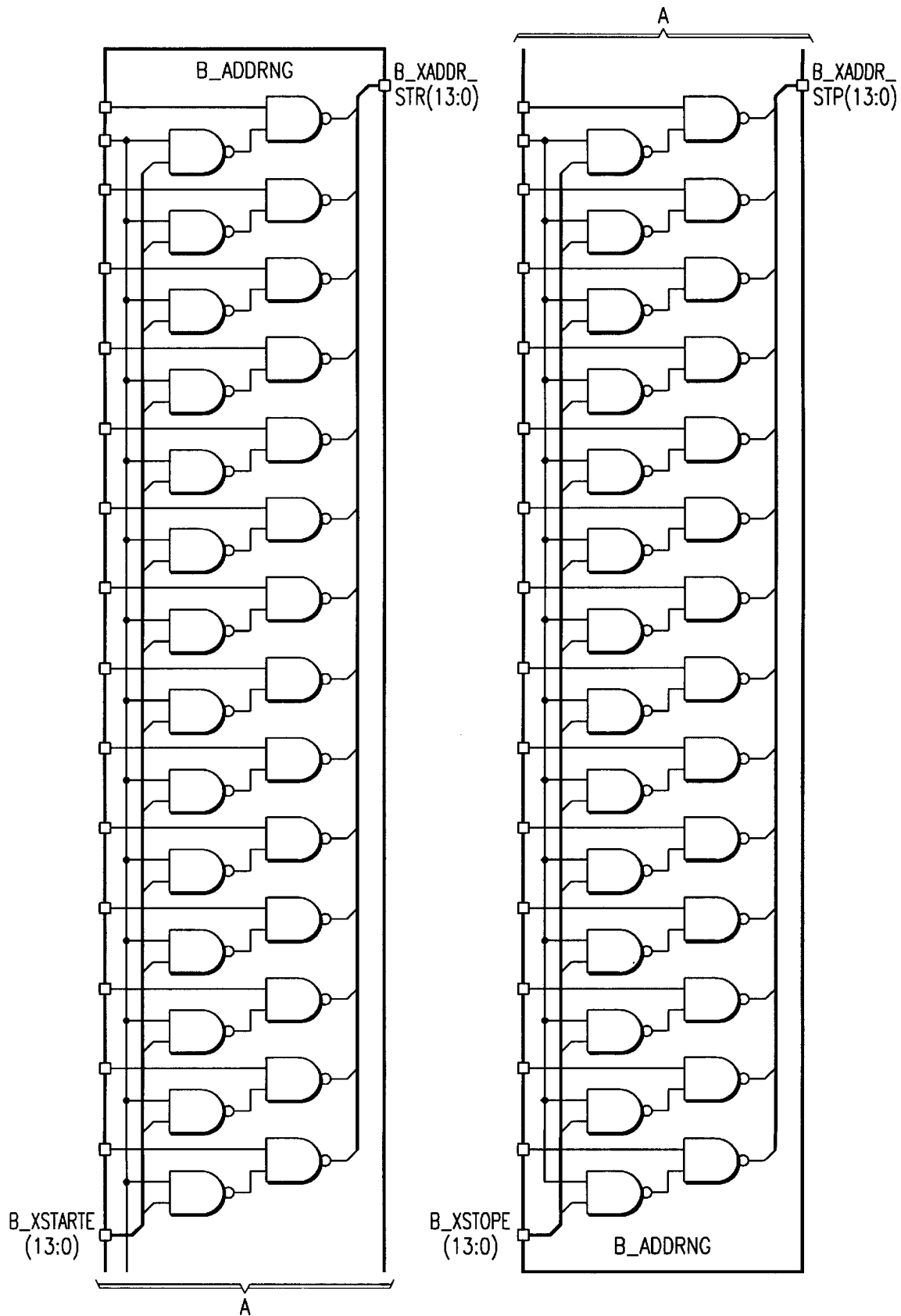
Figures 19A, 19B:
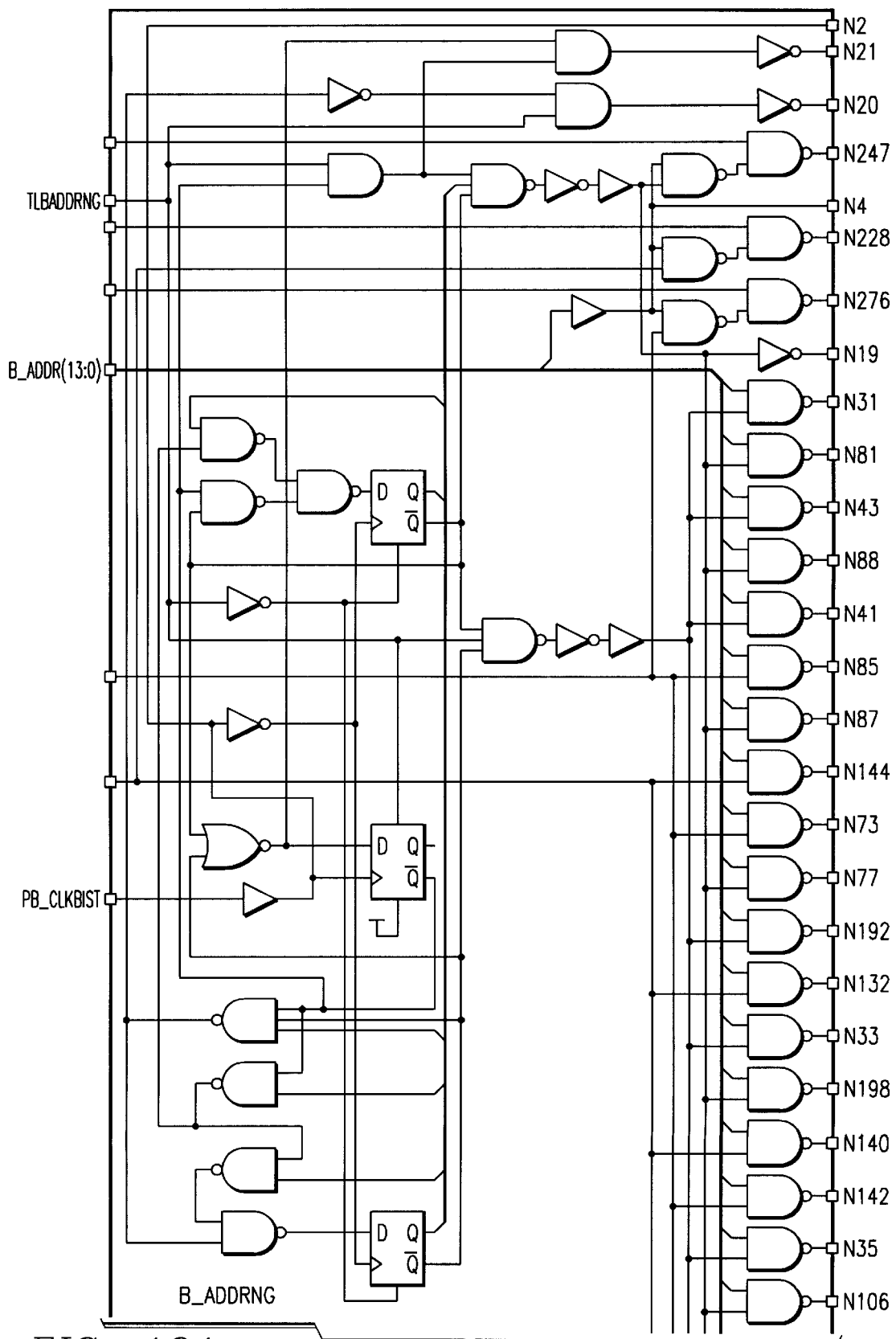
Figure 20:
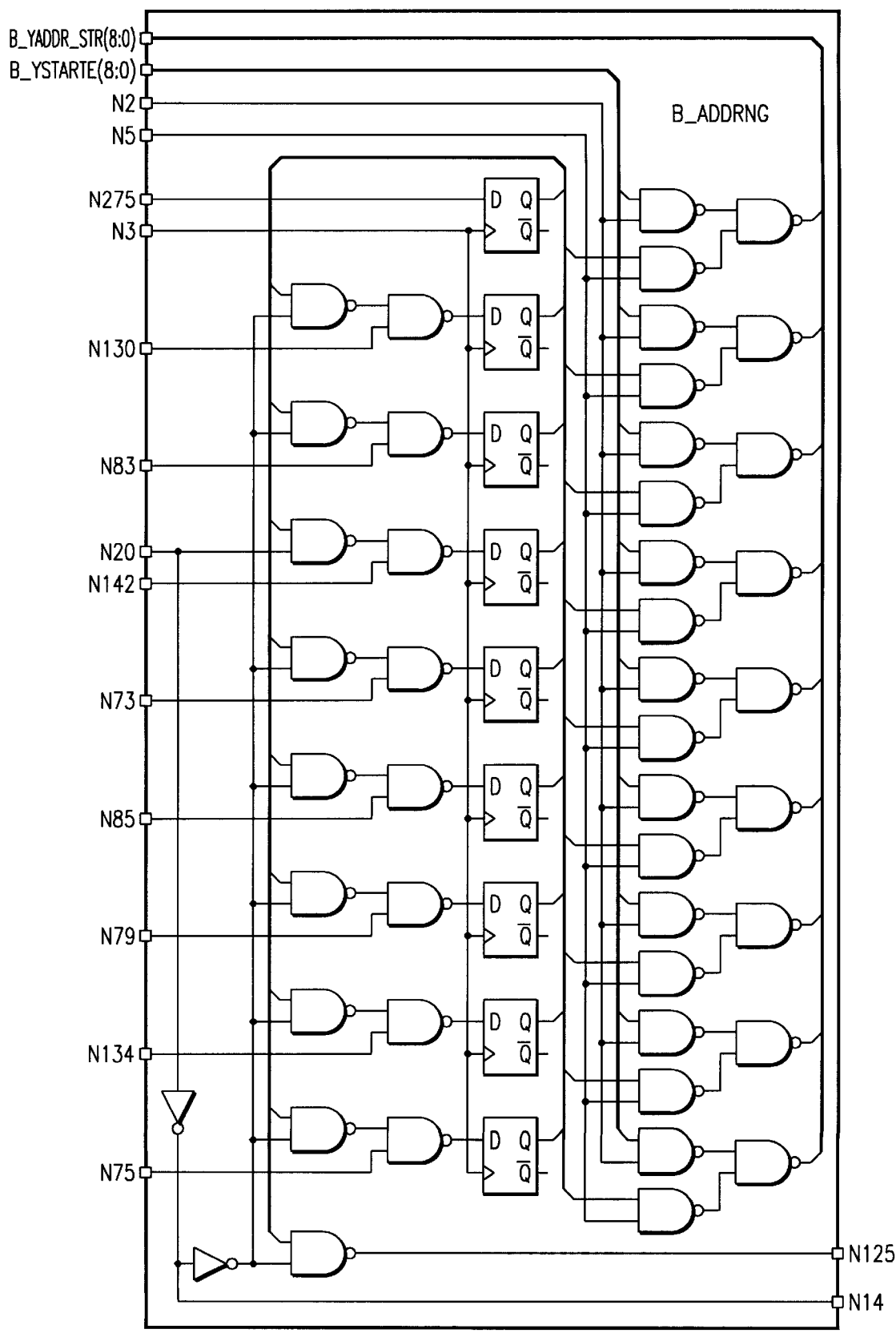
Figure 21:
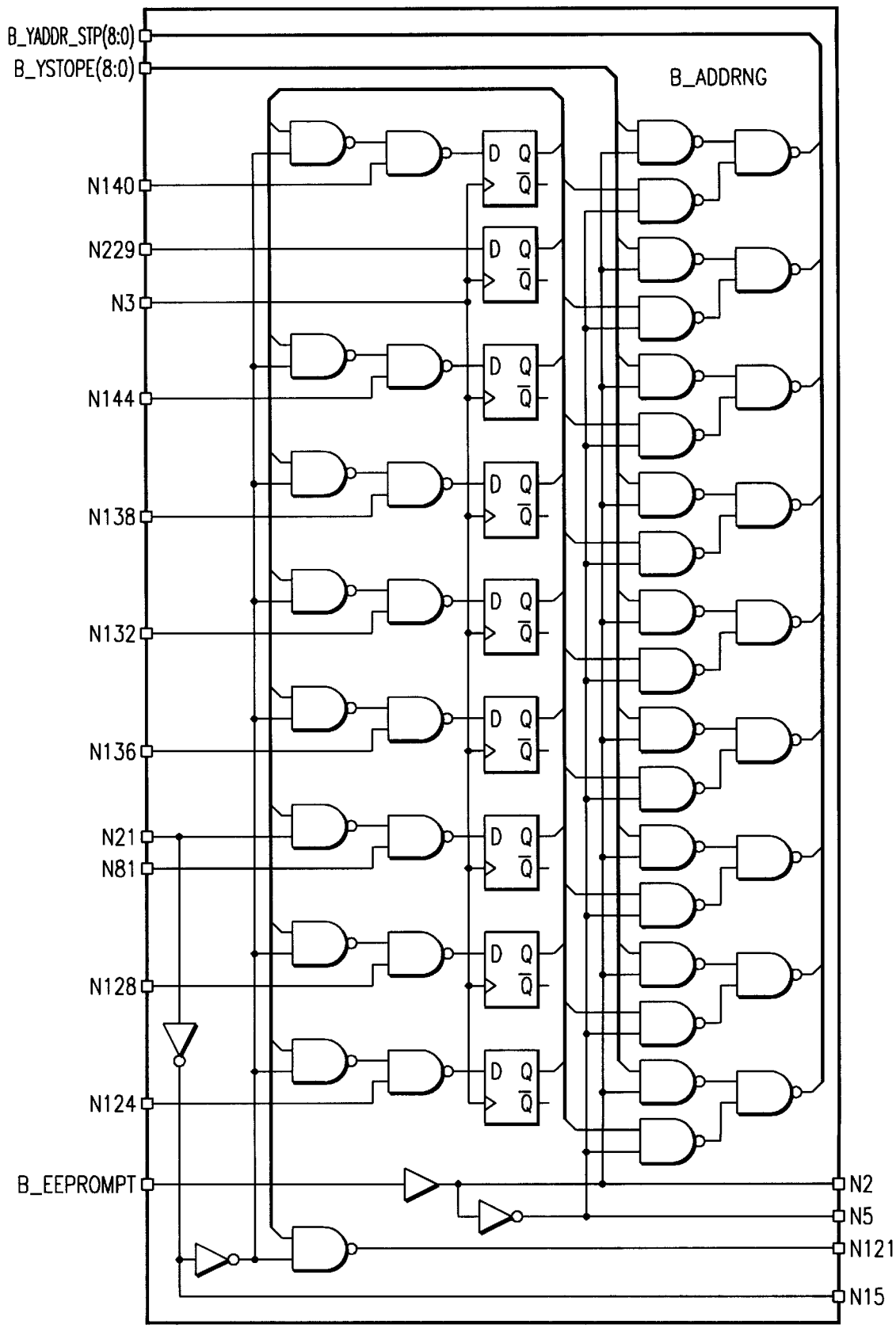

FIG. 15 presents the timing diagram for the operation of the BIST detector circuit 300 of FIG. 14. Several key signals are presented in FIG. 15 together with their interdependency. It is noted that all of the signals applied to the BIST detector circuit 300 are fundamentally voltage levels. As will be demonstrated subsequently herein, no eternal fluctuating control signals need to be applied to the memory device 50 during the active self-test mode. All signals for performing the repertoire of tests are produced by the built-in self-test arrangement 60 on the device 50.

A more detailed description of the arrangement and operation of the BIST detector circuit 300 is presented in a co-pending patent application, Ser. No. 60/016,406. which was filed concurrently herewith. In that patent application, the BIST detector circuit 300 is referred to as an entry and exit control circuit. The subject matter of that patent application is incorporated herein by reference thereto.

Two signals, A4 and control signal CS_ are multiplexed for built-in self-test entry. The signal A4, or any other address bit, is multiplexed as an overvoltage. Control signal CS_ is used for timing BIST entry and EXIT. A BIST request is detected if an overvoltage is detected and the control signal CS_ is low when the device is being powered up. If an overvoltage is detected at the falling edge of VUPB, the device will go into BIST standby mode. The device will only go into LIST active mode if the control signal CS_ is subsequently pulled high. This will allow full control of the time to enter the BIST active mode. During BIST operation, if CS_ is pulled low, the device will exit BIST immediately. Normal operation occurs when CS_ is low. This prevents the BIST active mode from occurring during normal mode operation.

In BIST standby mode, the device can operate as if it were in normal mode. Note that the control signal CS_ a behaves normally while the device is operating in normal mode. It is only in the BIST mode that the control signal CS_ function differently. Design for test (DFT) modes can be executed when device is in BIST standby mode. One of the ways to use DFT mode while in BIST standby is to have the address range mode load start and stop addresses before the BIST active mode operation.

Referring now to FIGS. 16–21, there are address range registers for storing address information used during self-test operations. When a BIST request is detected, an internal signal B_SR_LOAD is generated to load in the information located on the address lines except the address for the overvoltage signal on lead A4. The information loaded in contains two sets of information. Test selection data on the address leads A0–A3, A5–A10 determine whether or not each specific test is to be run in BIST active mode. Secondly, BIST operation options such as internal external clock option, full/sub array option, enable disable output option.

Figure 3:
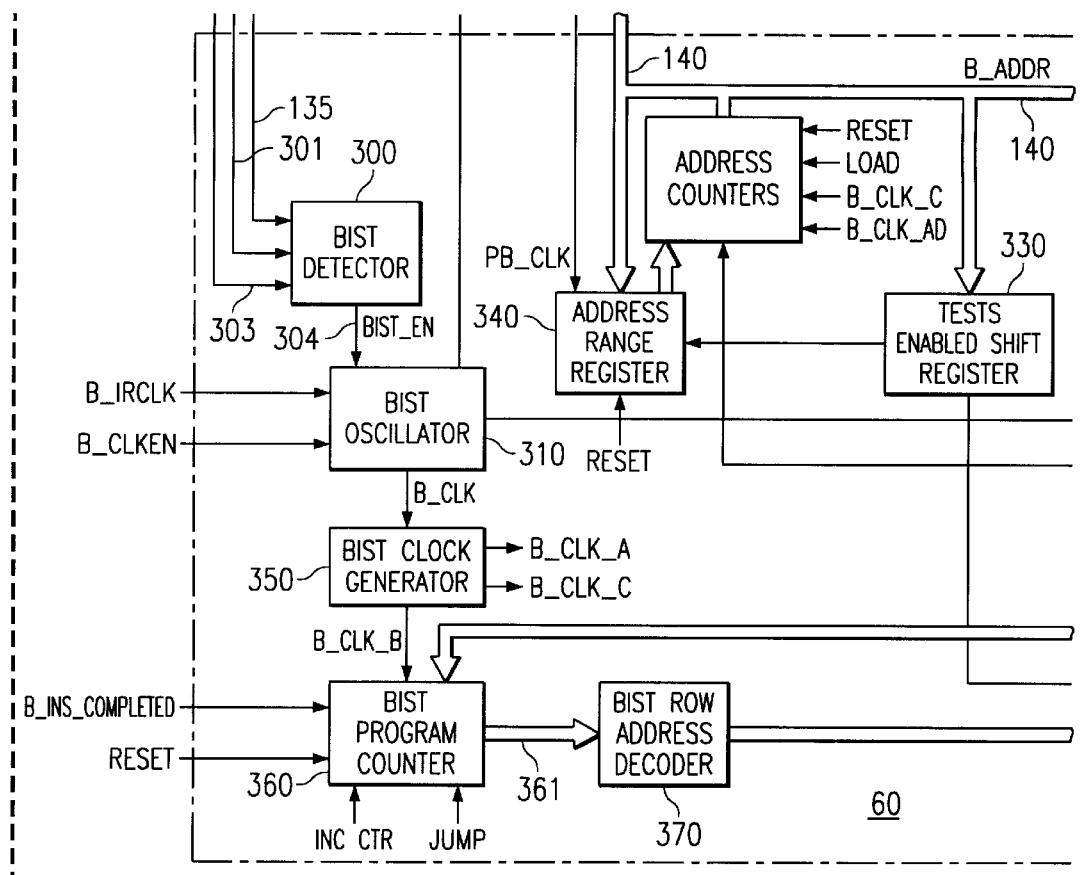

In FIG. 3, there is shown a BIST oscillator circuit 310 that includes an arrangement for generating a continuously repetitive clock signal B_CLK which is used to produce a group of specific clock signals for controlling different parts of the built-in self-test operation.

Figure 22:
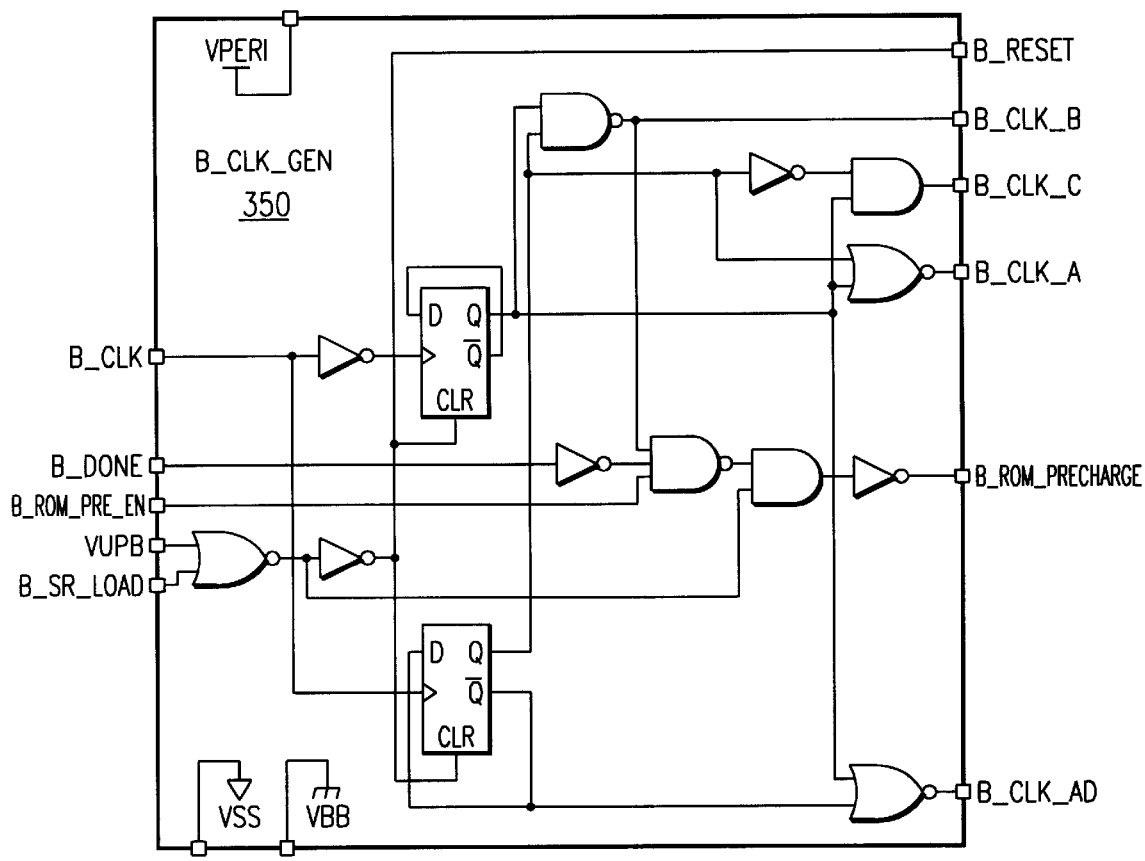
FIG. 22 is a logic schematic of a BIST clock generator circuit.

FIG. 22 is a logic schematic of a BIST clock generator circuit 350 of FIG. 3. It derives BIST clock signals B_CLK_A, B_CLK_B, and B_CLK_C.

Upon entering the active self-test mode, the clock signal B_CLK is applied to the clock buffer circuit 110 of FIG. 1 for taking over control of the clock buffer circuit 110, which thereafter during the active self-test mode produces the clock signal B_CLK to control access to and the operations of the memory array 220, as well as parts of the built-in self-test arrangement 60. Initially data from the address buffer 100 is transferred by way of an internal address bus 140 to an enabled tests circuit 330 in FIG. 3. Exemplary circuit 330 is a shift register arrangement that stores data identifying a specific test, or a group of tests to be run during the relevant active self-test mode. This data may be, for example, a high level for each test to be run and a low level for each test that is not to be run. Once the selected test data is stored in the enabled tests circuit 330, a group of addresses may be stored in the address range registers 340.

Figure 23:
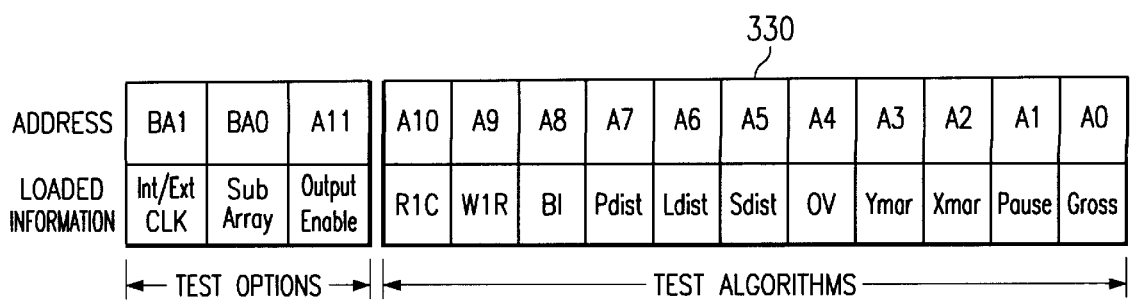
FIG. 23 is a table showing the register positions for storing data representing what test operations should be enabled to run or not enabled to run for a specific self-test.

Referring now to FIG. 23, there is shown a diagram of the information that is stored in the enabled test circuit 330. In FIG. 23, the address bits positions A0–A3, respectively, represent the gross test, the pause test, X march and Y march. Address bit positions A5–A10, respectively, represent short disturb, long disturb, page disturb, burn in, write one row, and read one column. Address bit position A11 and bank addresses BA0 and BA1, respectively, represent output enable, sub array option, and internal clock-/external clock selection.

A clock is needed for the BIST operation. BIST circuit has an internal oscillator which provides this clock with a fixed frequency. There is an external clock option built in for engineering and debug purposes which allows the clock frequency to be varied if needed. The decision to use an external or internal clock is loaded in when a BIST request is detected during power up.

The previously mentioned address range registers 340 include a group of four registers which receive and store, respectively, row and column addresses which determine start and stop addresses in the memory array 220 where the test or tests should commence and end. Such addresses are used at the discretion of the person responsible for testing the device 50. A default condition runs the tests throughout the entire memory starting at row address 0 and column address 0. Thus the address range registers 340 are reset to zero when the device 50 is initially put into the active self-test mode. Thereafter the range addresses may be stored if desired during a DFT mode load operation.

During prototype debug on any early production chip, it is unlikely that a complete array will work correctly. Under such circumstances, the BIST test will always fail since there will always be some cells which do not work and will cause failure of the BIST tests. This means that the BIST logic cannot be completely checked out since there will never be an application of BIST which permits the BIST logic to return a "PASS" signal until a completely good part is manufactured. A second problem occurs during debug of the chip. If the BIST is limited to the complete array test, it cannot be used to target a subset of the array as an aid for debug.

Sub array testing permits the starting address to be any location and the ending address to be any location and they cna be loaded into the BIST address range registers via a DFT mode. The BIST testing is applied between the starting and ending locations including one address location of the starting address is the same as the ending location. The address ranges can be changed each time prior to BIST application thereby permitting the BIST to be applied to islands to fault free areas through repeated testing.

Figure 24:
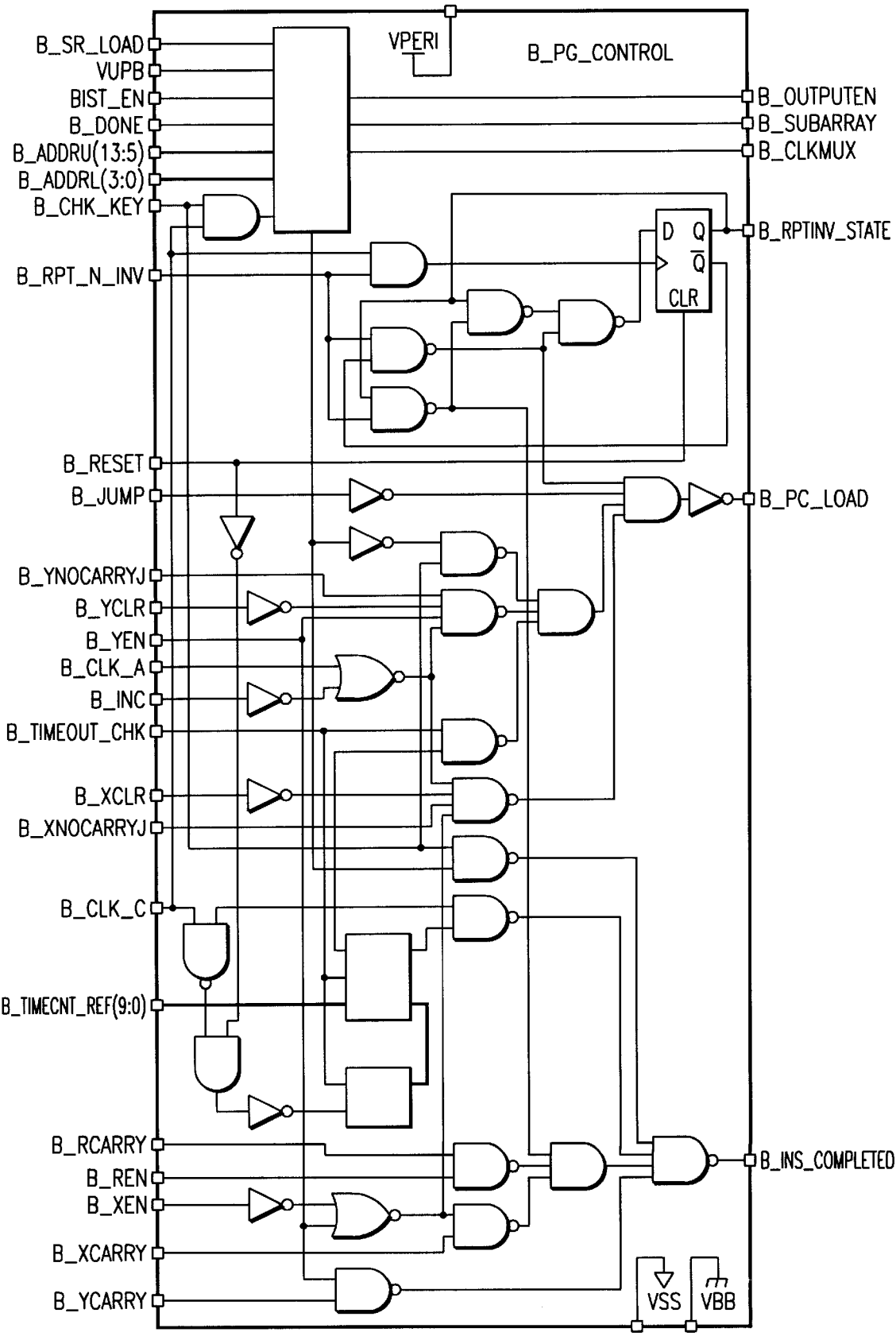
FIGS. 24 and 25 show a logic schematic of a BIST program control circuit that includes a program counter.
Figure 25:
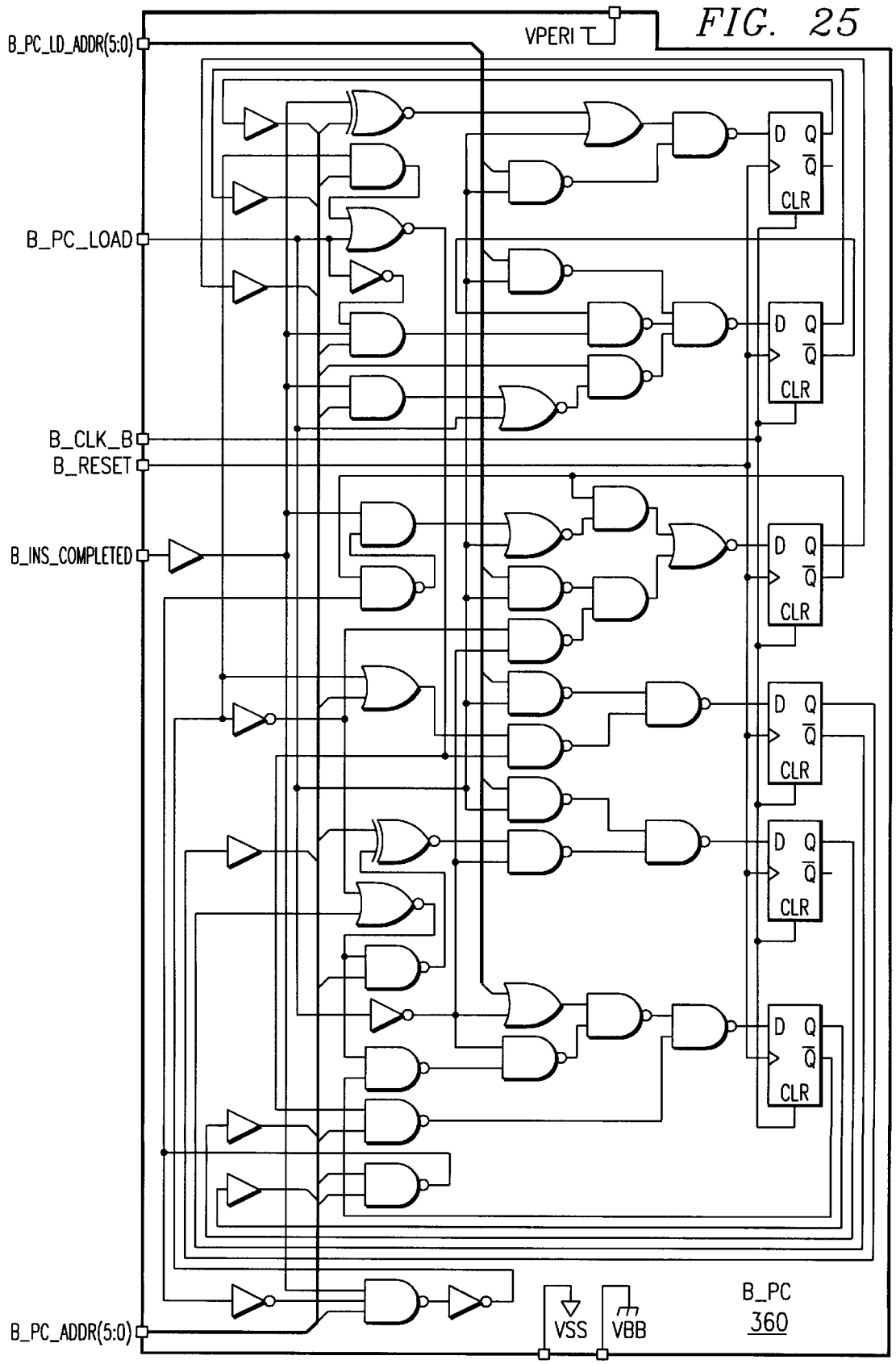

Referring now to FIGS. 24 and 25, there is shown a program control circuit that includes a program counter 360. The BIST program counter 360 is included in the built-in self-test arrangement 60 for controlling test sequences. Upon initiation of the active self-test mode, the BIST program counter 360 is reset by a signal B_RESET to its zero state. This is a sequential logic arrangement in which its current state, in combination with the state of data furnished by a BIST ROM register determines the next state of the BIST program counter 360. The state changes in response to a clock signal B_CLK_B applied from the clock generator 350.

Figure 26A:
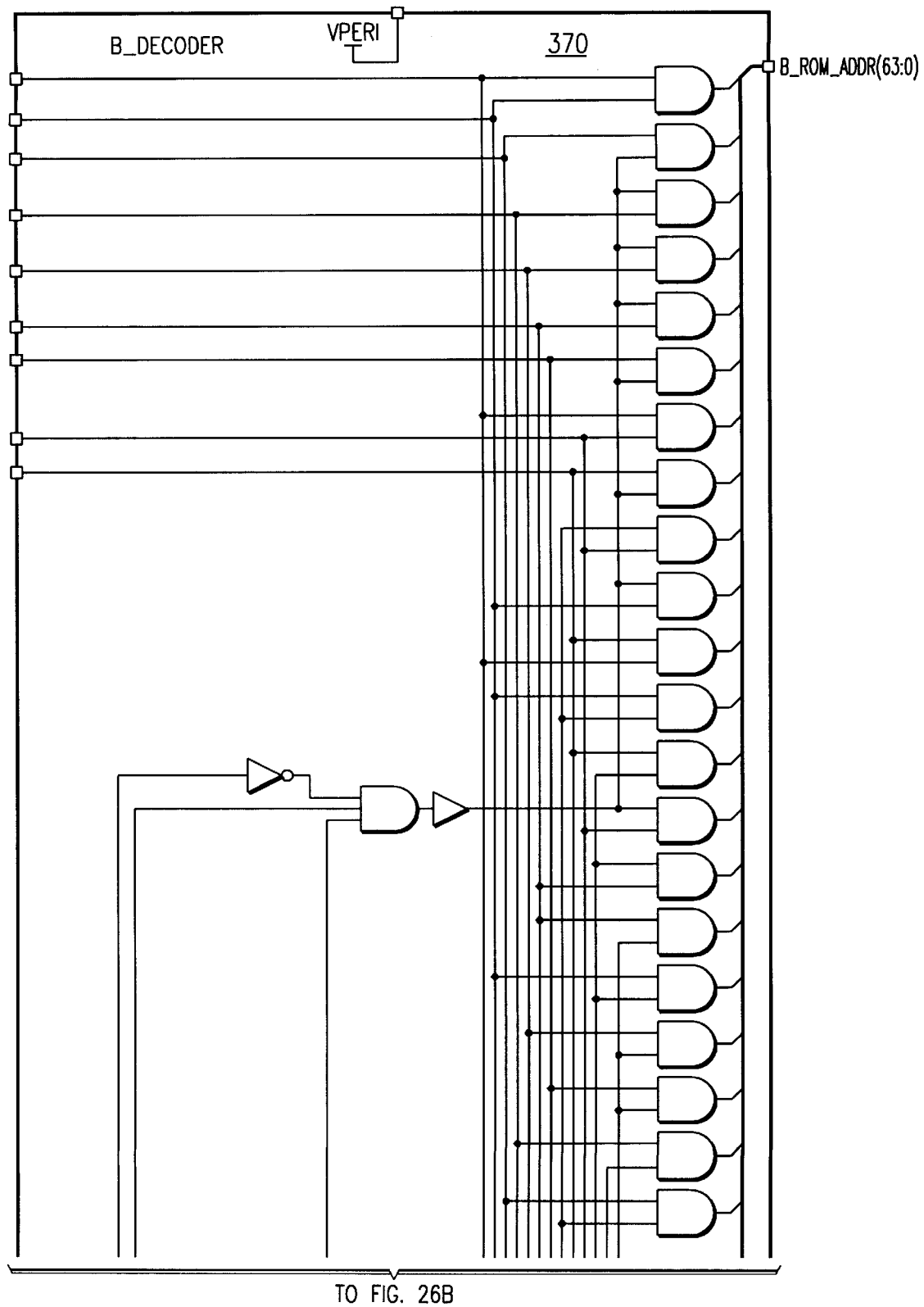
FIG. 26 is a logic schematic of the BIST ROM decoder.
Figure 26B:
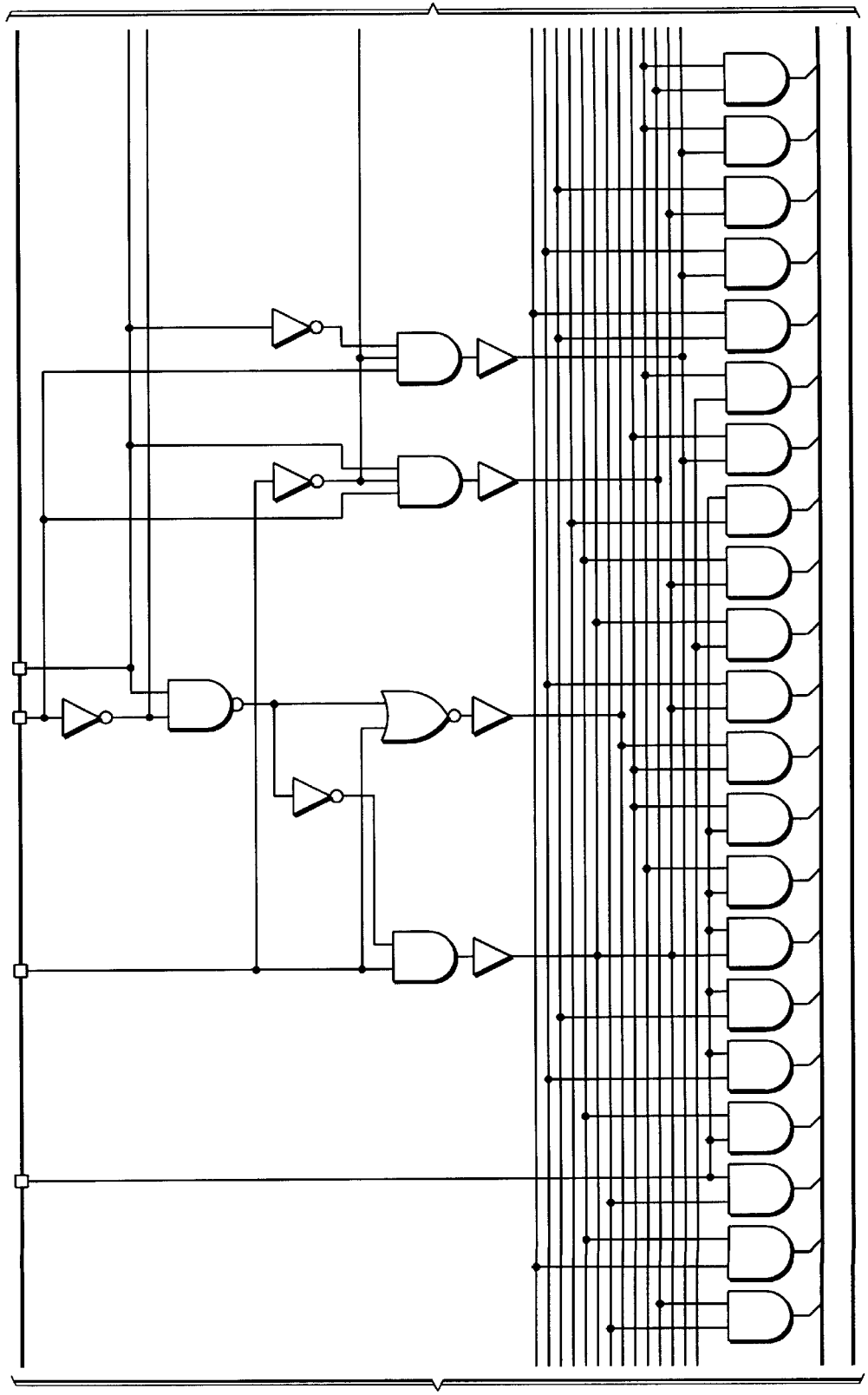
Figure 26C:
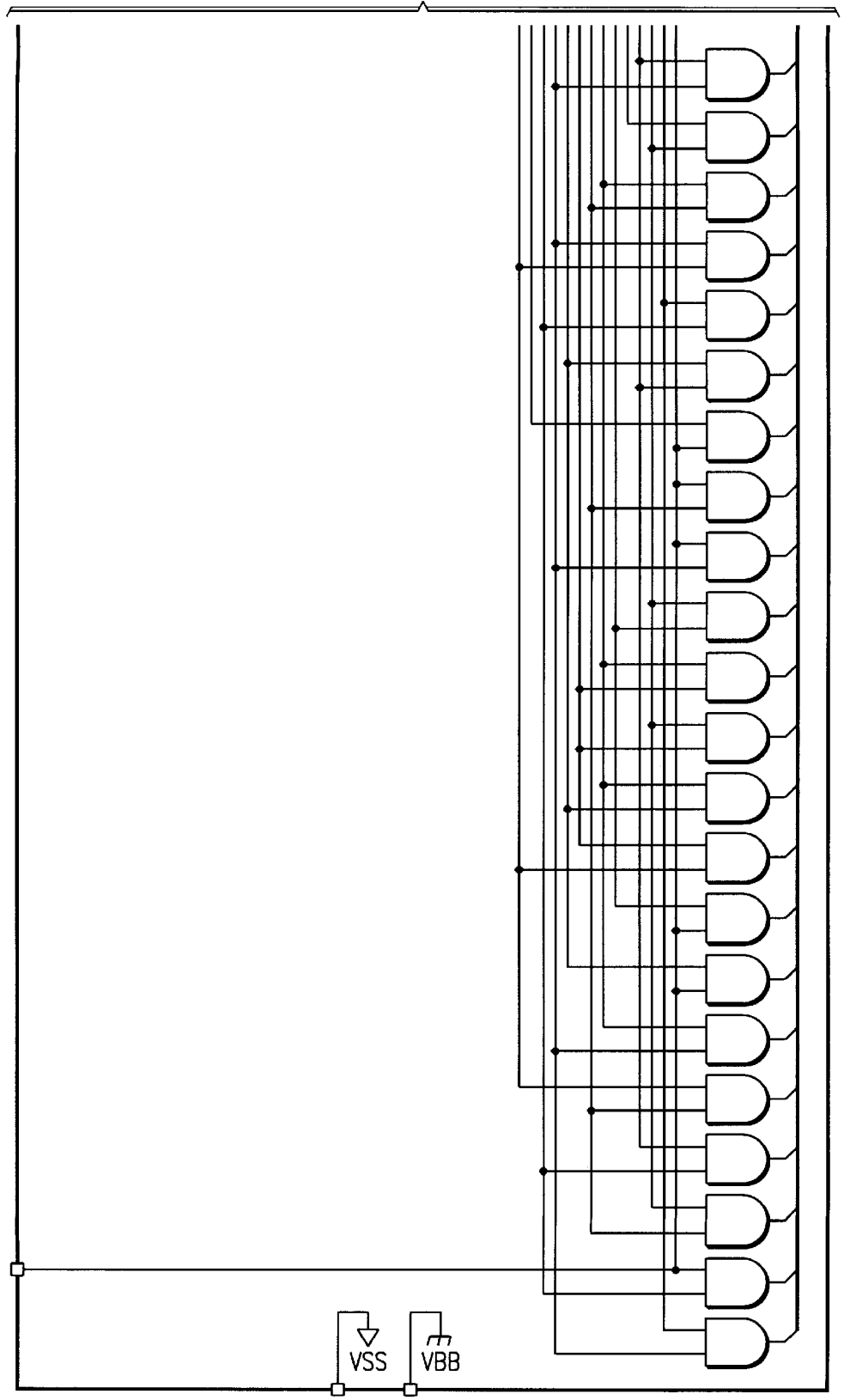

FIG. 26 is a logic schematic for a BIST ROM address decoder 370, shown in FIG. 3. The state of the BIST program counter 360 is represented by a group of binary signals that are applied by way of a bus 361 to the input of the BIST ROM address decoder 370. The group of input binary signals are decoded into a 1 out of 64 code for selecting a row of data from the BIST ROM 400.

Figure 4:
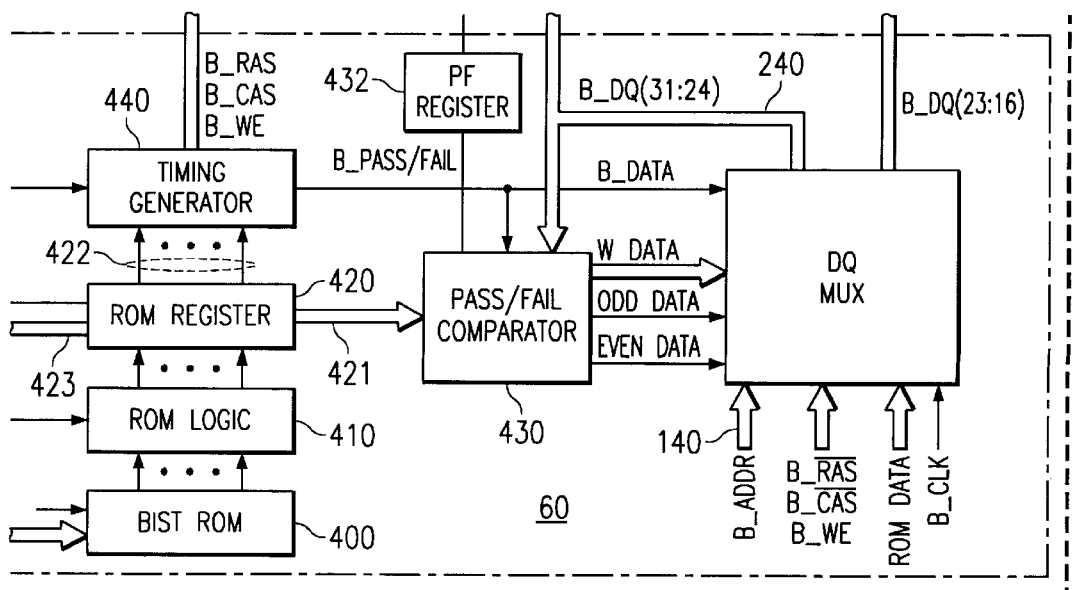
Figure 27:
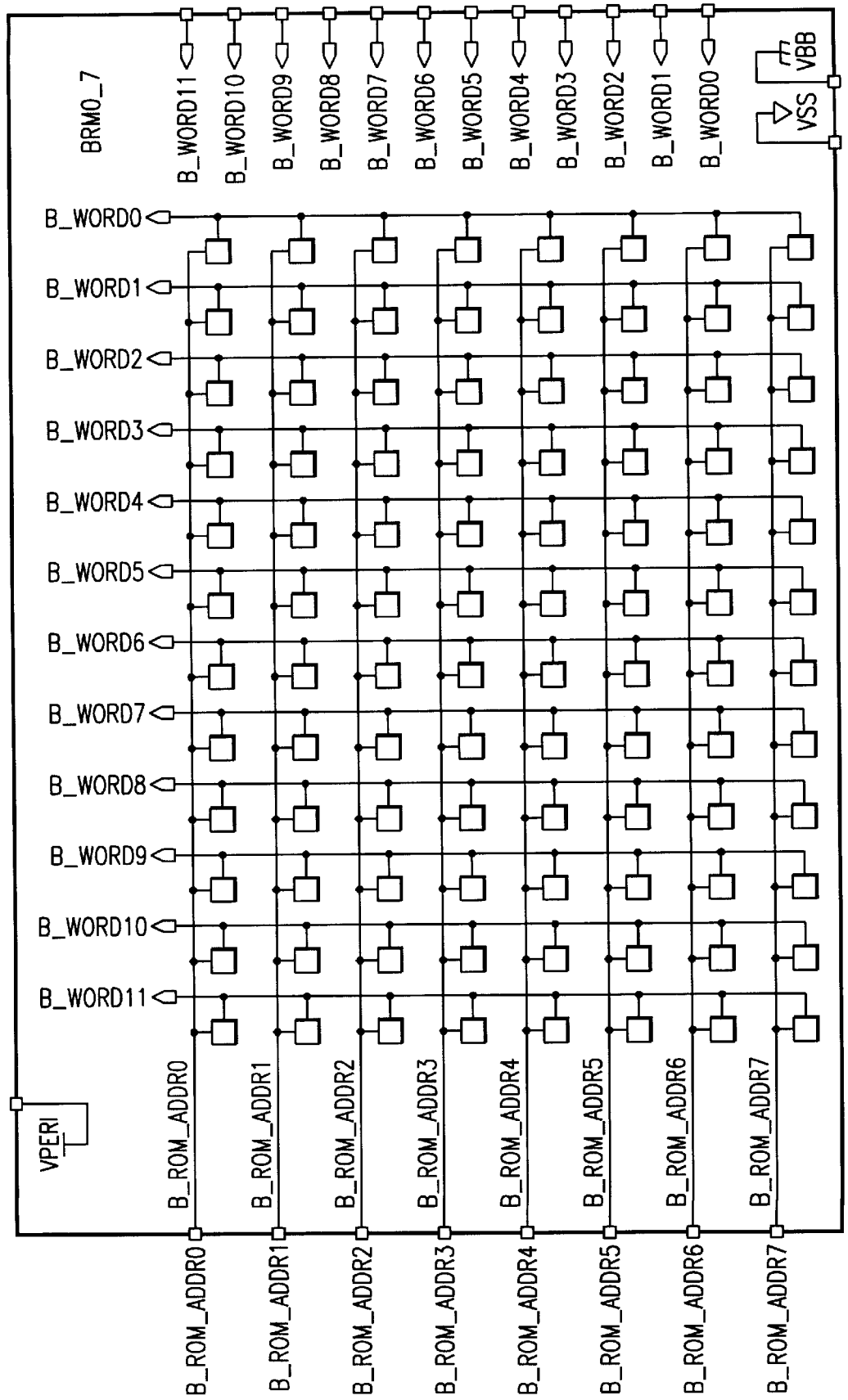
FIG. 27 is a schematic diagram of a BIST ROM for storing test algorithm instructions.
Figure 31A:
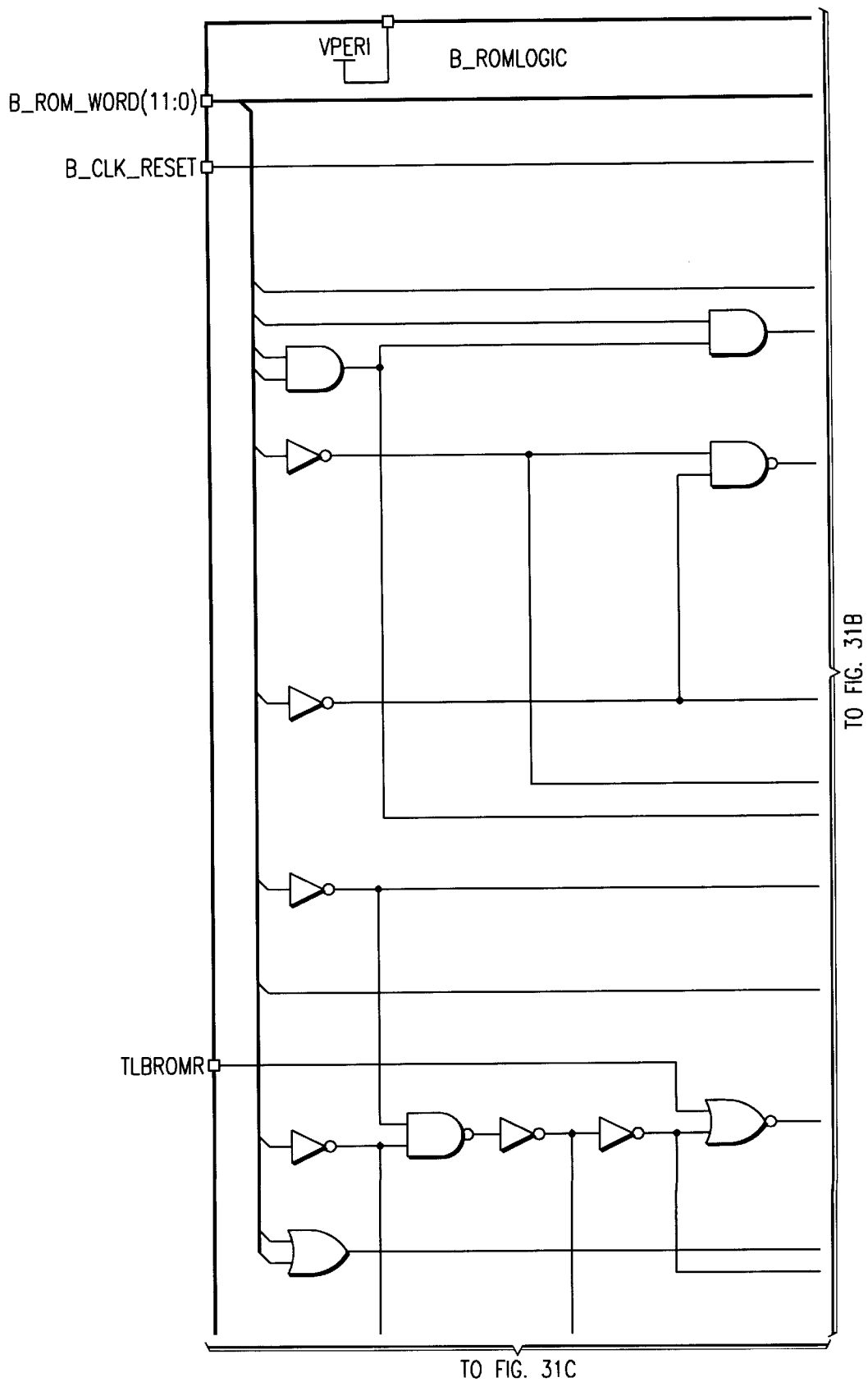
Figure 31B:
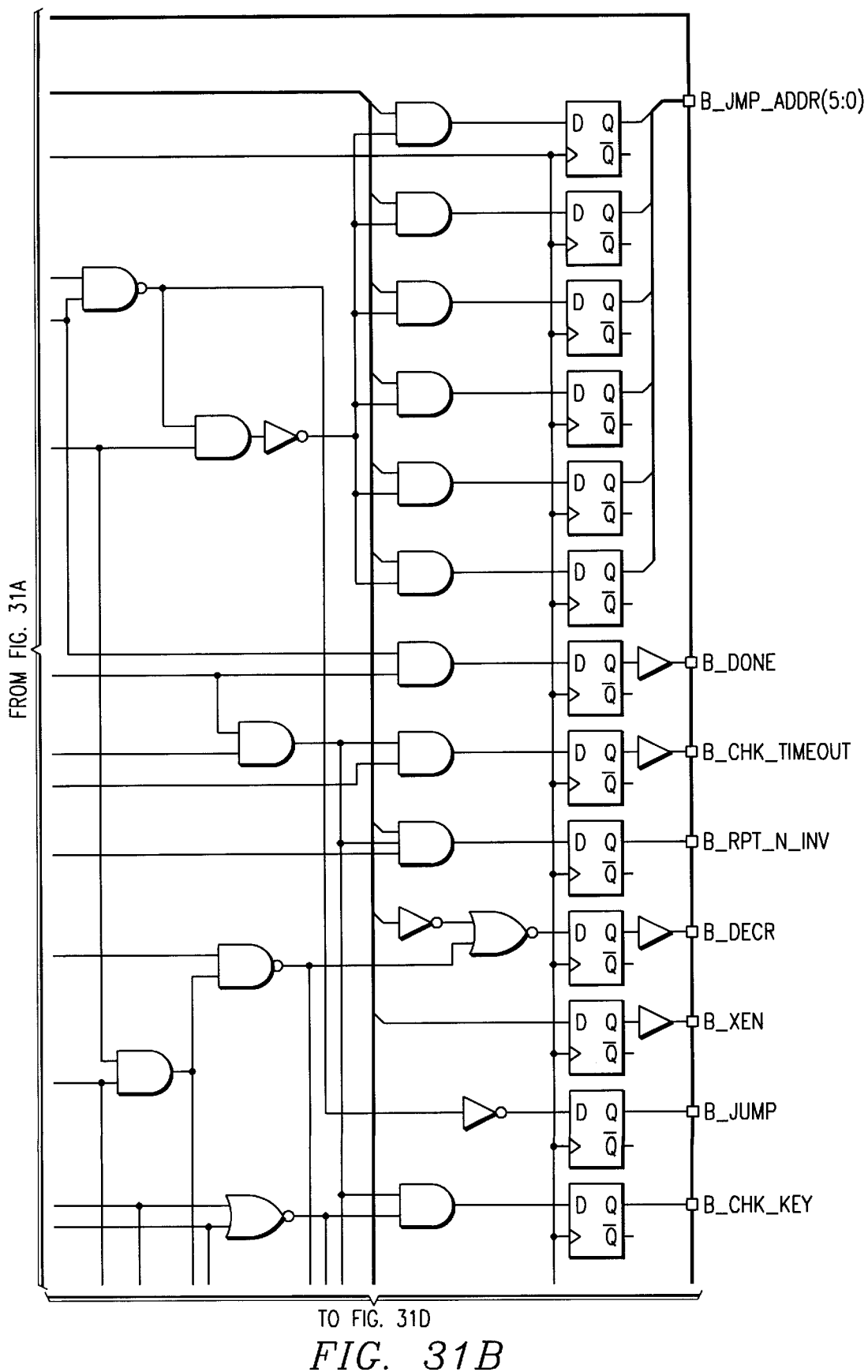
Figure 31C:
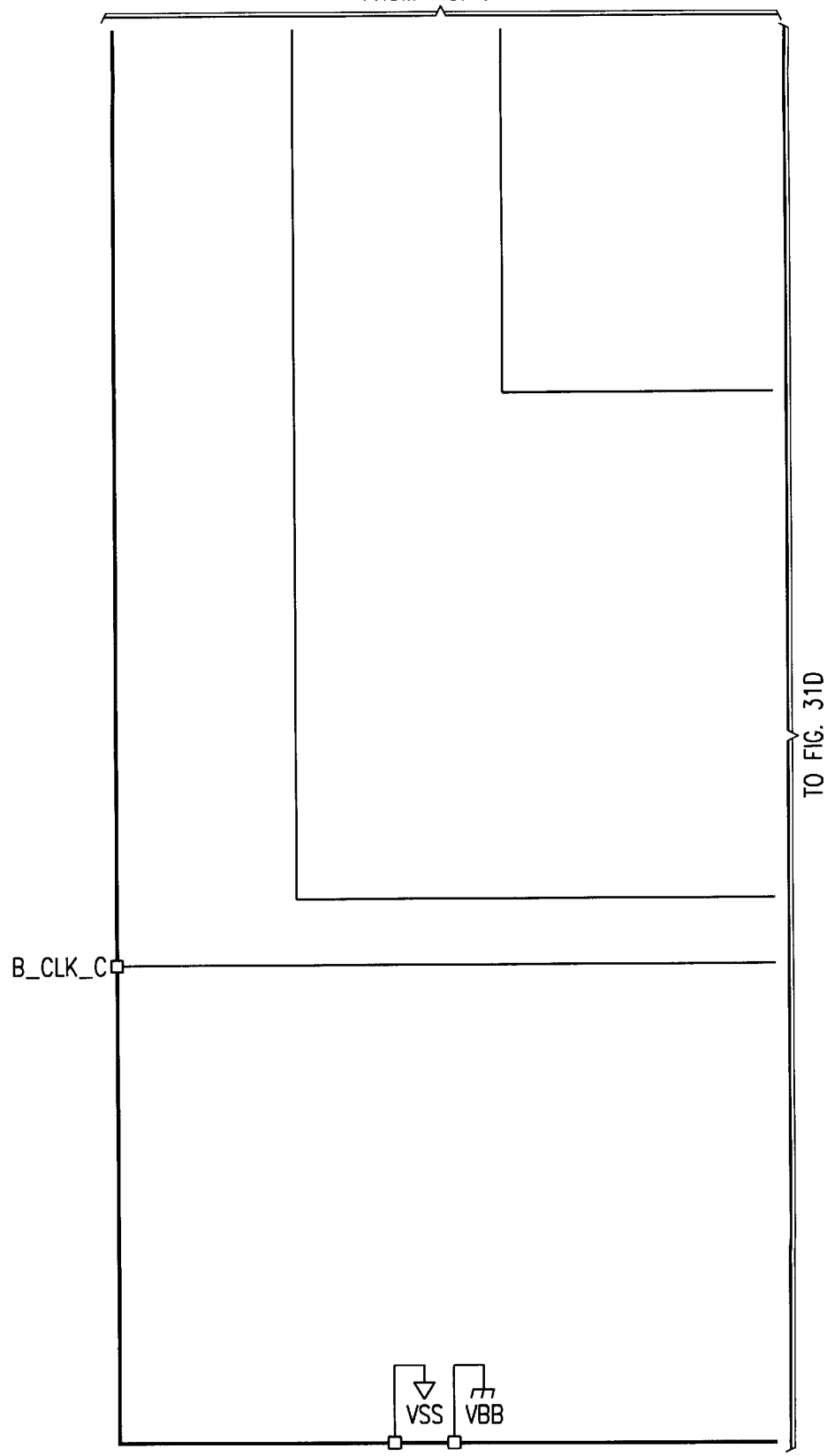
Figure 31D:
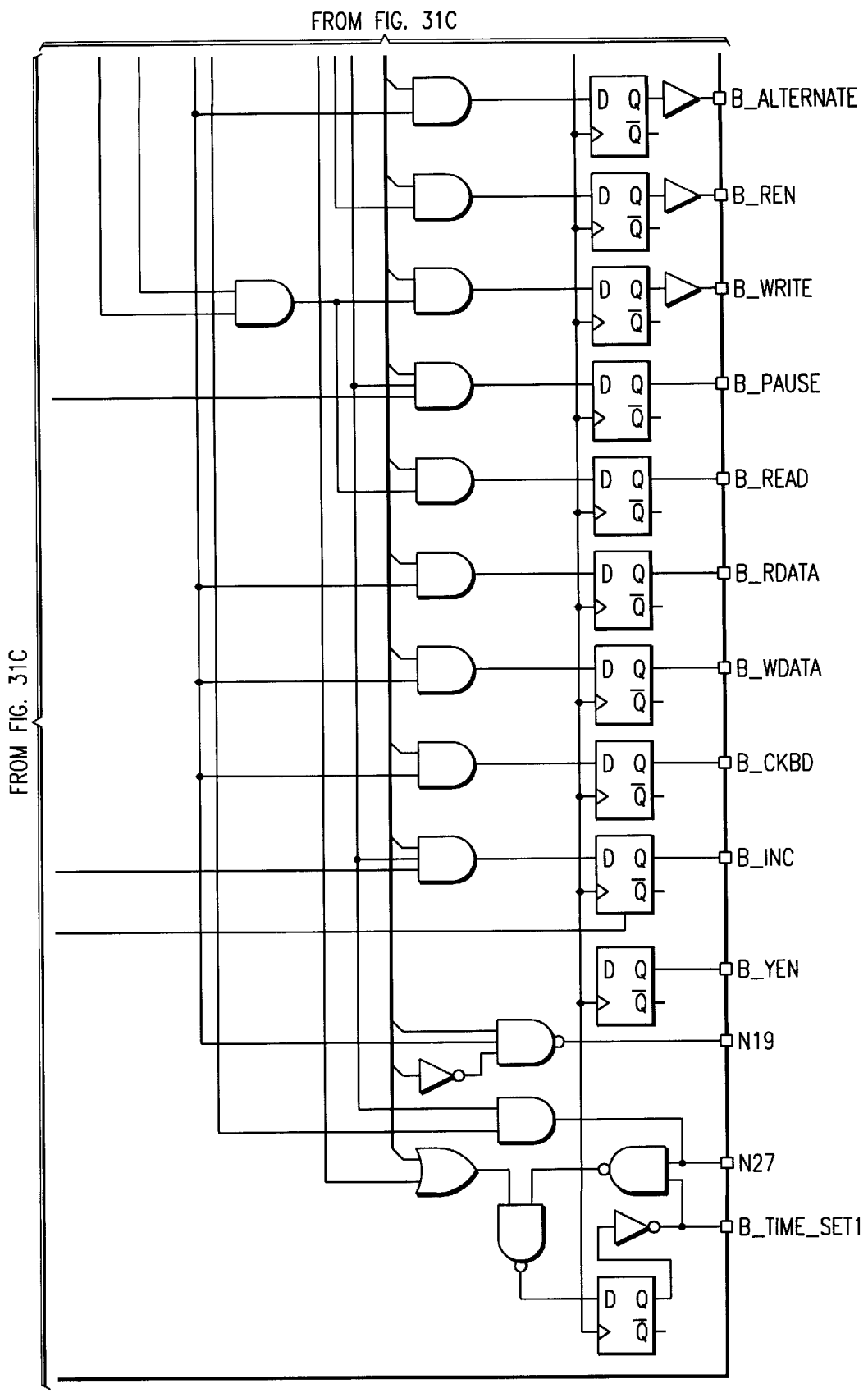

FIG. 27 shows the schemtic layout of an sixty-four word by twelve bit BIST ROM 400 of FIG. 4. The BIST ROM 400 is a sixty-four row read only memory that stores sequences of instructions for controlling several different test routines used to determine the operability of the memory array 220. The proposed BIST scheme has ten algorithms stored in a ROM. Each algorithm is typically made up of a series of instructions. The ten algorithms take up sixty-four ROM words and each Rom word has twelve bits. Each row address applied to the BIST ROM 400, accesses a row of data stored therein in response to a clock signal B_CLK.

The first instruction in an algorithm is an instruction to determine if that test is being enabled. Whether the test is enabled or not is decided at power up when test selection information is loaded into the test enabled register. All or any subset of tests can be selected. A block of test code is skipped if a '0' logical value is loaded in the corresponding tests enabled register.

For most algorithms, the last instruction in an algorithm tests for 'inverted pattern'. In a typical test, two data patterns ('0' and '1') need to be performed. This means each test is executed twice, once for each pattern. This instruction looks at a register to determine if the current test is executing the normal pattern (pattern '0'). If it is, then the program counter will jump to the start of the test and repeat the test with an inverted pattern. If the instruction determines that it is executing an inverted pattern, it will simple increment the program counter by 1 and move on to the next test since both data patterns have already been executed.

Referring now to FIG. 28, there is shown the table of data stored in the BIST ROM 400. In the lefthand column is the list of names of ten algorithms which represent the tests which may be selected to be run plus an instruction that all tests have been completed.

The first algorithm GROSS is for running a gross test. There are four rows of data, each representing one instruction for the gross test. Addresses for the instructions are shown in hexadecimal code in the second column from the left. The righthand column presents the mnemonic name for each instruction. The main block of the table presents the data which is stored in the BIST ROM 400. There are twelve columns of data in the table. In the table, there is a bold horizontal line setting off the beginning and ending addresses of each algorithm. Thus there is a bold line below the address hex 3 which is the fourth instruction in the algorithm GROSS.

The four instructions in the algorithm GROSS are jump not test enable (jnte) to pause, write all cells zero, read all cells with expected data zero, and invert data and jump if not previously inverted (divnj). The Z1 is the label at which to jump.

Referring now to FIG. 29, there are two major types of instructions. The first type is the program control instruction. This type of instruction deals with the flow of the program. The program control instruction are introduced to control BIST operation. The second type is the array access instruction which control how the cells of the array are to be accessed and written to and/or read from. They are basically the same type of instruction usually found on a tester which are translated into BIST ROM format. An instruction that reads back a pattern from the array (220) is an e.,ample of a array access instruction.

The instruction is divided into two parts. The first six bits of an instruction defines the actions to be taken and the last six bits is the data associated with the instruction.

For an array access instruction such as read whole array, the first six bits define the type of array access, whether it is a write or a read or both, whether the full array, only the rows, or the columns are accessed. To read from the whole array, Read (bit11), X(bit9) and Y(bit8) are set to 1. The last six bits of the instruction provides information on how the whole array is read including the timing sets to be used (Tset0, Tset1), the data values (ED) and pattern ( ) and whether the address is to be incremented or decremented.

For a program control instruction such as the 'test enable' instruction. The four most significant bits are '0', Bit7 and Bit6 determines the program control type. The last six bits provides the address to be jumped to if indeed the decision is made to jump.

There is an unconditional jump instruction. '110011' for the most significant 6 bits, and the address to jump to for the 6 least significant bits.

The last instruction in the ROM, see FIG. 28, is an idle instruction to signal the end of BIST operation. The last six bits of this instruction holds the revision number of the current 256 M.

There are many possible combinations of instructions that can be programmed with the current circuits. If a new algorithm is needed for a BIST operation. It can be included by simply reprogramming the ROM. Combinations of options available to make up an instruction are as follows:

| Timing sets | Access mode | Addressing | Array size | '0' or '1' | Data Pattern |
| --- | --- | --- | --- | --- | --- |
| TSETA | READ | INC | FULLA | PATTERN0 | CKBD |
| TSETB | WRITE | DEC | ROW | PATTERN1 | ALTERNATE |
| TSETC | RMW | | COL | | |

Referring now to FIGS. 30 and 31, there is shown logic schematics for a ROM logic circuit 410. As each of the instructions is read out of the BIST ROM 400, the data is applied to the input of the ROM logic circuit 410, which is a combinational logic circuit that decodes the twelve bits of data of each instruction word. Output signals from the ROM logic circuit 410 are applied to the data inputs of a ROM register circuit 420 where the data are stored for the duration required to complete execution of the instruction.

When the built-in self-test arrangement 60 is put into the active self-test mode, the BIST program counter 360 is reset. This initial state of the program counter 360 is decoded through BIST ROM address decoder 370 to produce a row address signal for the BIST ROM 400. After the row address is applied and in response to a clock signal, the data from the selected row of the BIST ROM 400 is read out. All of the data read out from the selected row is applied to the input of the ROM logic circuit 410.

FIGS. 30 and 31 present an exemplary logic schematic diagram of the ROM logic circuit 410 that performs desired combinational logic functions on the row of data applied from the selected row of the BIST ROM 400. The circuit 410 produces a group of output signals resulting from logical processing through the circuit 410. This group of output signals from the circuit are applied in parallel to and are stored in the ROM register 420, which is arranged to forward them by way of a BIST data bus 421 to the pass/fail comparator circuit 430, by way of a group of leads 422 to the BIST timing generator 440, and by way of a program counter input bus 423 to the BIST program counter 360.

Referring now to FIG. 31, there is shown a logic schematic of an exemplary ROM register circuit 420. The data applied onto the program counter input bus 423 is accepted by the program counter 360 only when a program control instruction is being executed. Data applied to the BIST timing generator controls generation of self-test signals, such as B_RAS_, B_CAS_ and B_WE_, which perform the functions of their similarly named control signals RAS_, CAS_, and WE_, used by a microprocessor to access the memory during normal operation. Signals, applied by way of the BIST data bus 421 to the pass/fail comparator circuit 430, include memory access instructions and a data bit.

Figure 44:
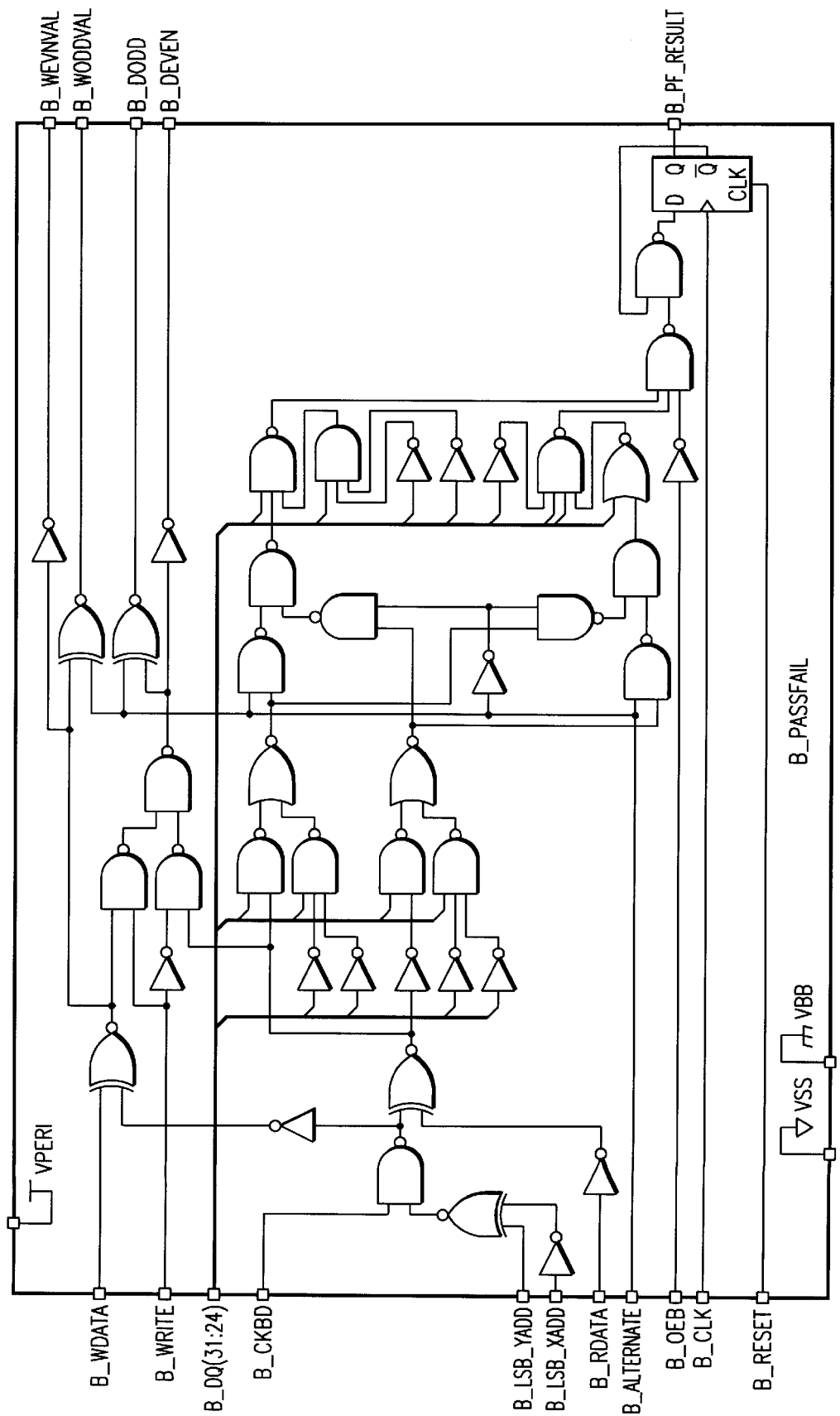
FIG. 44 shows a schematic of Pass Fail detection circuitry.
Figure 45A:
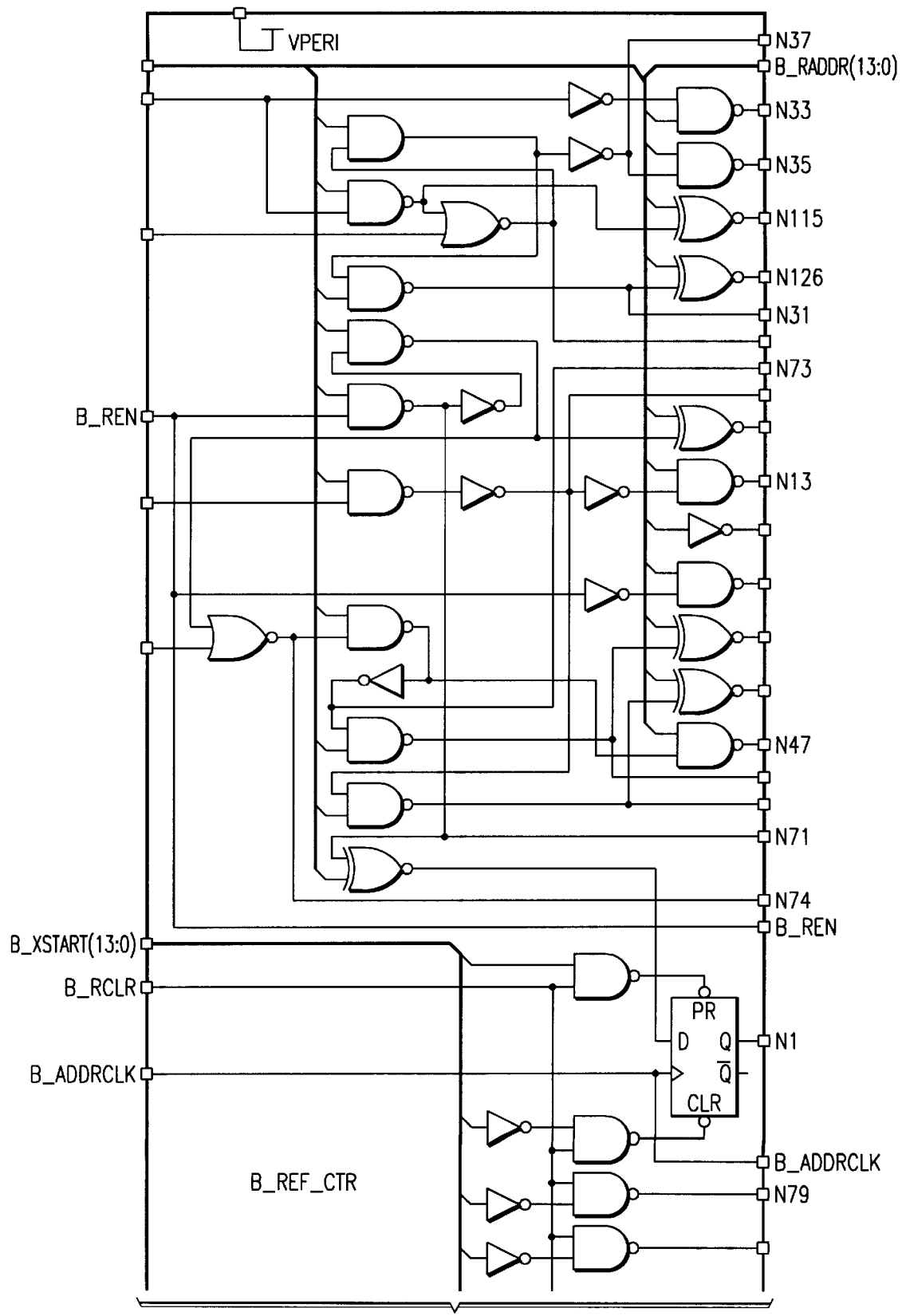
FIG. 45 shows a schematic of the Refresh Counter.
Figure 45B:
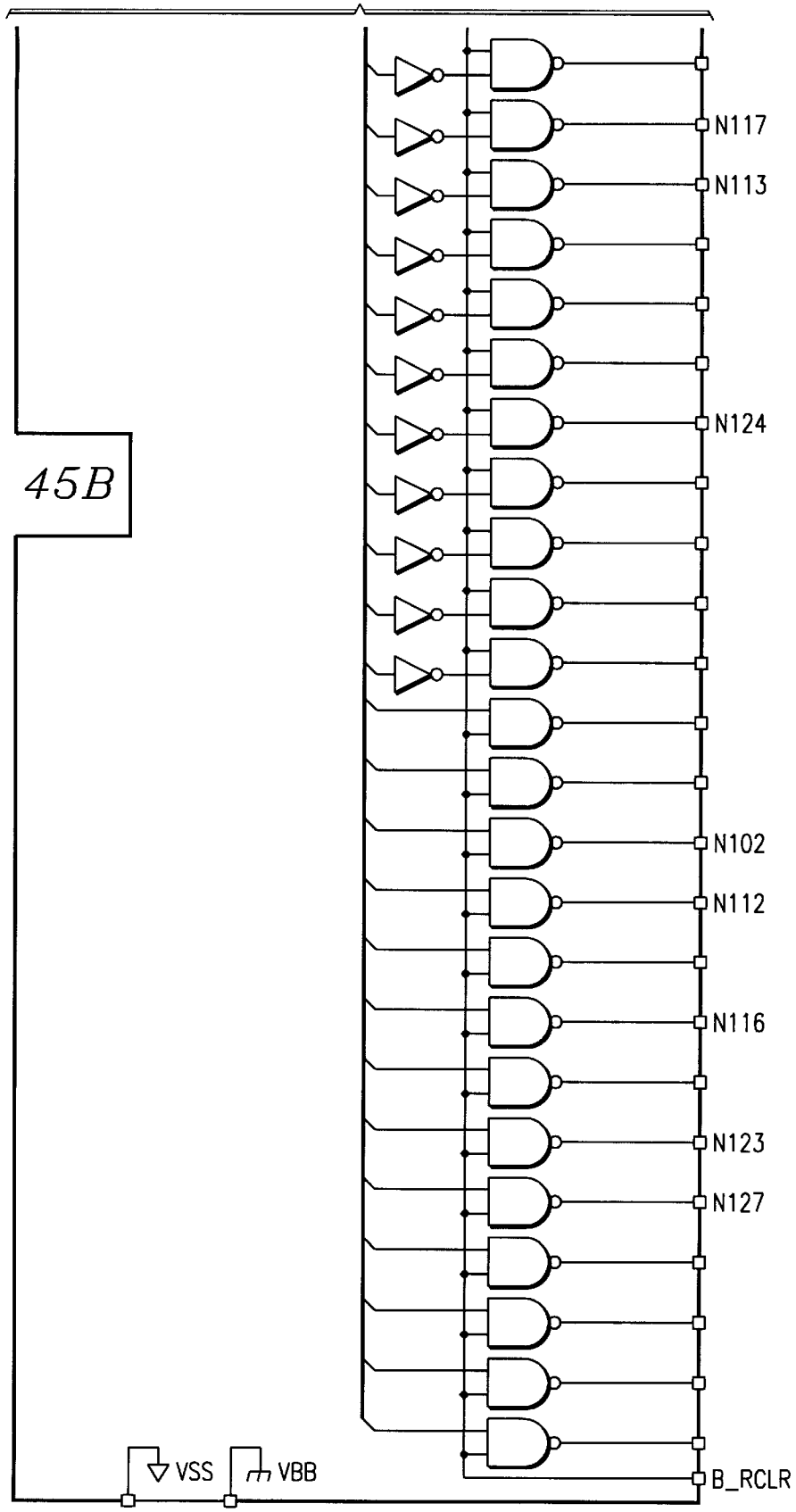
Figure 46A:
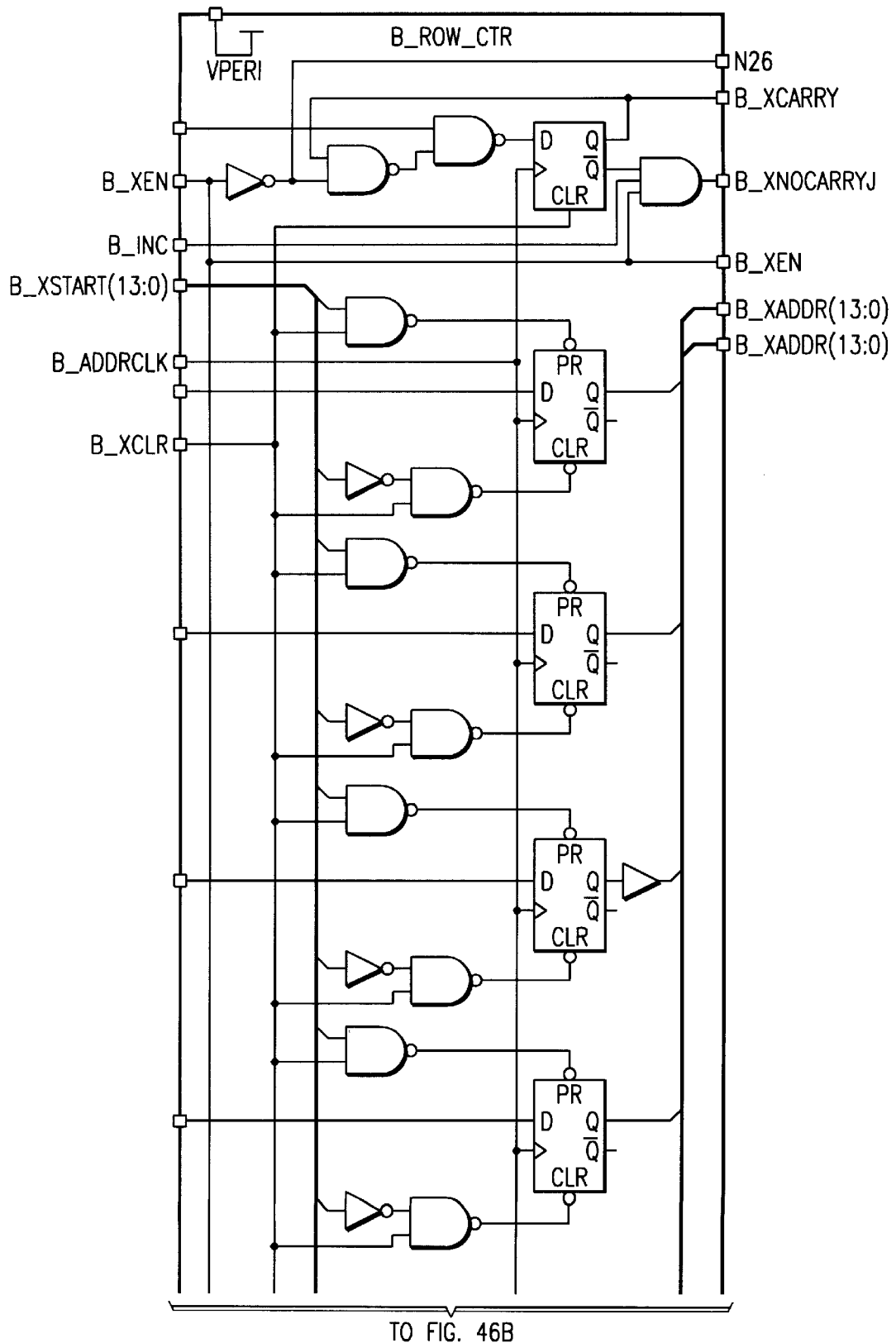
FIG. 46 shows a schematic of the Row Counter.
Figure 46B:
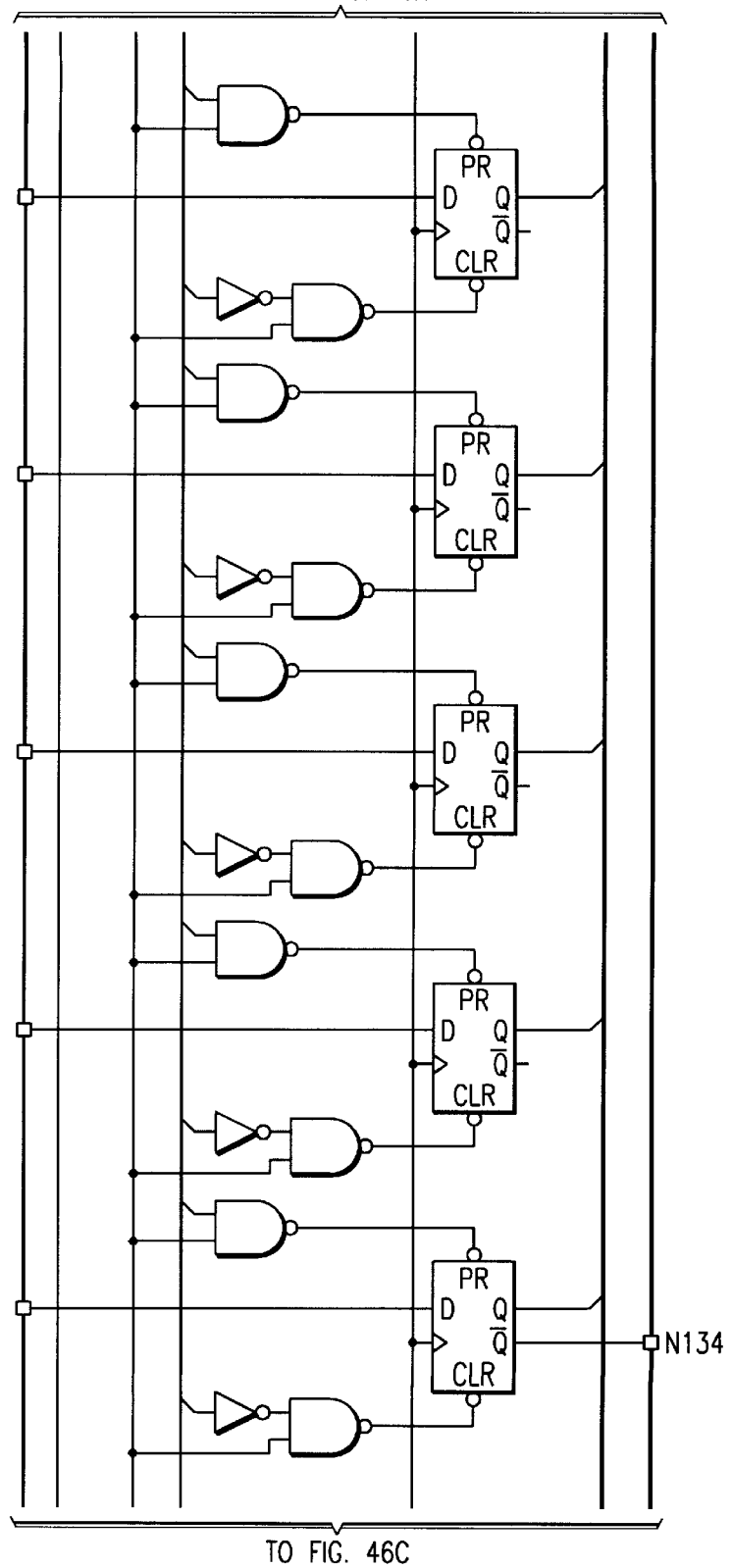
Figure 46C:
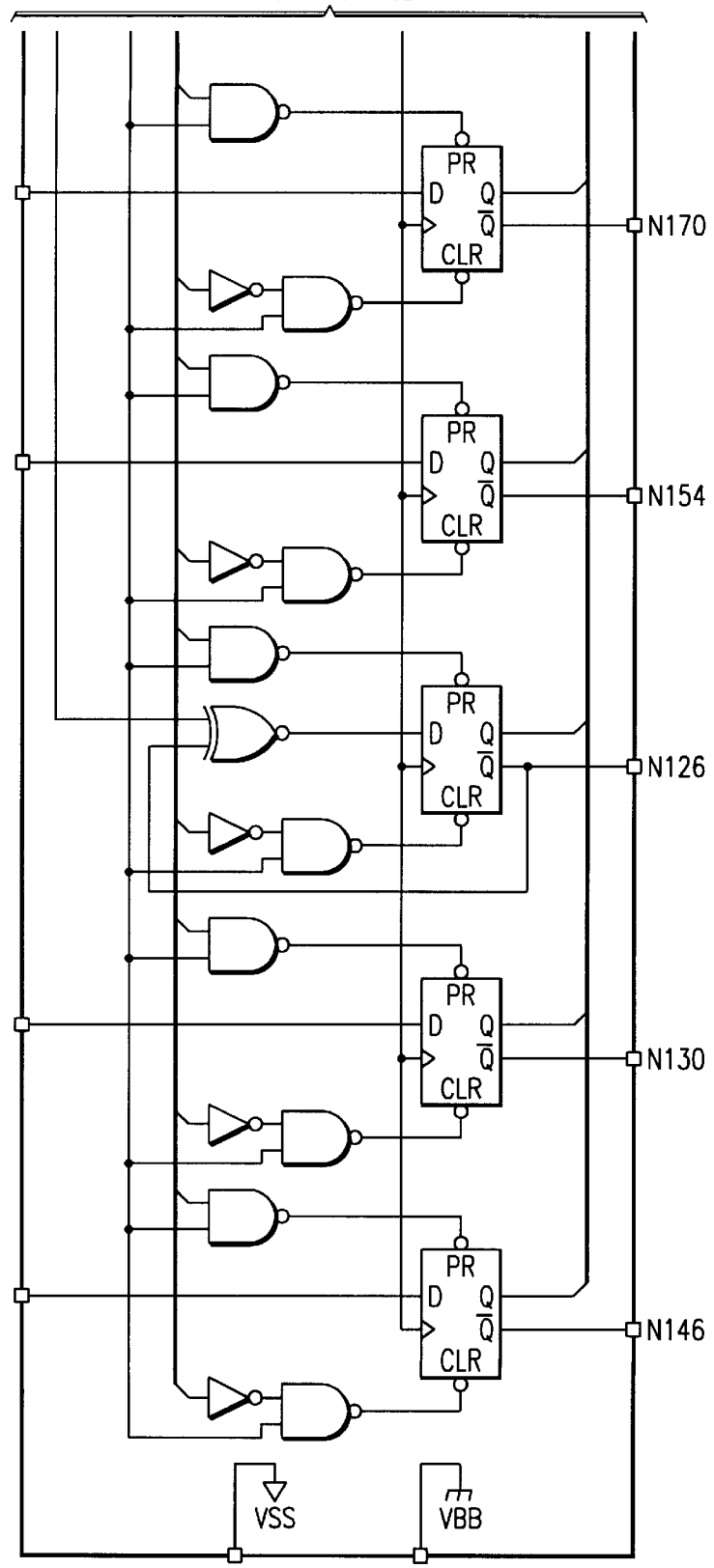
Figure 47A:
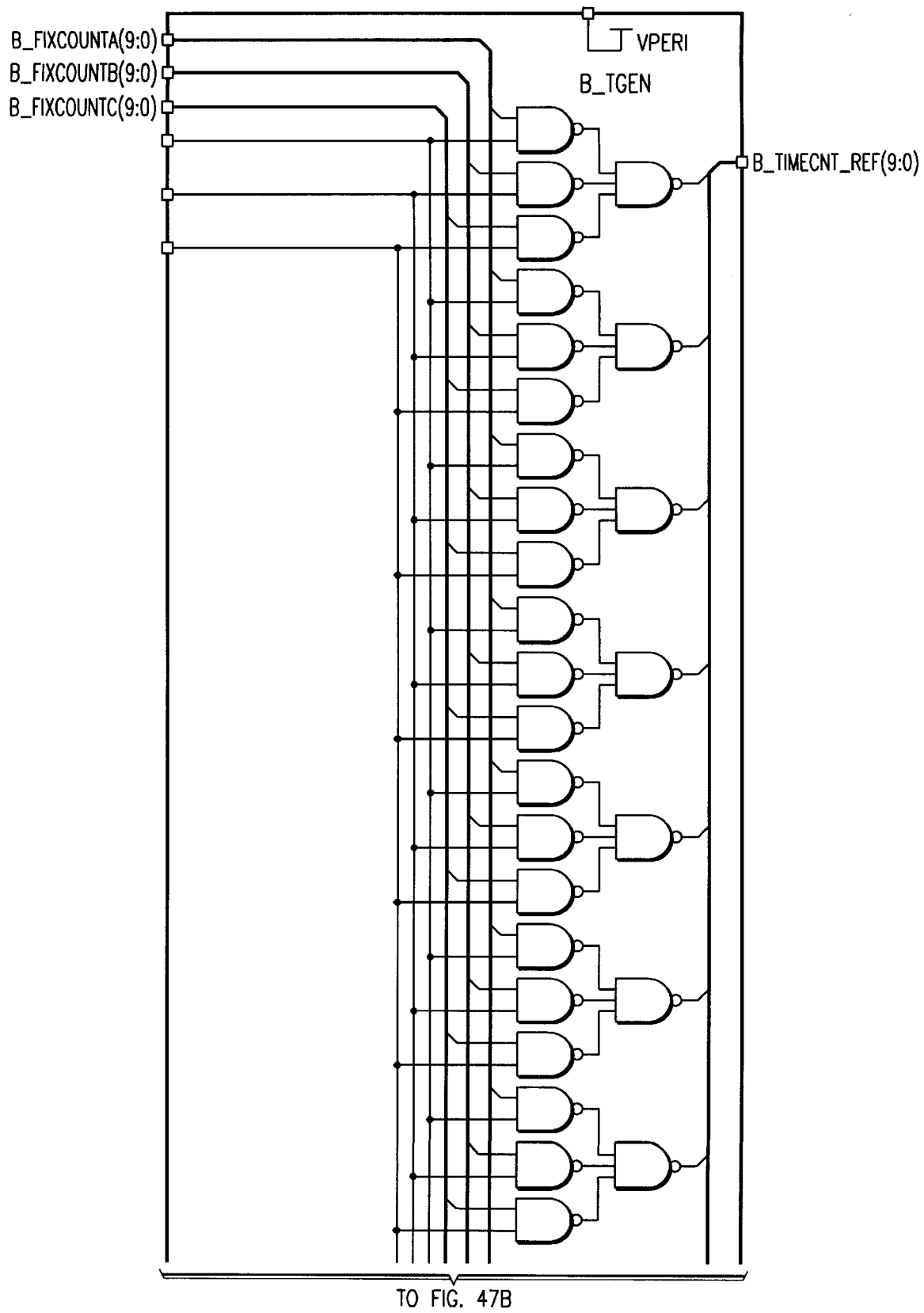
FIG. 47 shows a schematic of the Timing Generator Sheet 1.
Figure 47B:
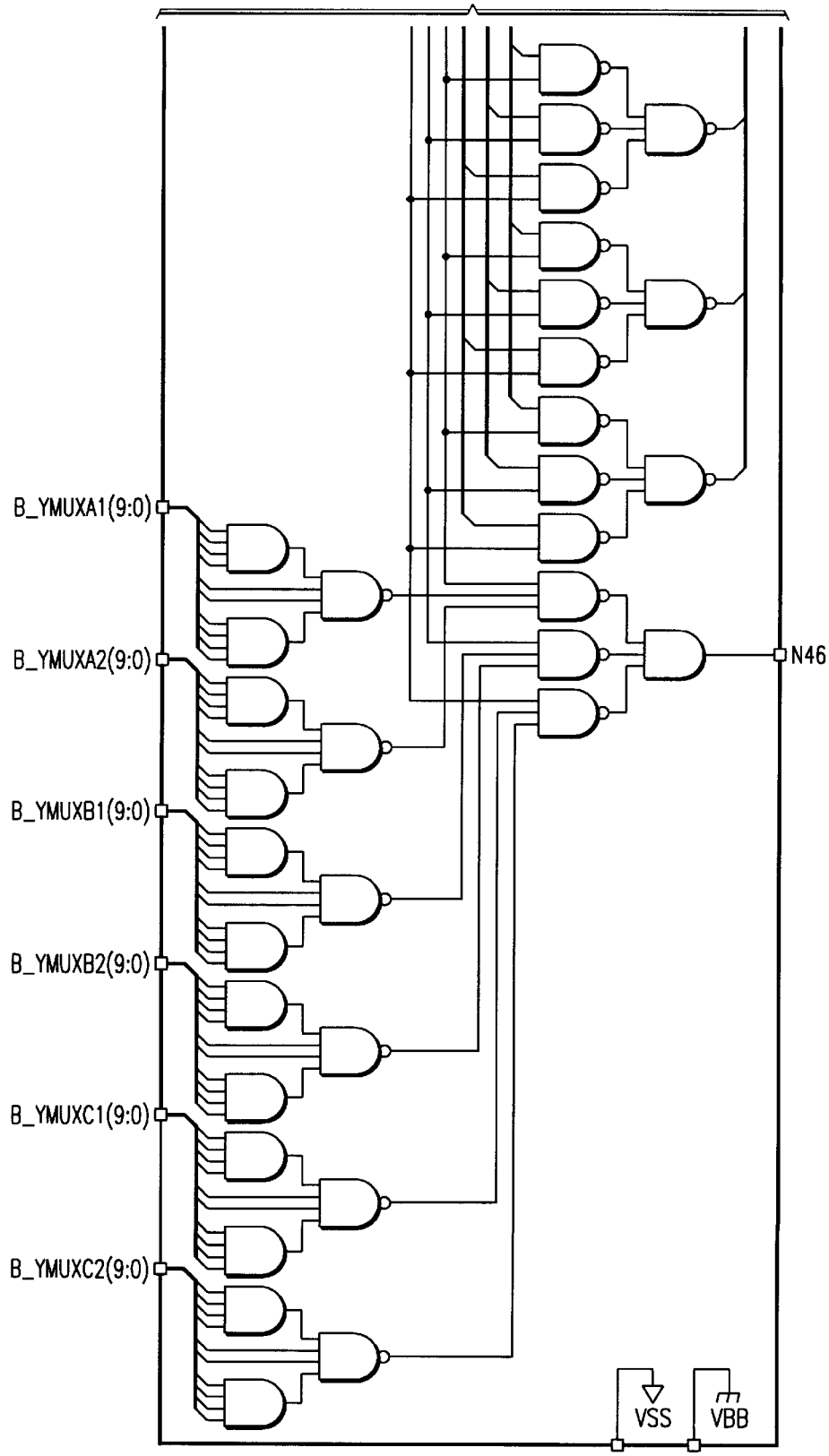
Figure 48A:
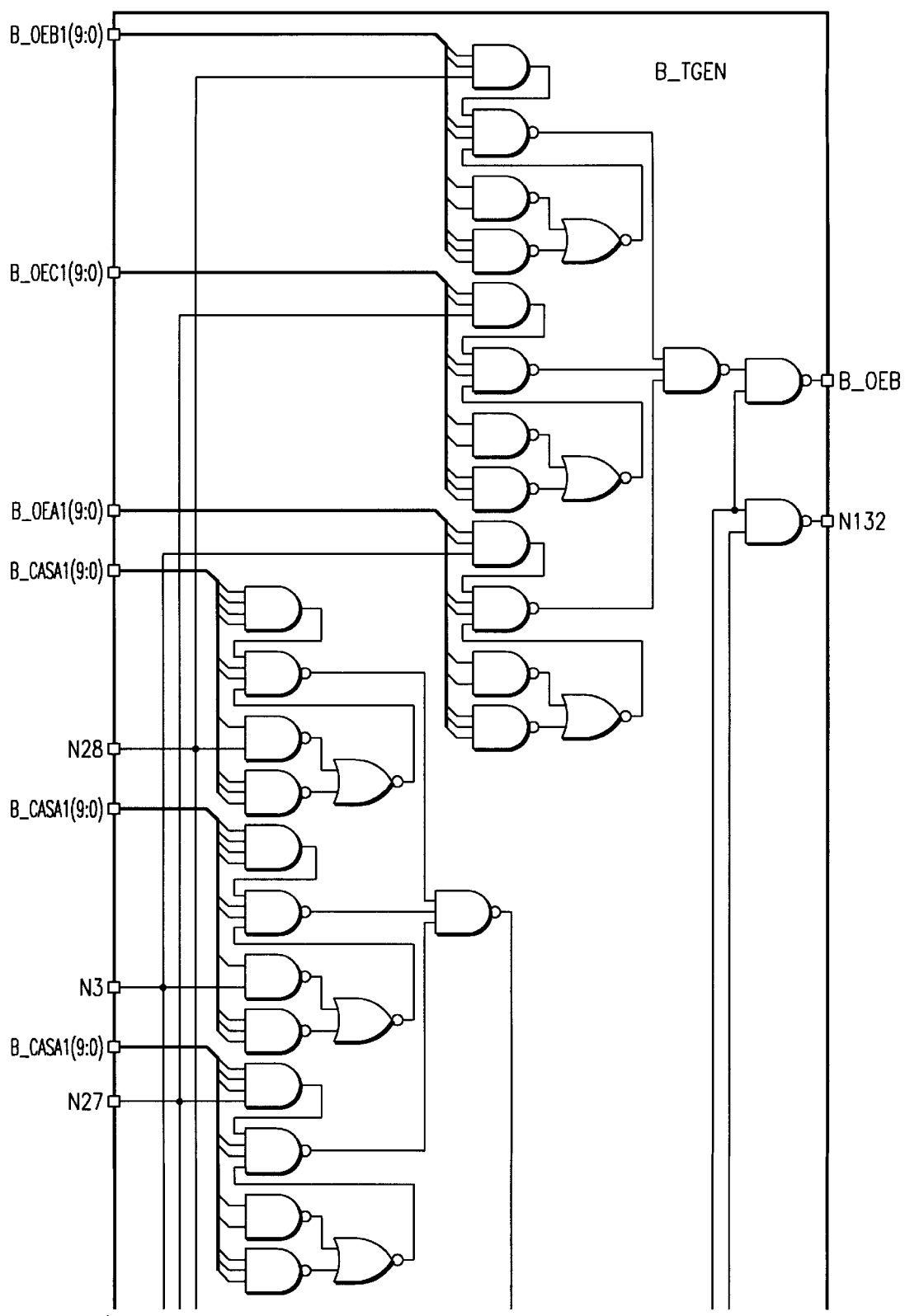
FIG. 48 shows a schematic of the Timing Generator Sheet 2.
Figure 48B:
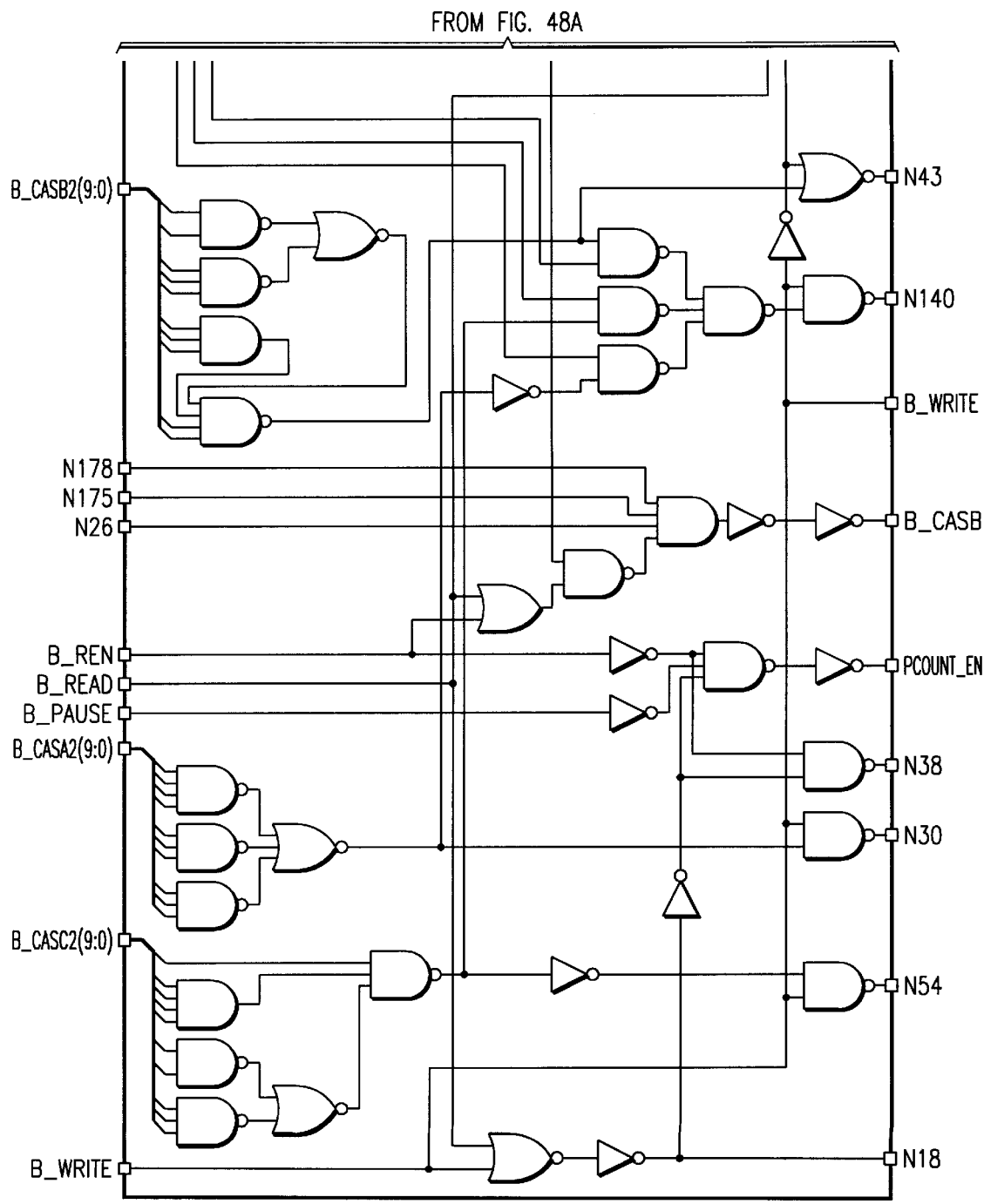
Figure 49B:
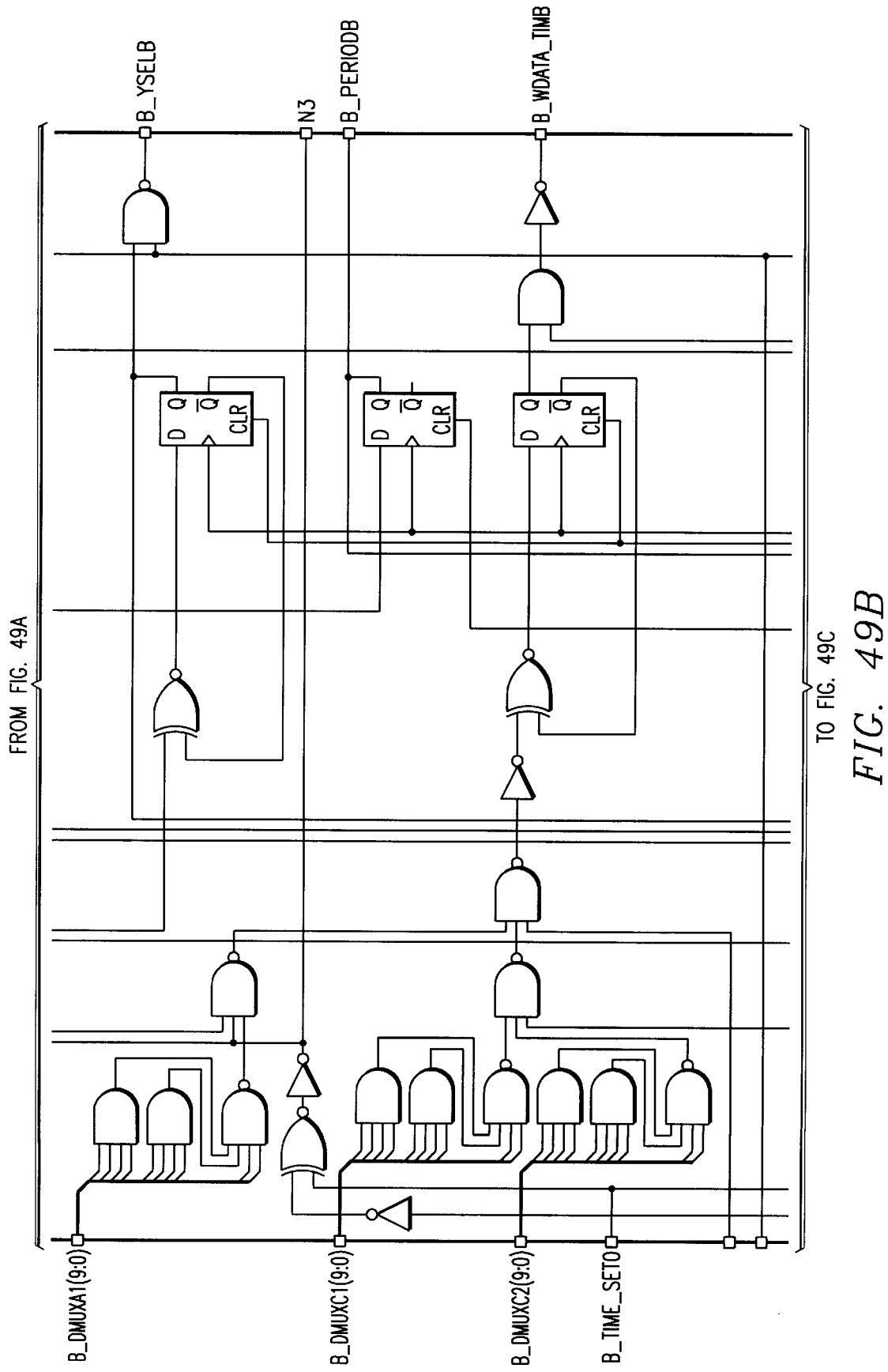
FIG. 49 shows a schematic of the Timing Generator Sheet 3.
Figure 49C:
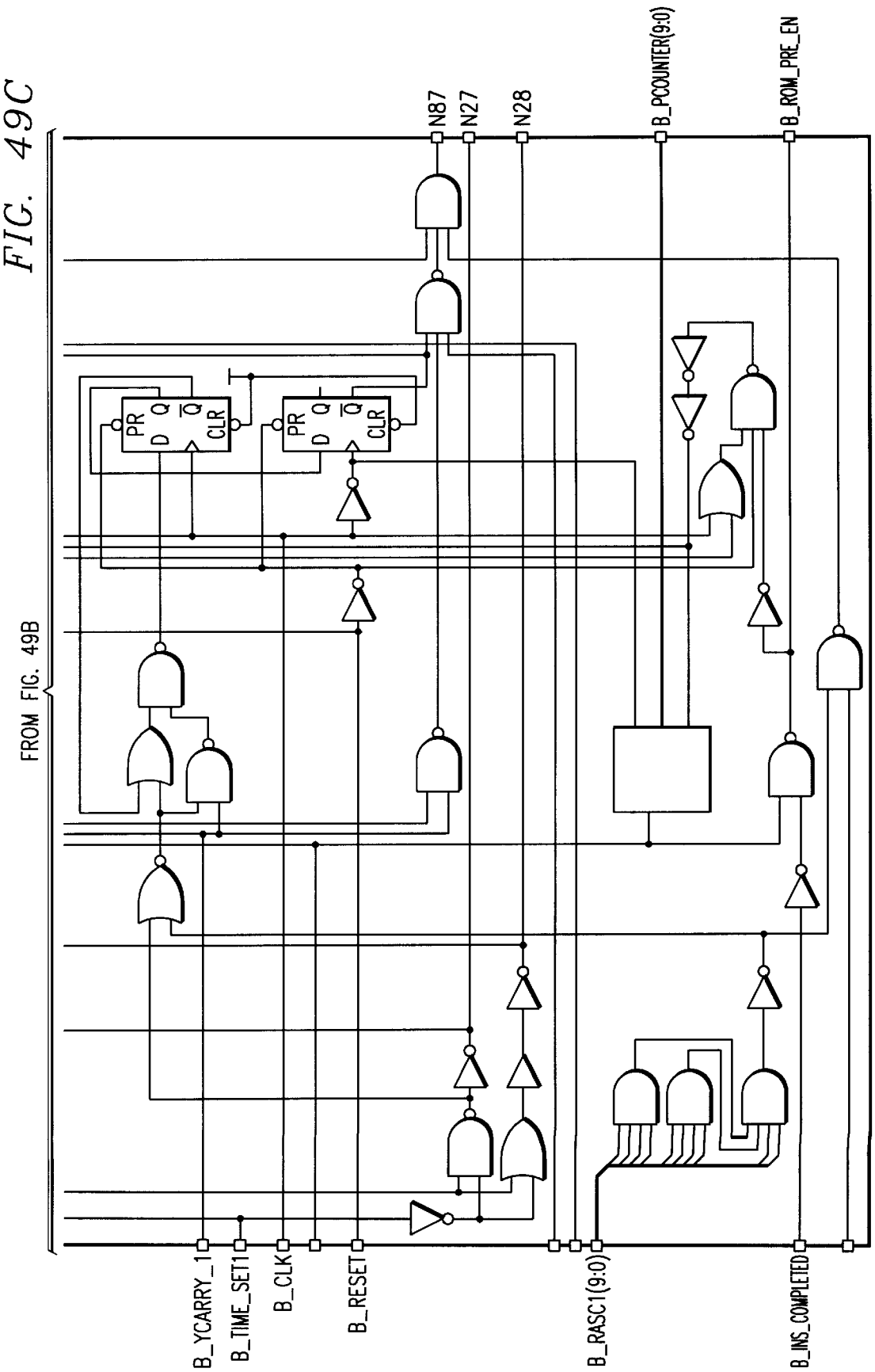
Figure 50:
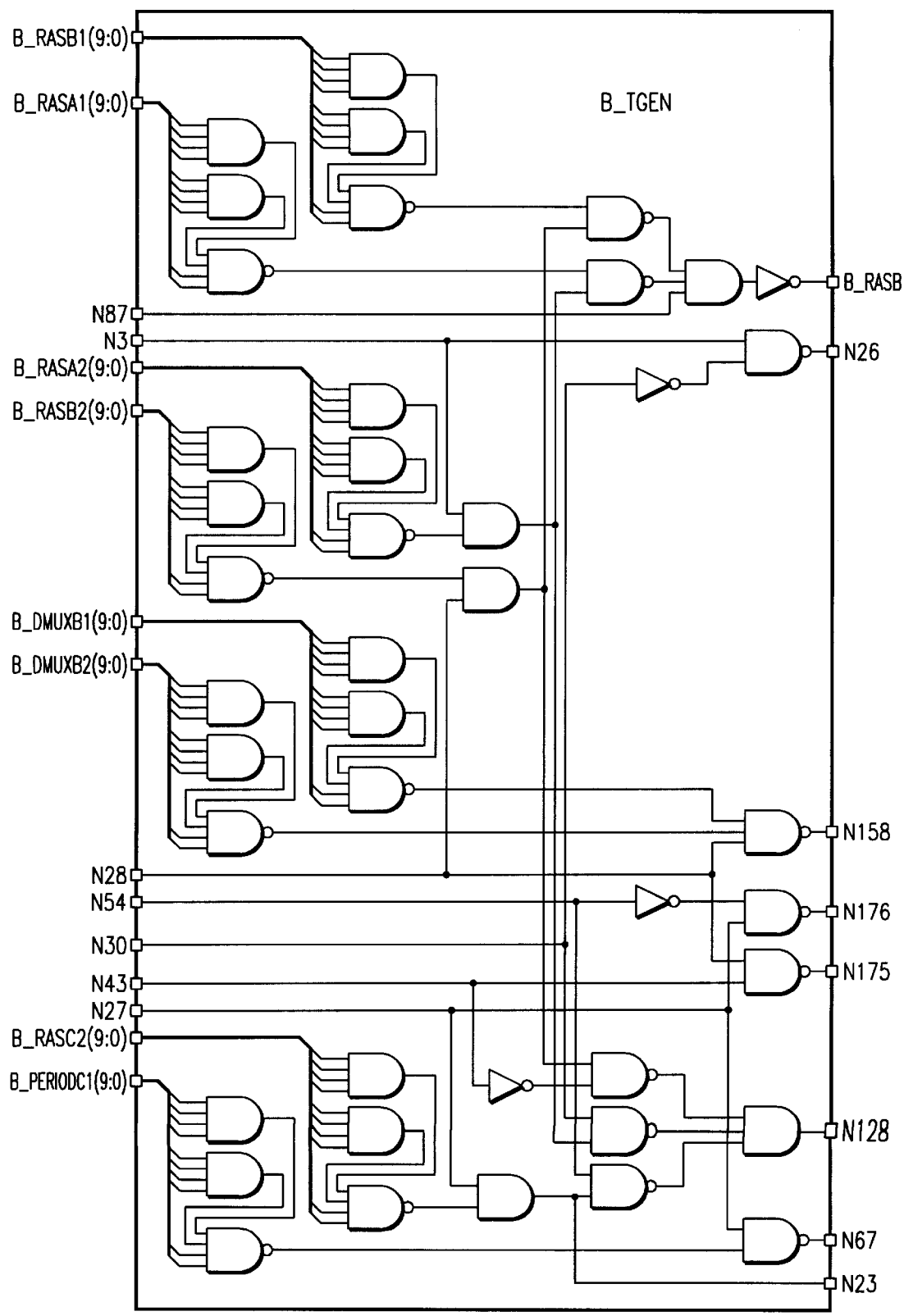
FIG. 50 shows a schematic of the Timing Generator Sheet 4.
Figure 51A:
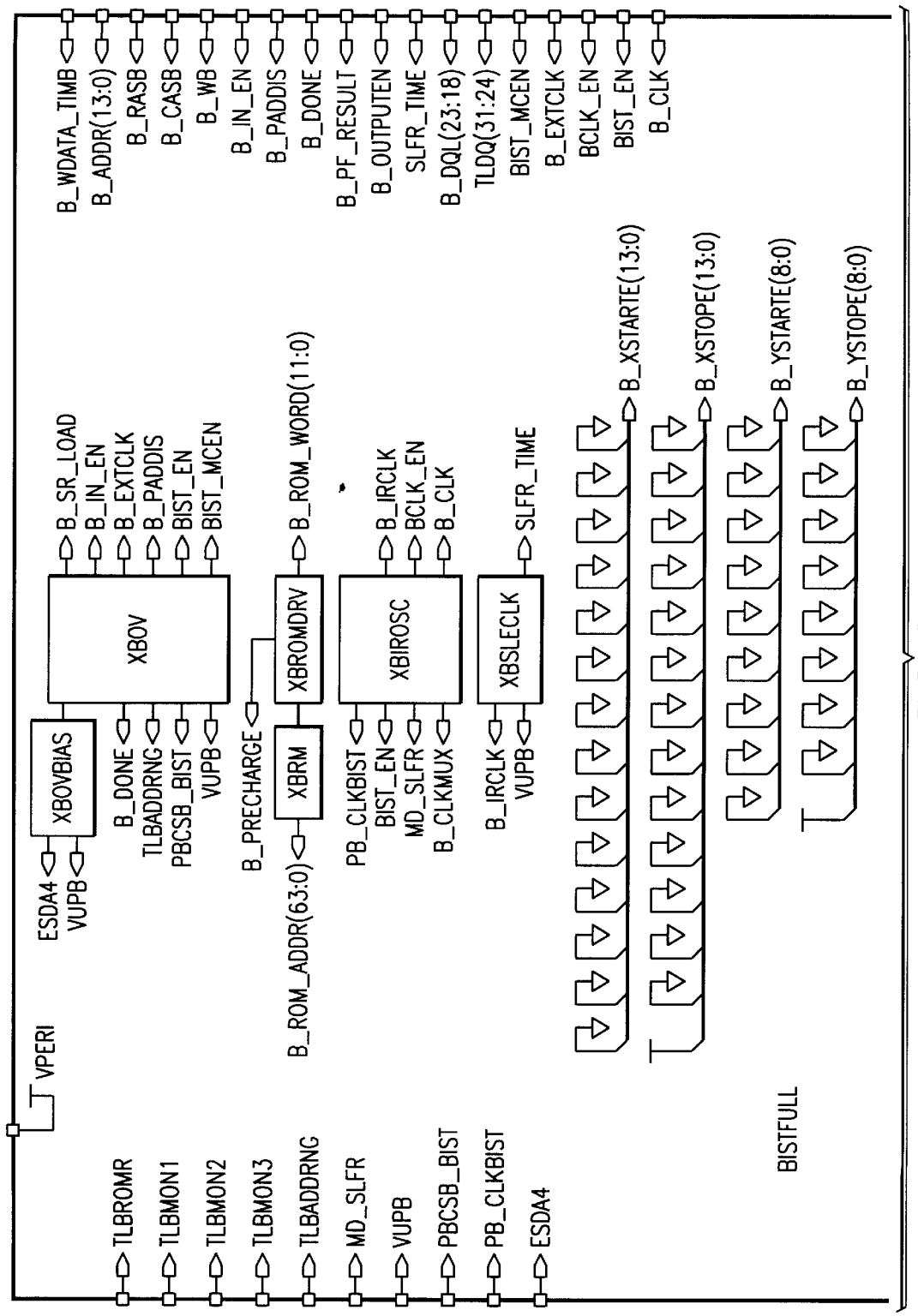
FIG. 51 shows a schematic of the full BIST logic.
Figure 51B:
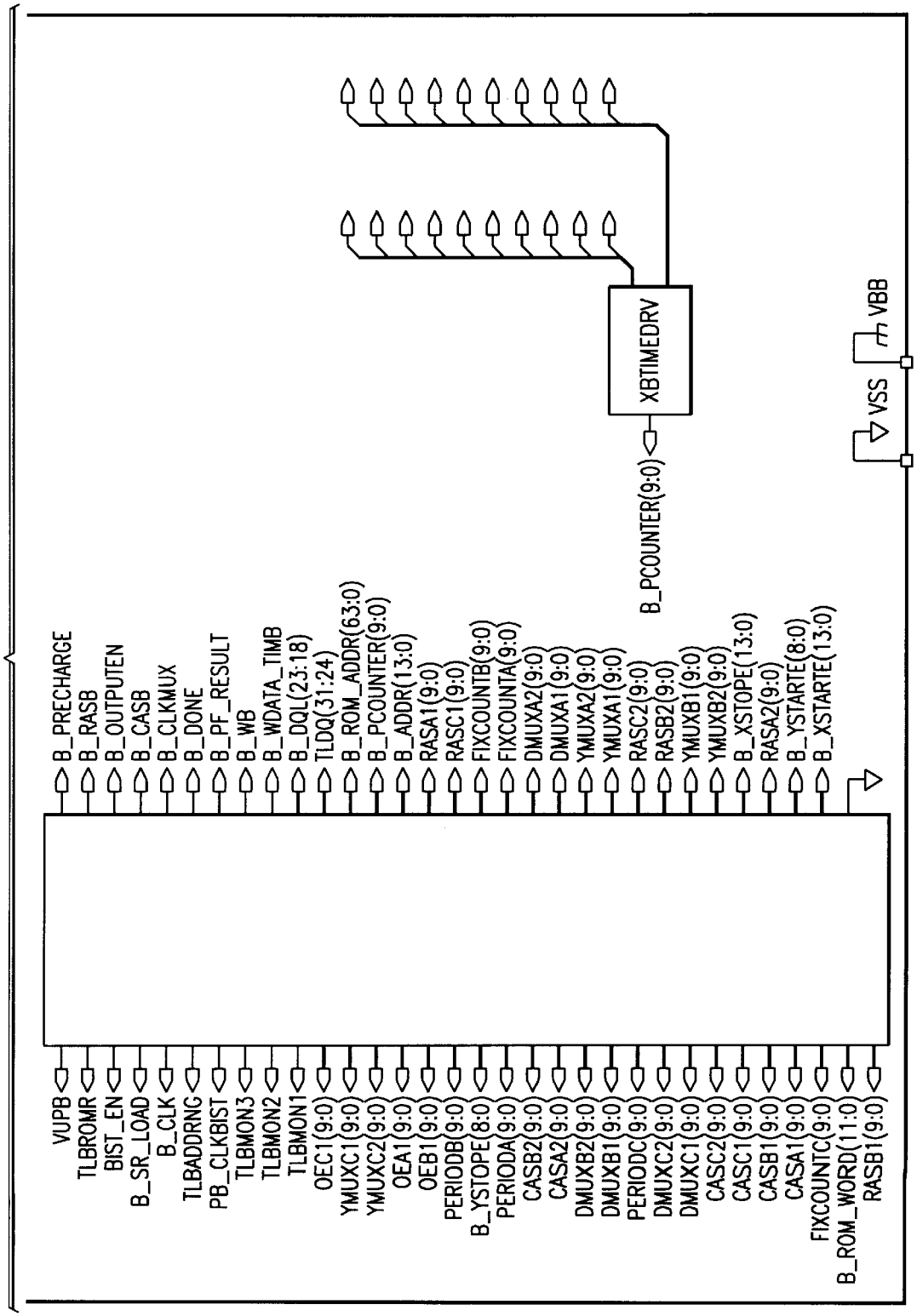
Figure 52A:
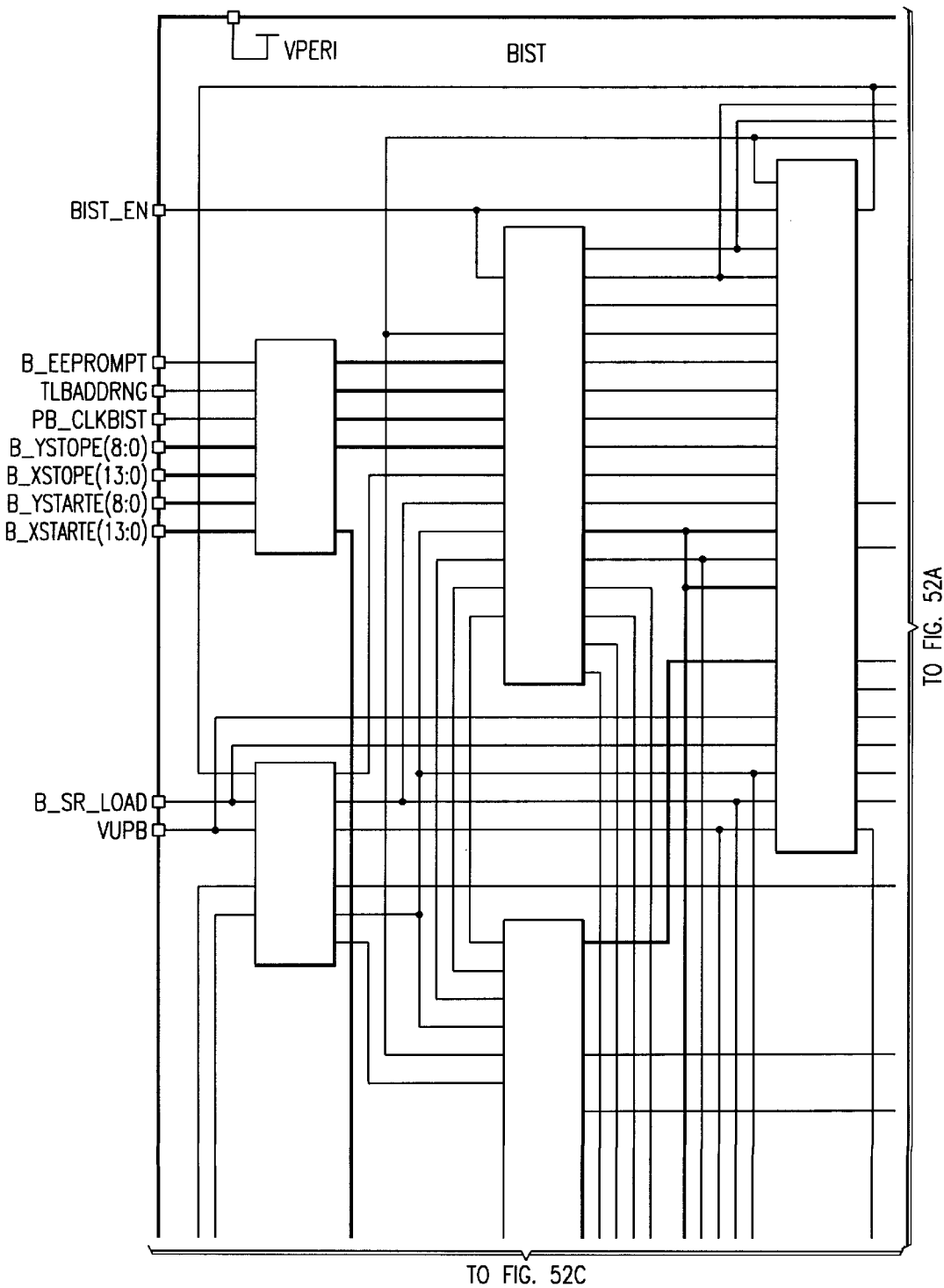
FIG. 52 shows a schematic of the full BIST functional logic.
Figure 52B:
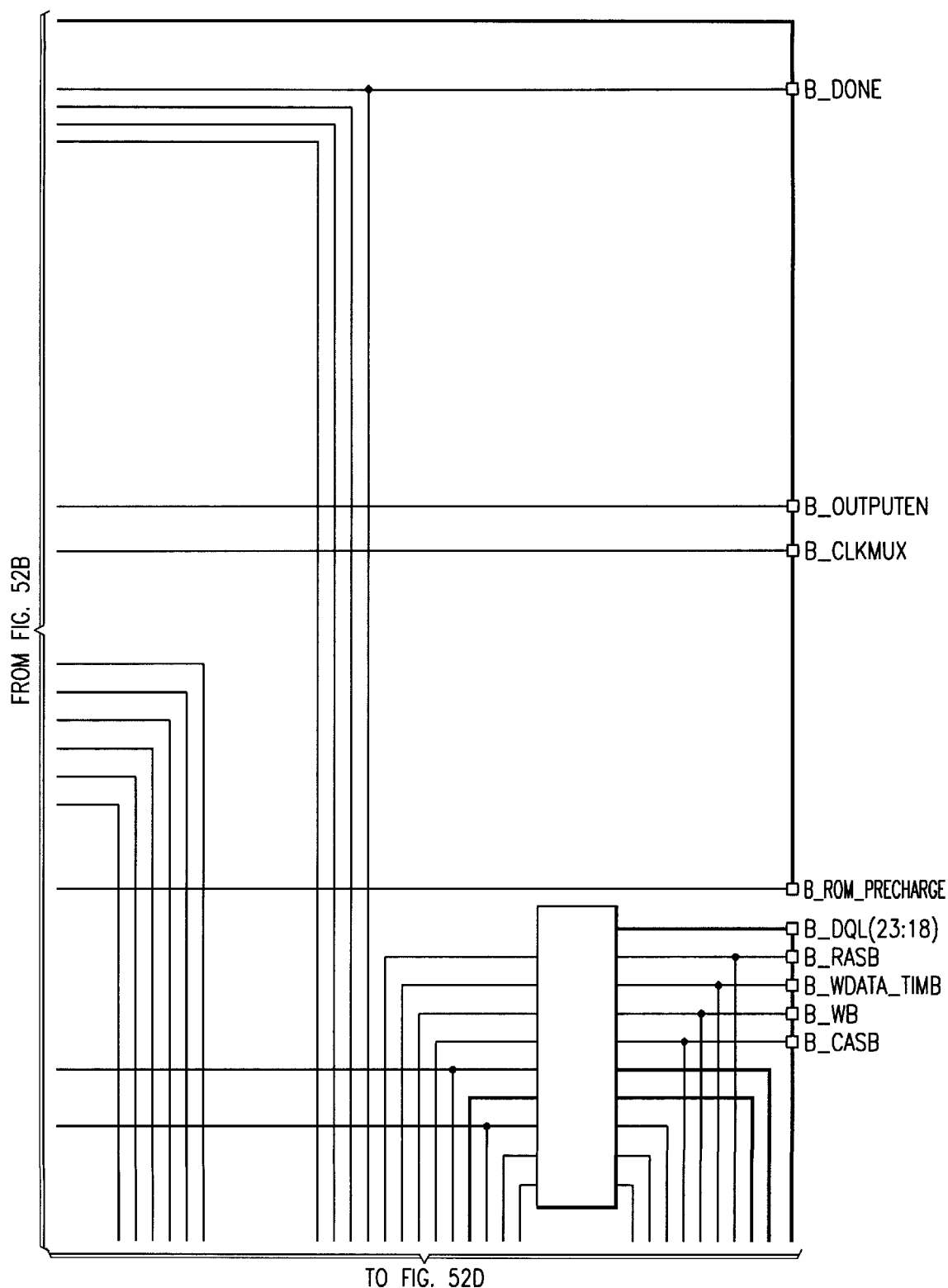
Figure 52C:
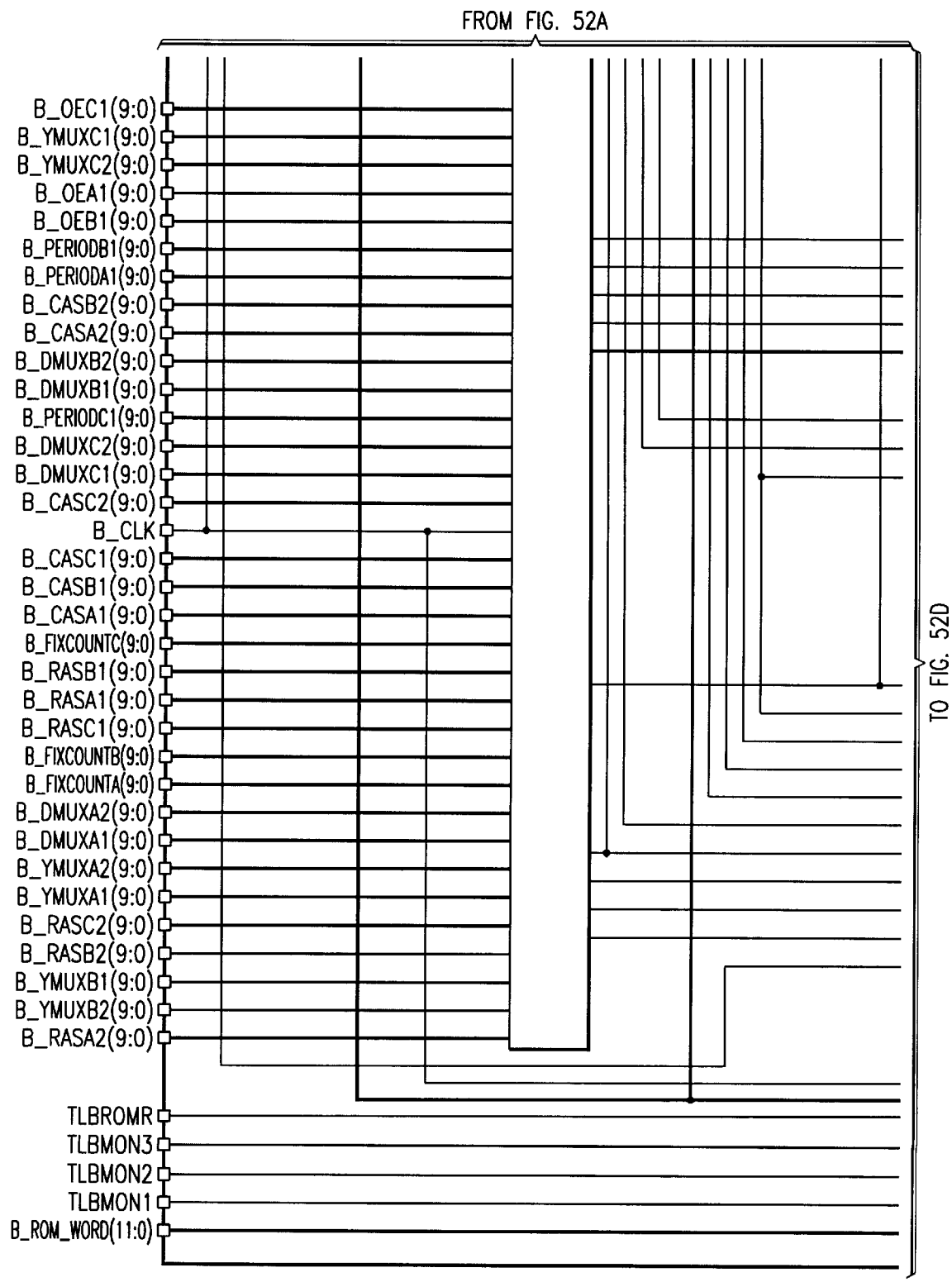
Figure 52D:
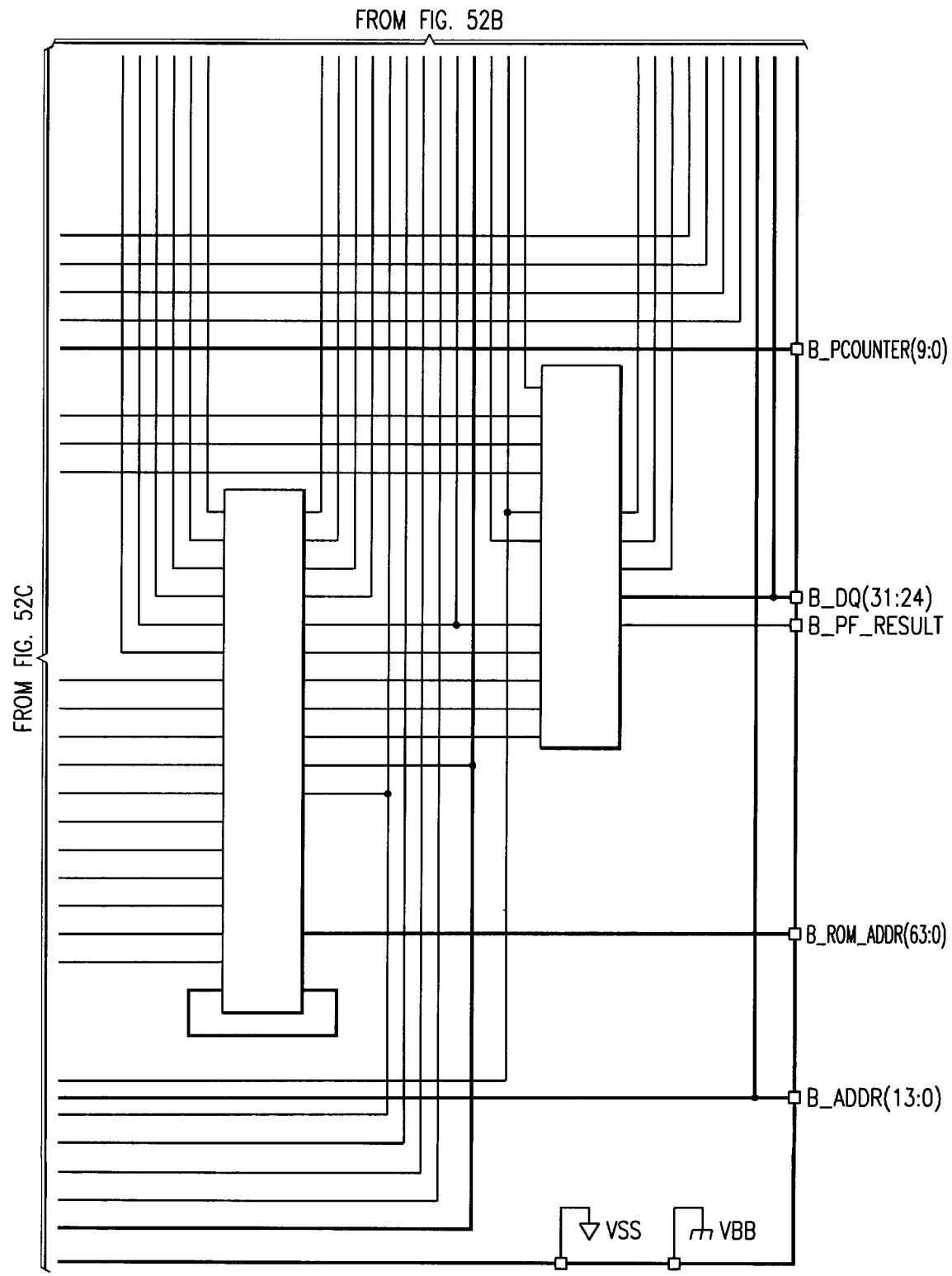
Figure 53:
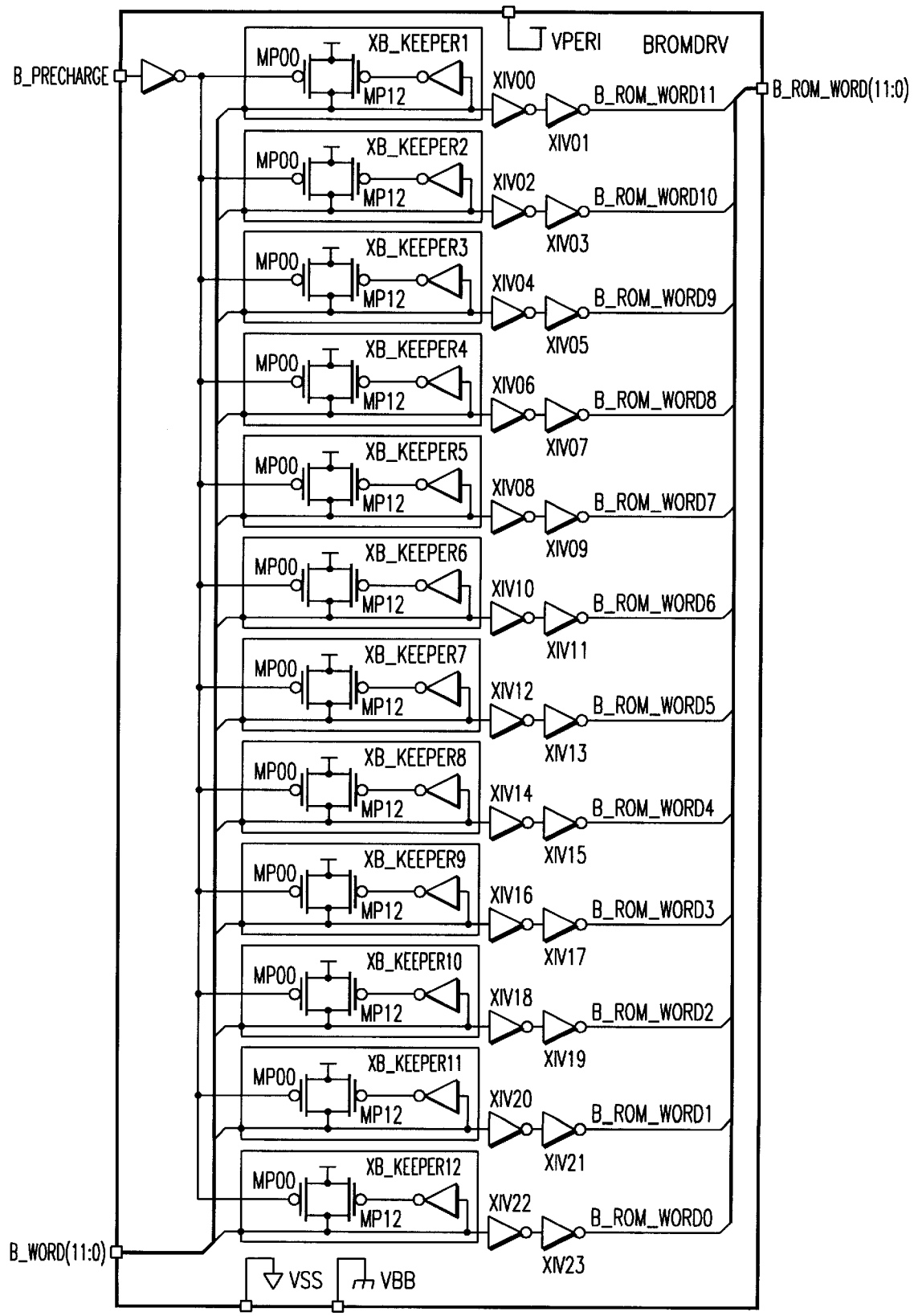
FIG. 53 shows a schematic of the ROM Driver logic.
Figure 54:
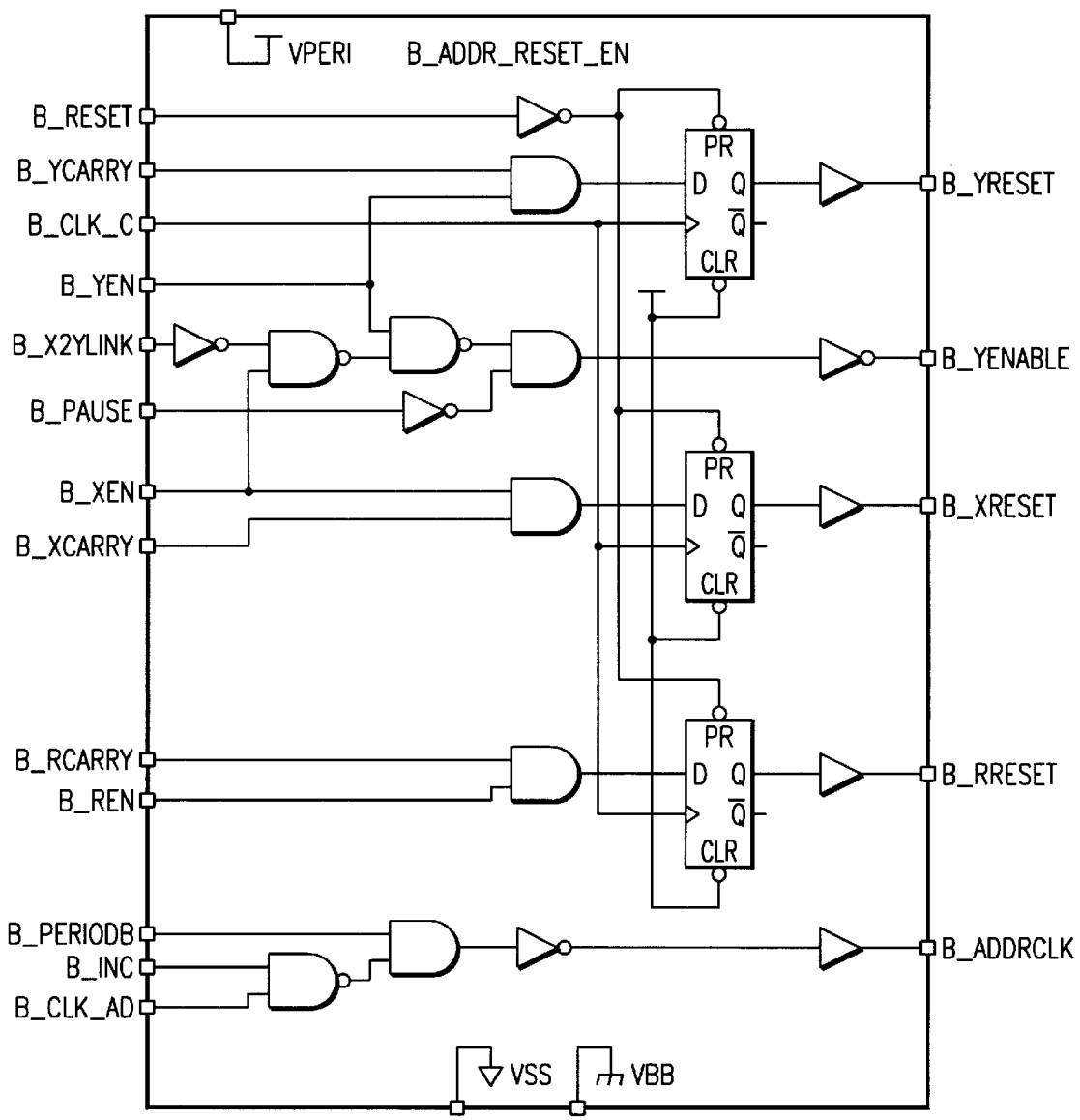
FIG. 54 shows a schematic of the Address Reset Enable.
Figure 55A:
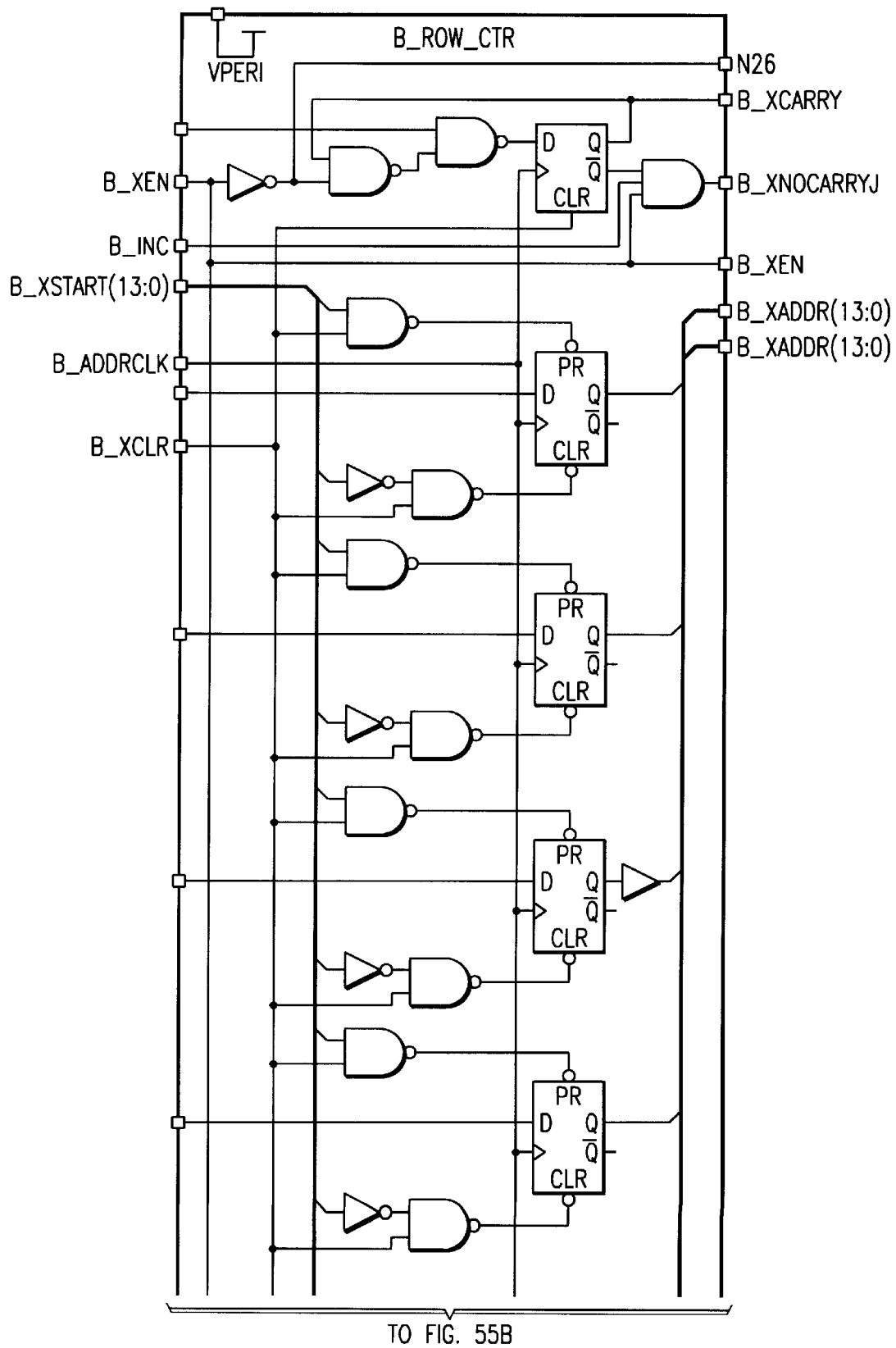
FIG. 55 shows a schematic of the Row Counter.
Figure 55B:
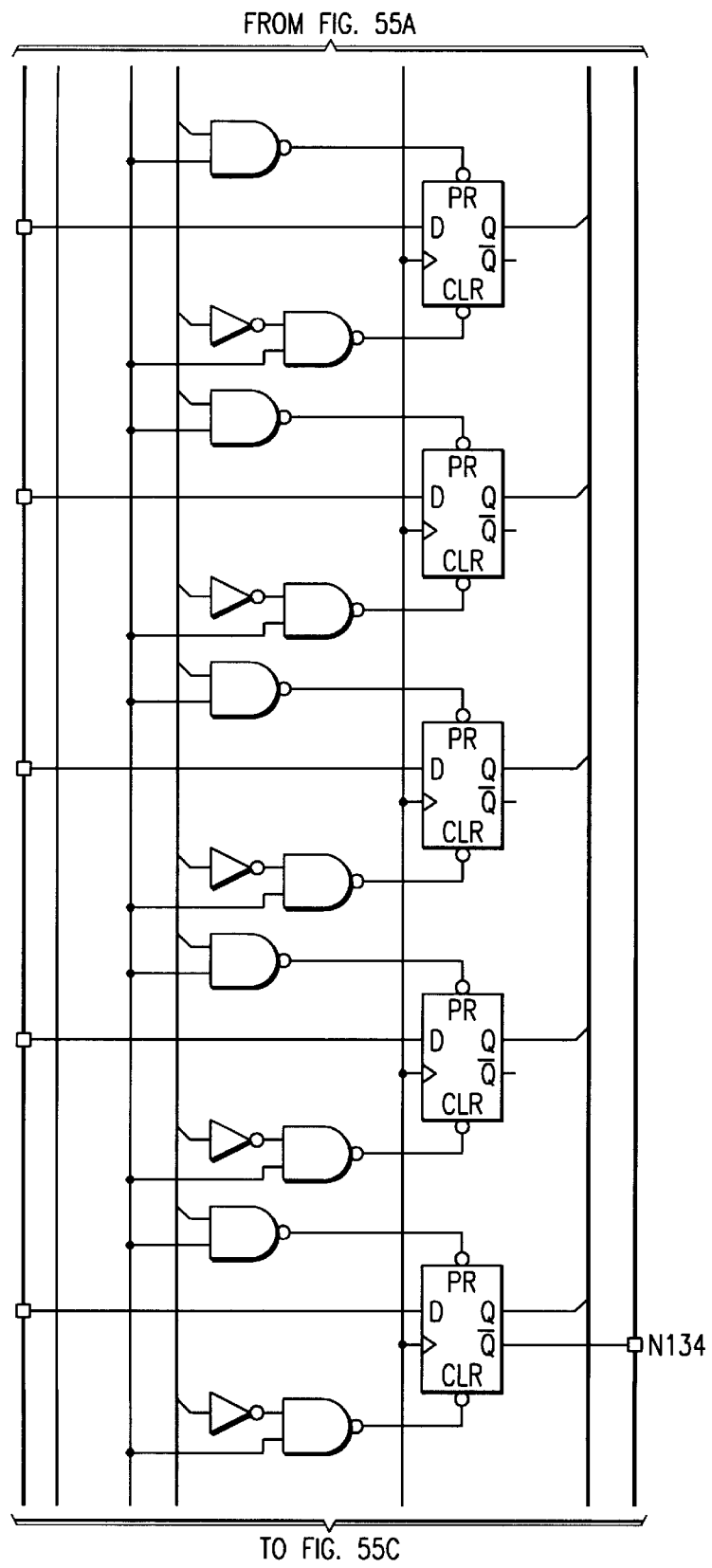
Figure 55C:
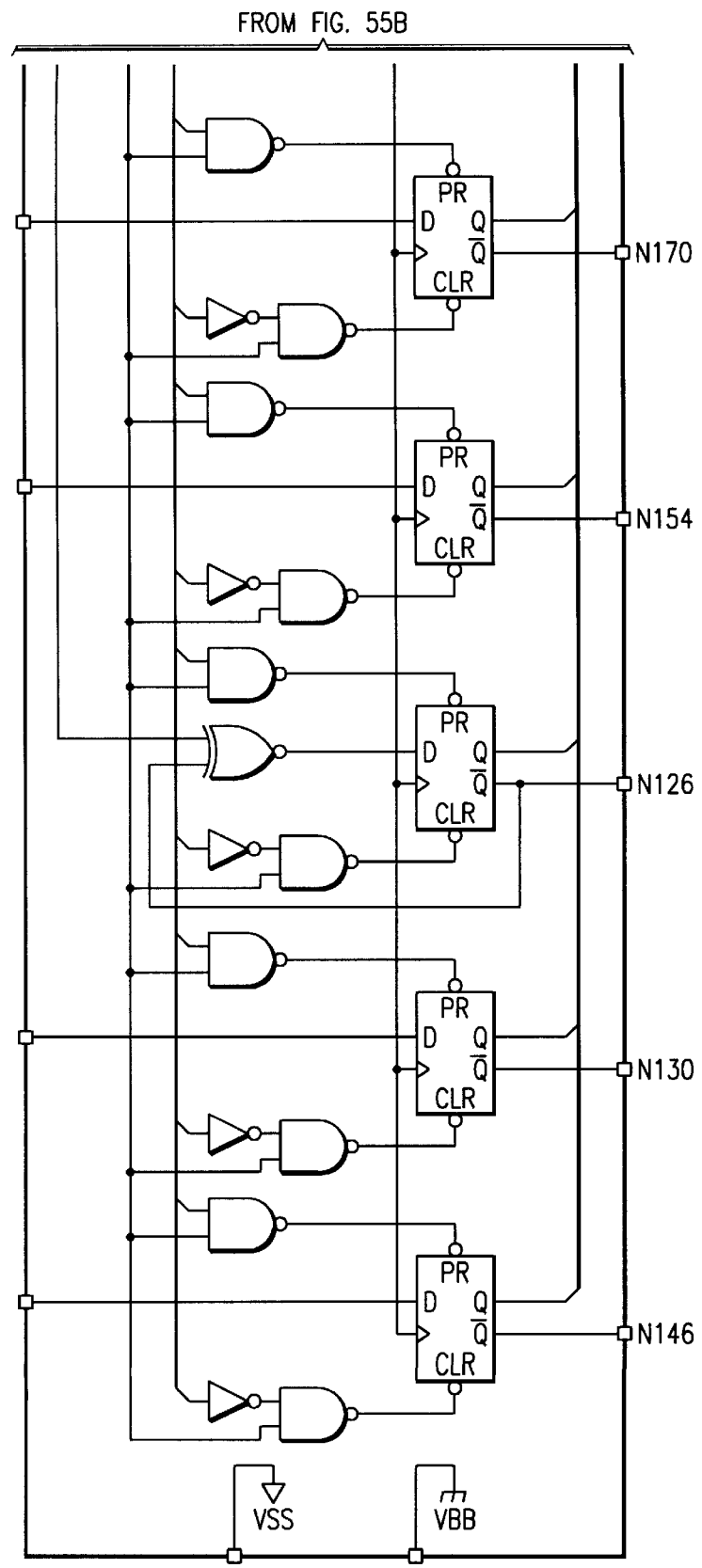
Figure 56A:
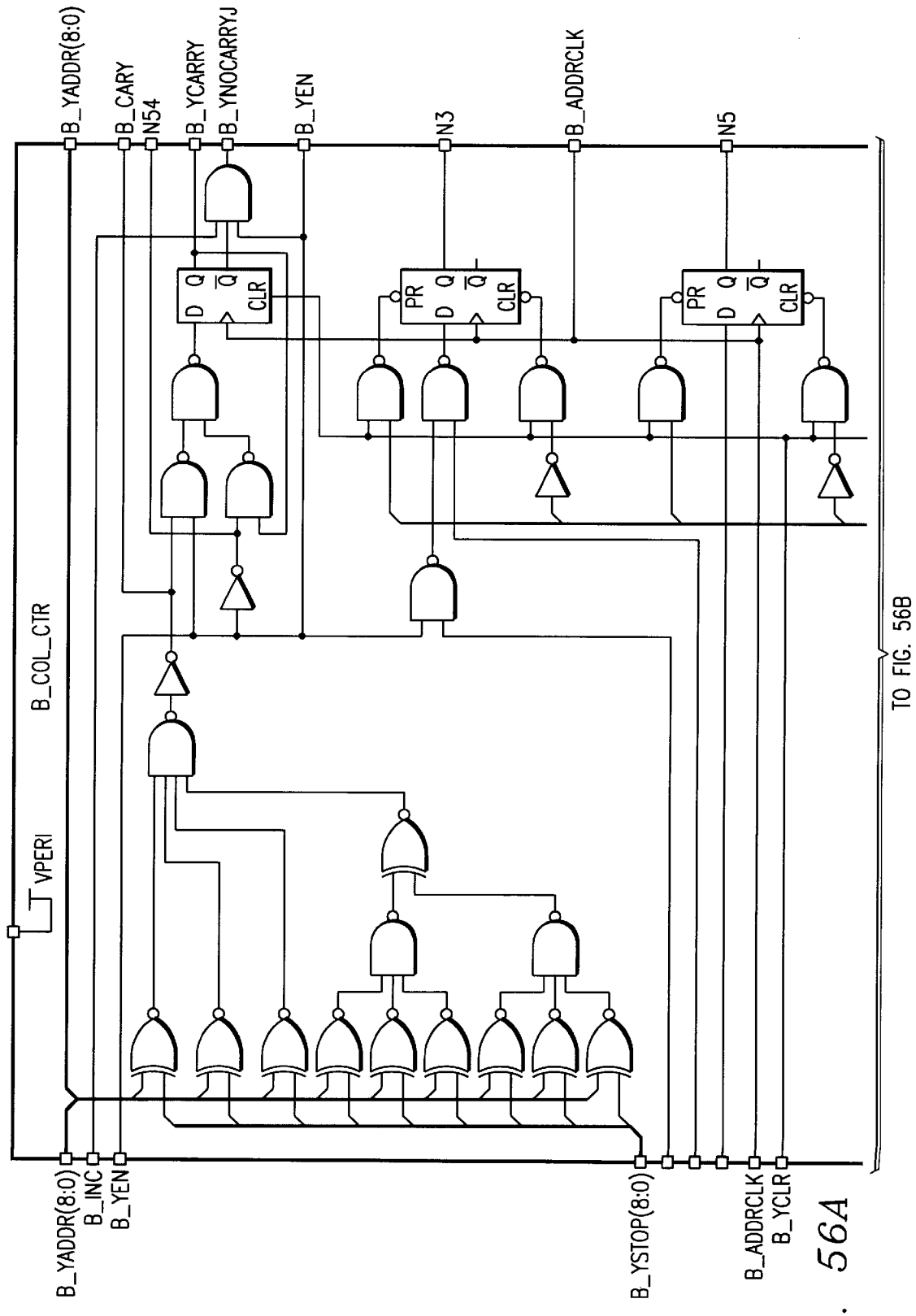
FIG. 56 shows a schematic of the Column Counter.
Figure 56B:
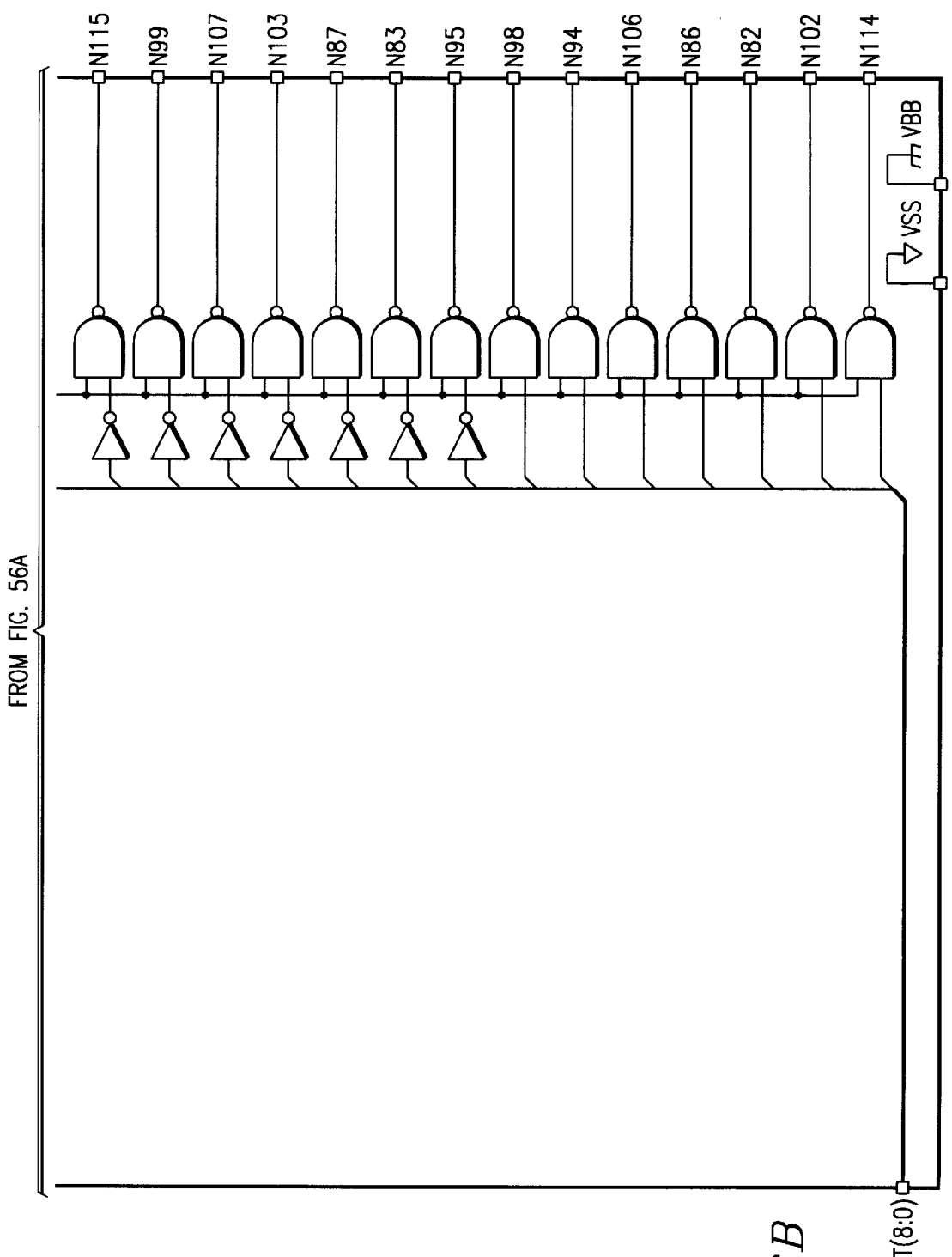
Figure 57A:
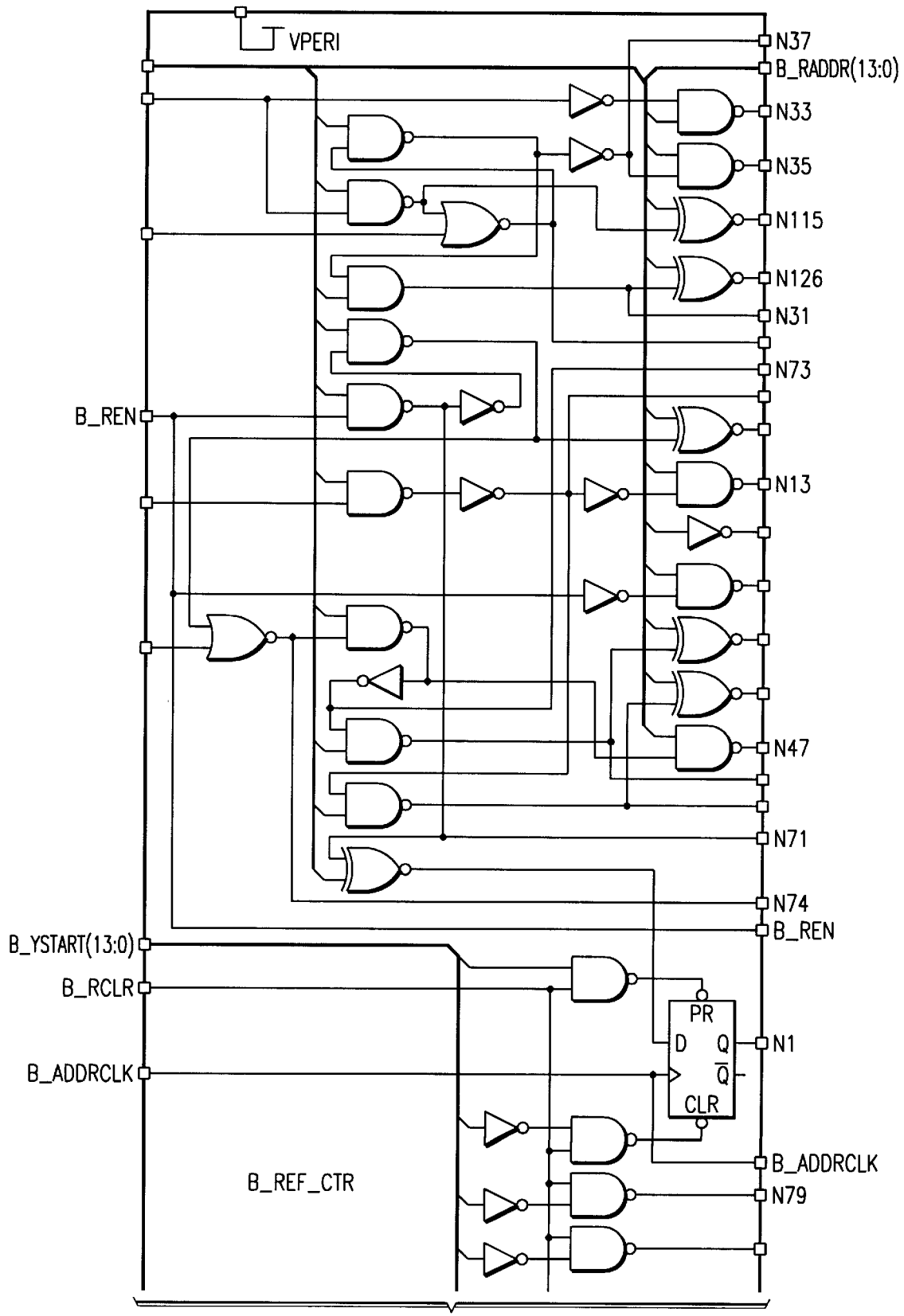
FIG. 57 shows a schematic of the Refresh Counter.
Figure 57B:
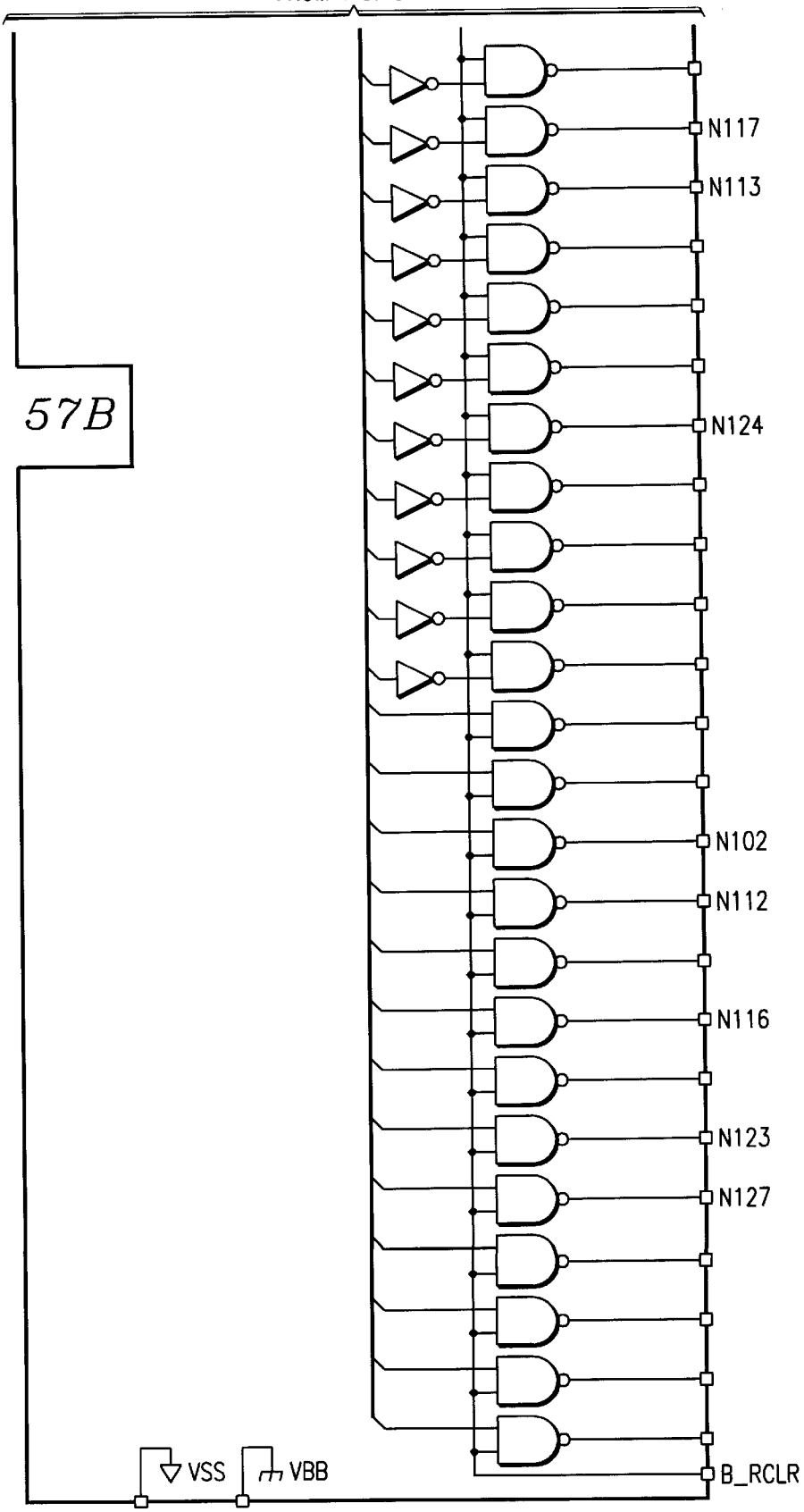
Figure 58A:
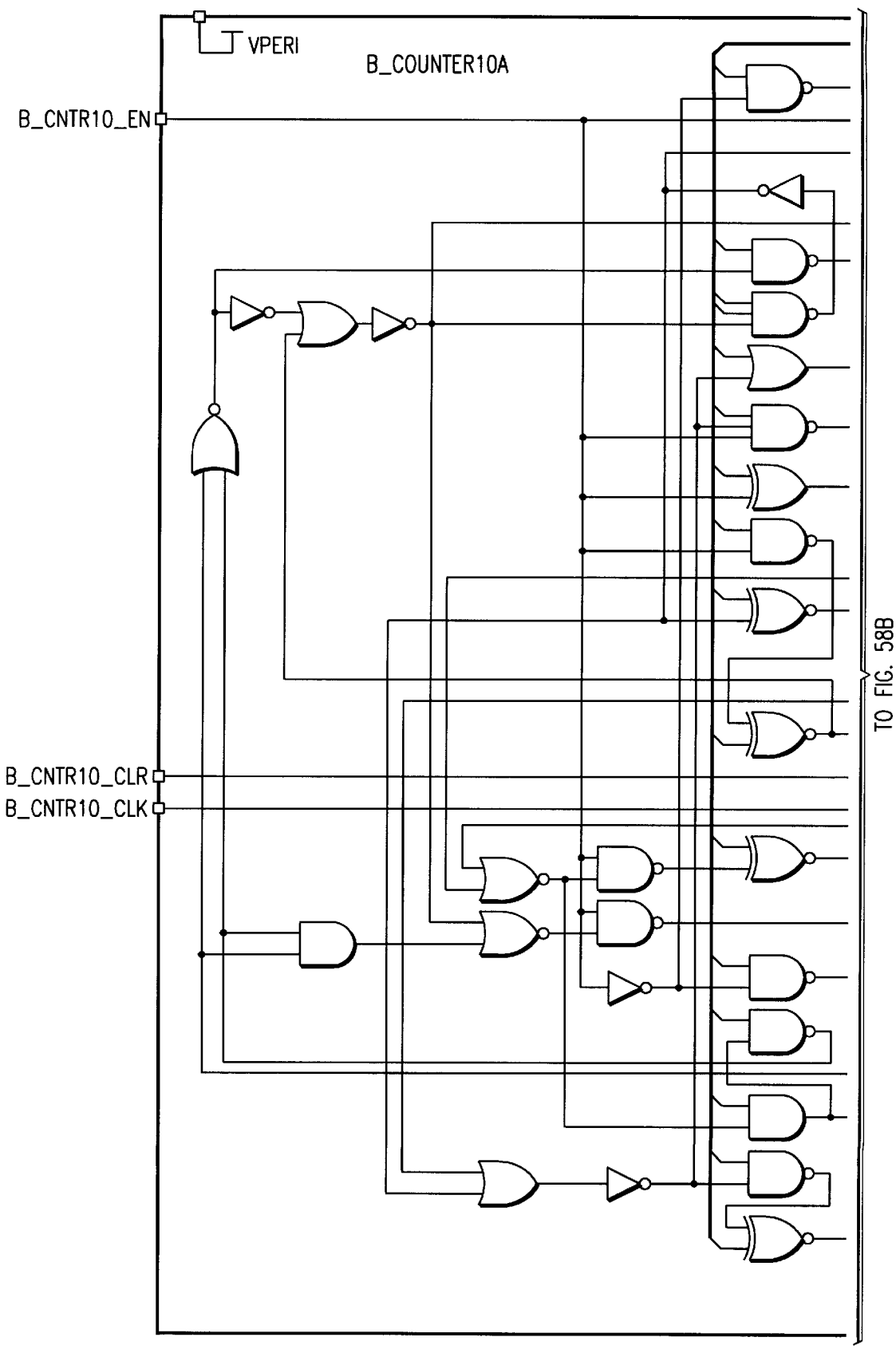
FIG. 58 shows a schematic of the 10 bit Counter "A"
Figure 58B:
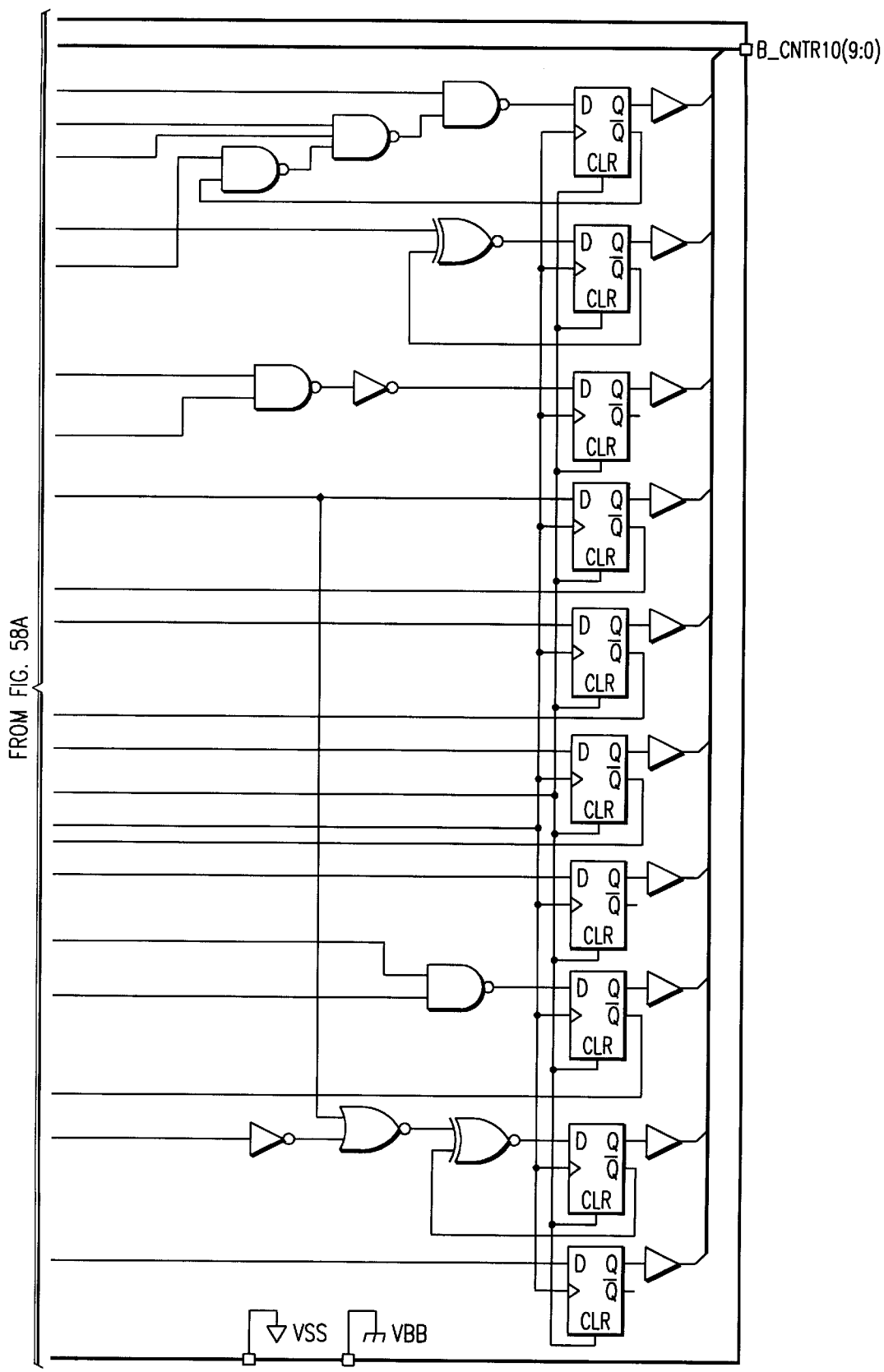
Figure 59:
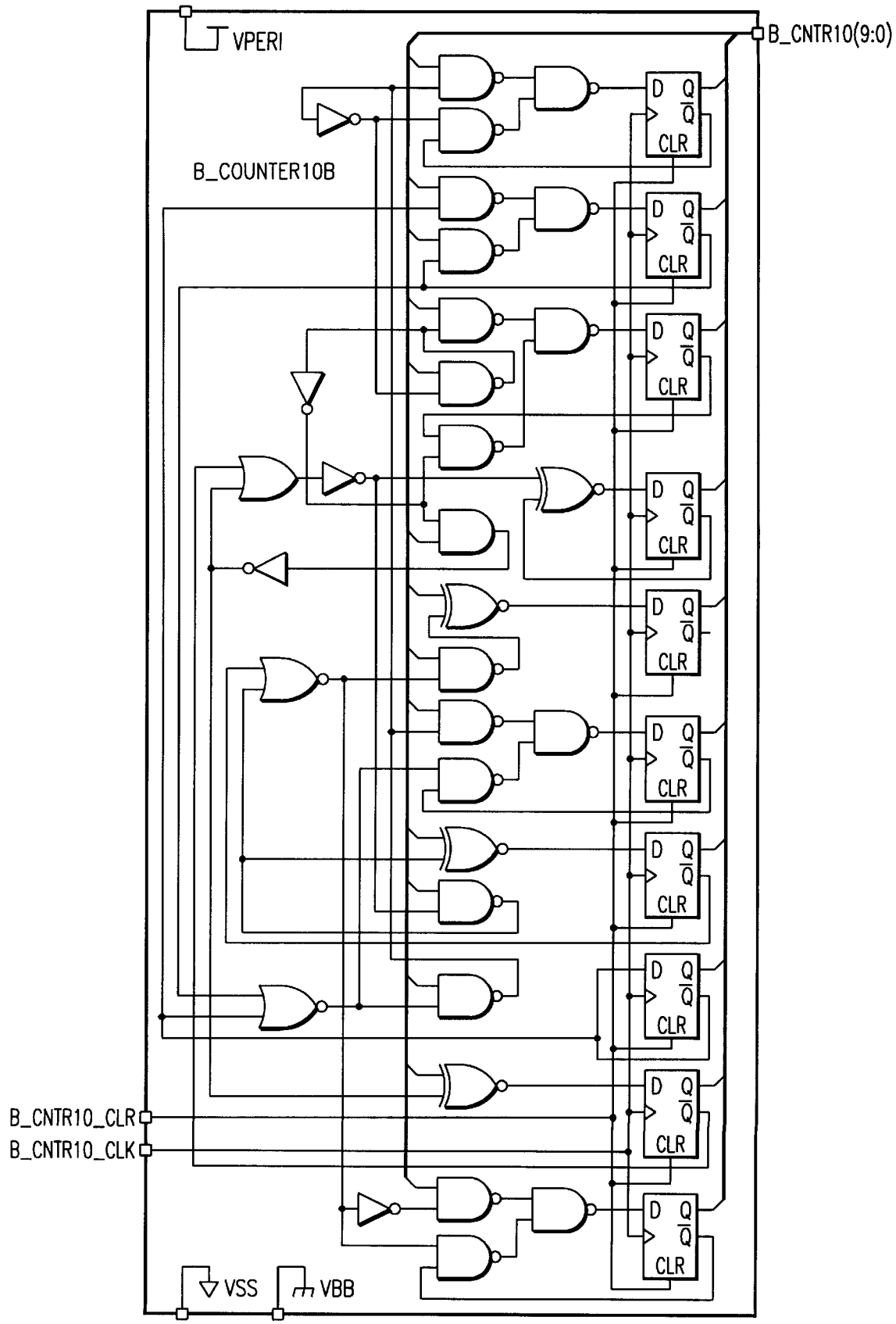
FIG. 59 shows a schematic of the 10 bit Counter "B"
Figure 60:
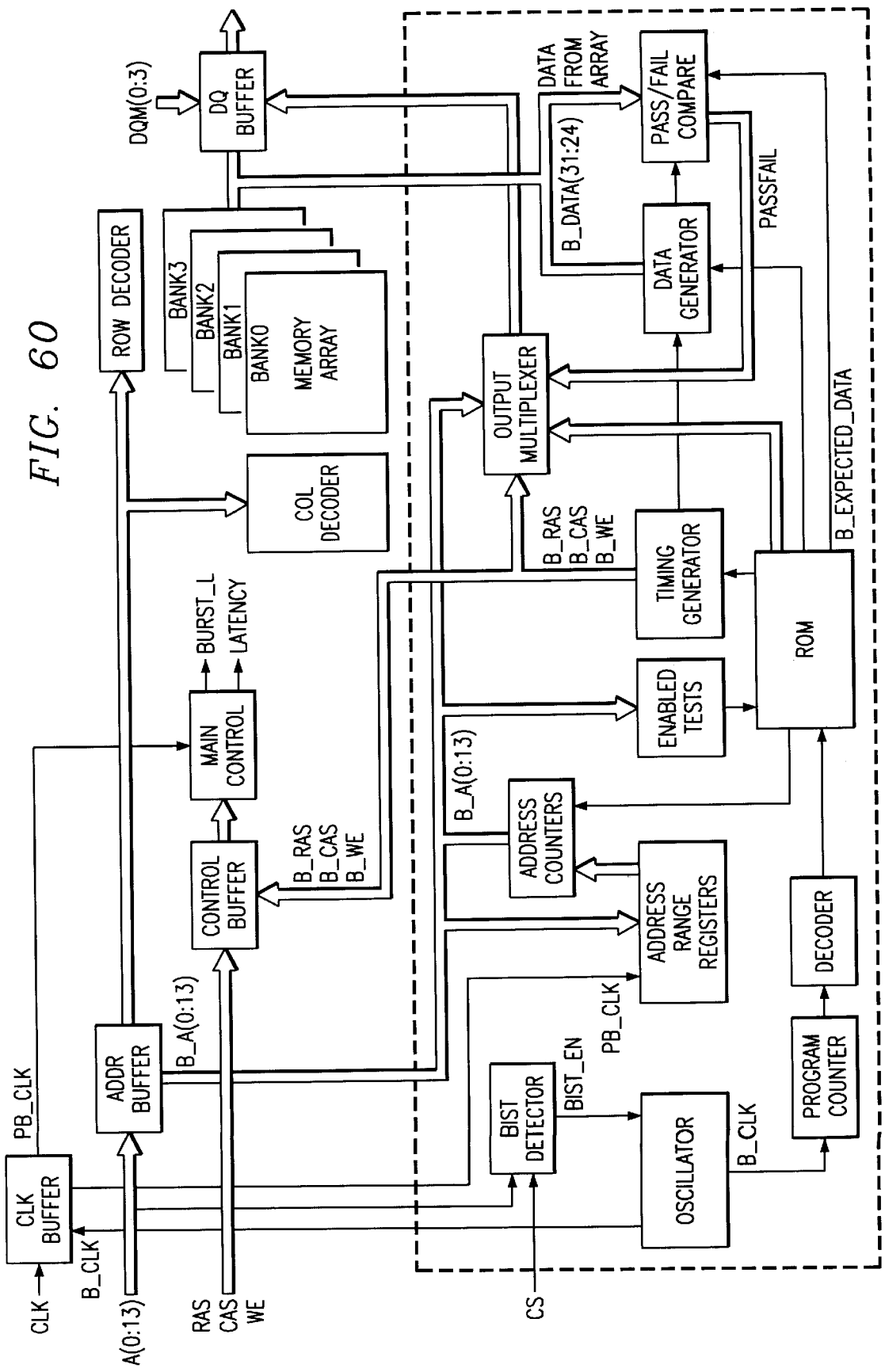
FIG. 60 shows a diagram of the BIST block and Interface.
Figures 64, 66:
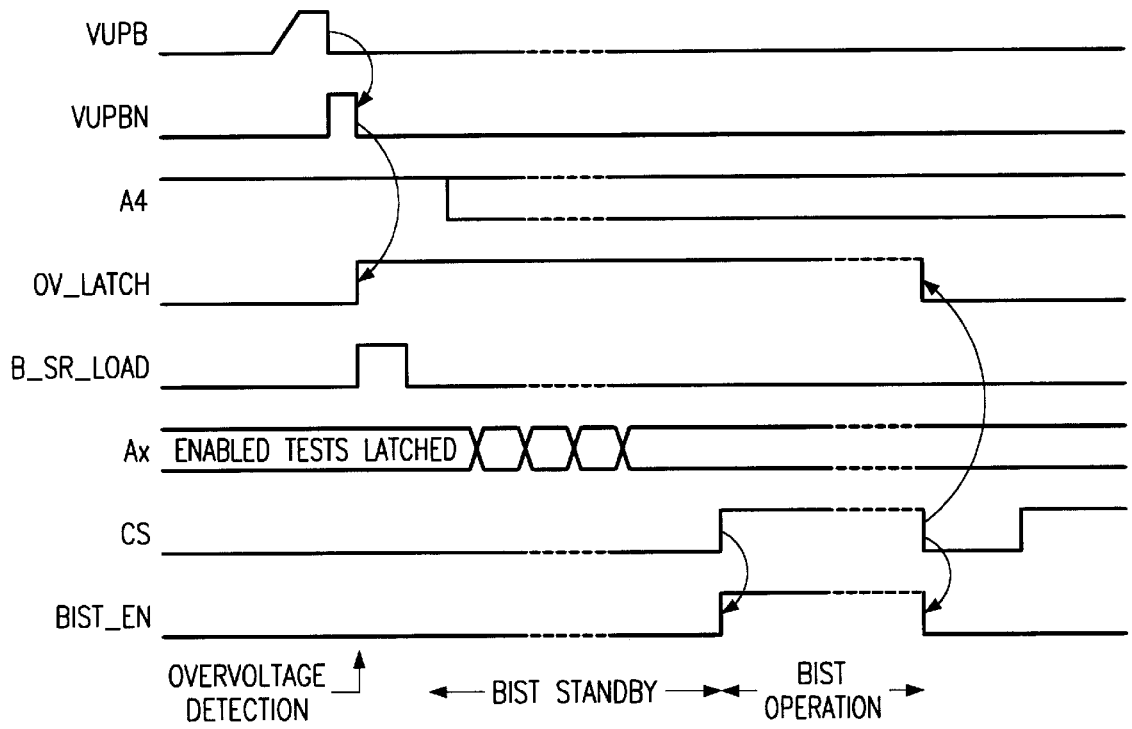
FIG. 64 shows a timing diagram.
FIG. 66 shows a table for clock multiplexing.
Figure 67:
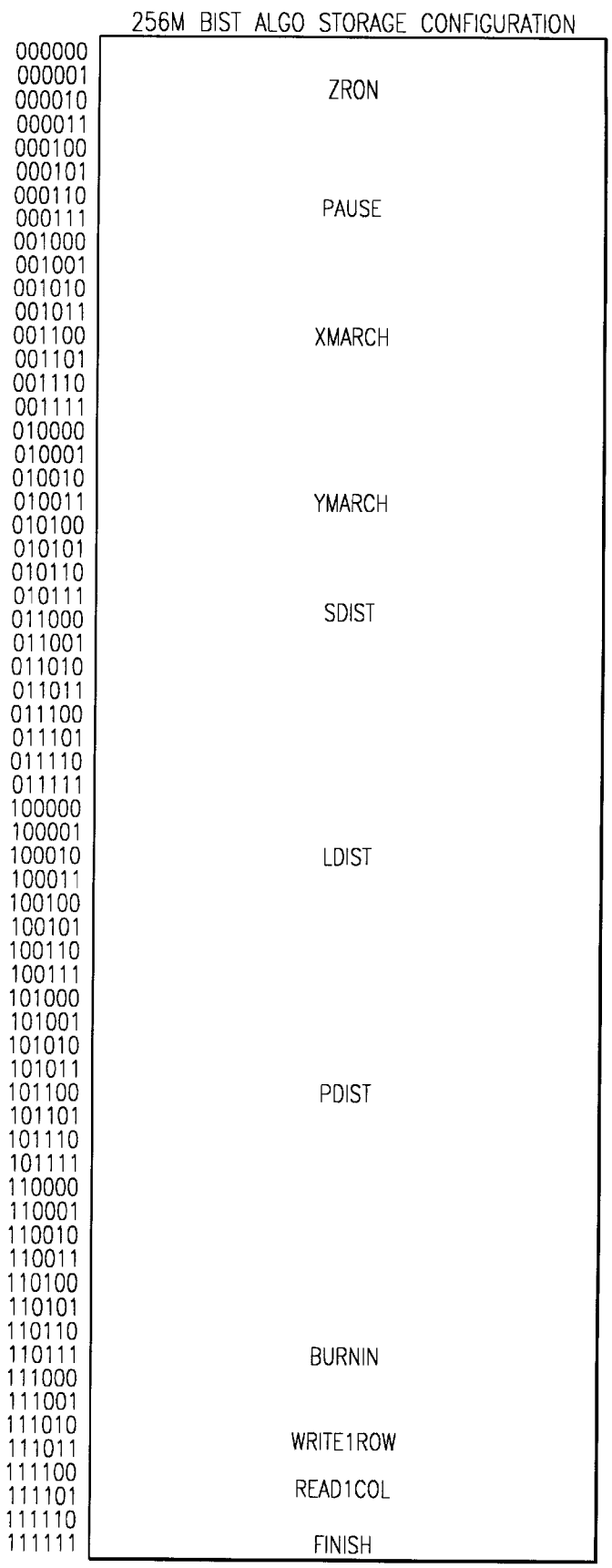
FIG. 67 shows a diagram the ROM Memory Map.
Figure 68:
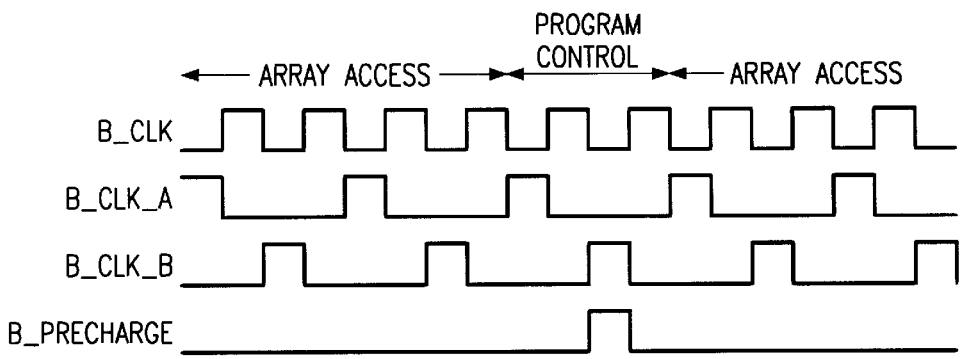
FIG. 68 shows a timing diagram for array access and program control.
Figure 69:
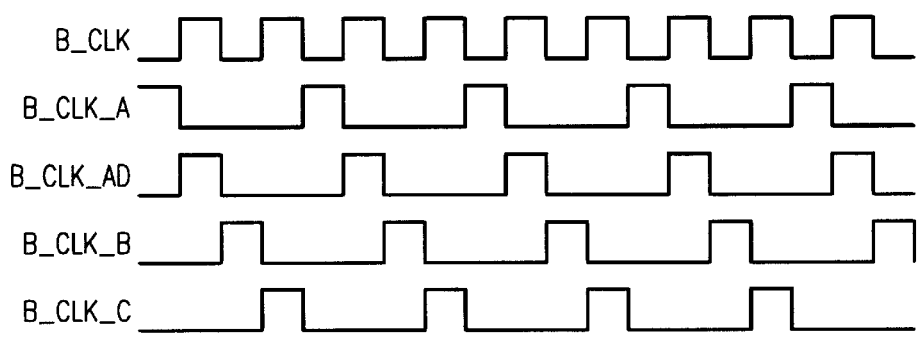
FIG. 69 shows a timing diagram.
Figure 70:
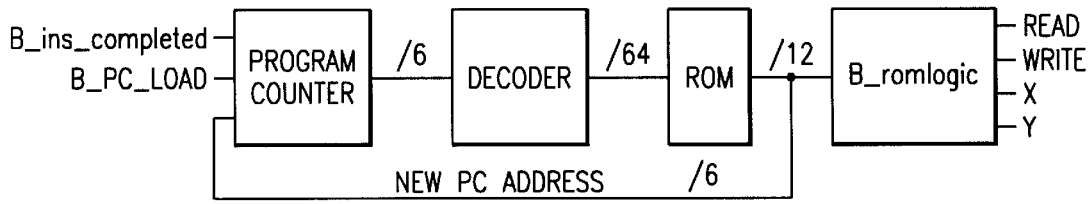
FIG. 70 shows a block diagram of the ROM interface.
Figure 71:
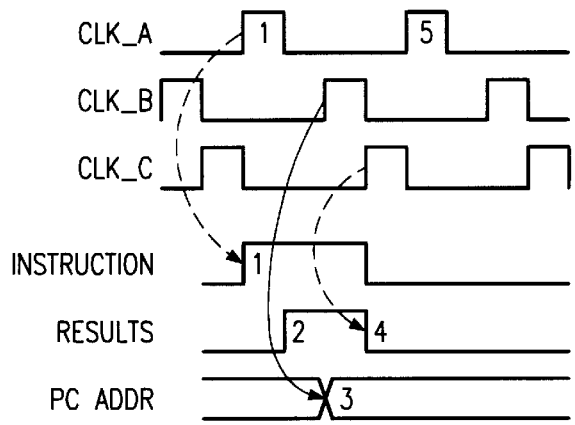
FIG. 71 shows a diagram of the Instruction Timing.
Figure 75A:
FIG. 75 shows a diagram of the Timing Sets.
Figure 75B:
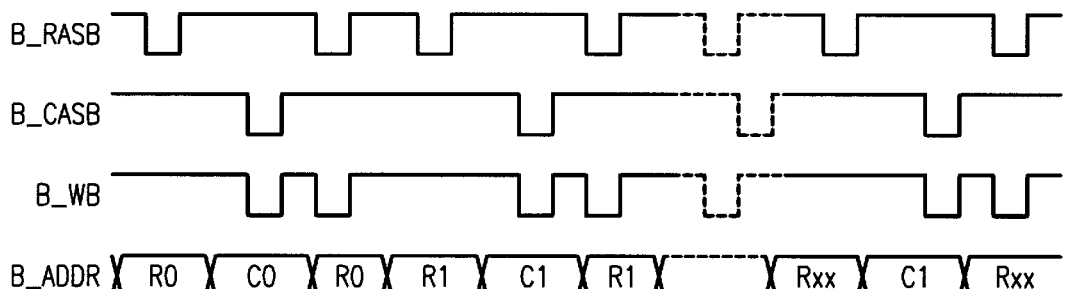
Figure 75C:
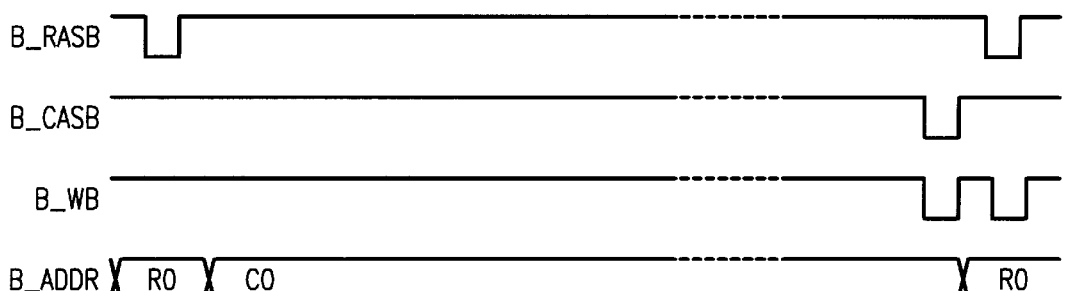
Figure 75D:
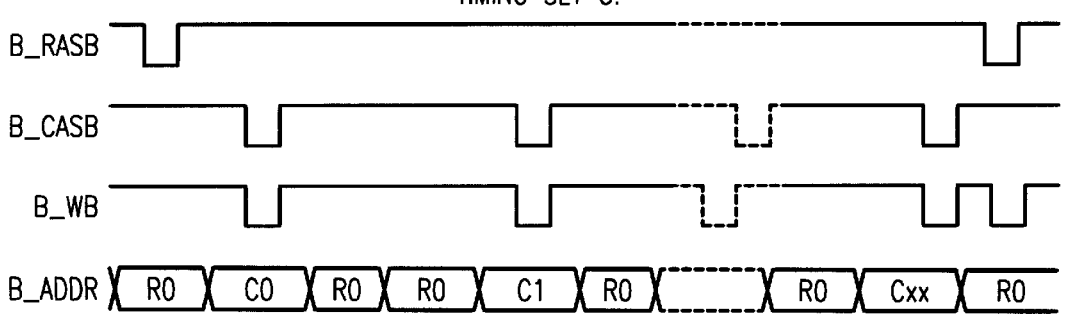
Figure 81:
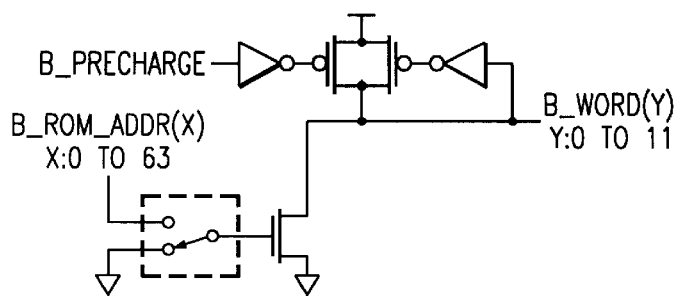
FIG. 81 shows a diagram of the ROM programming schematic, option low.
Figure 82:
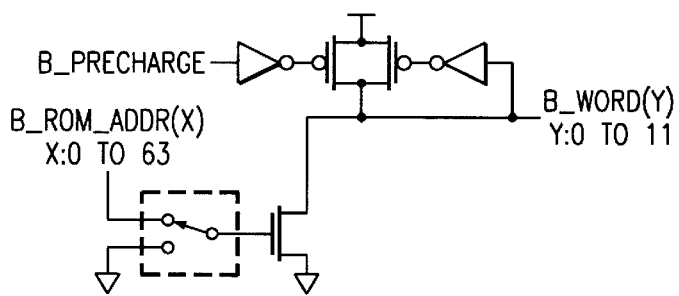
FIG. 82 shows a diagram of the ROM programming schematic, option high.
Figures 83A, 83B, 83C:
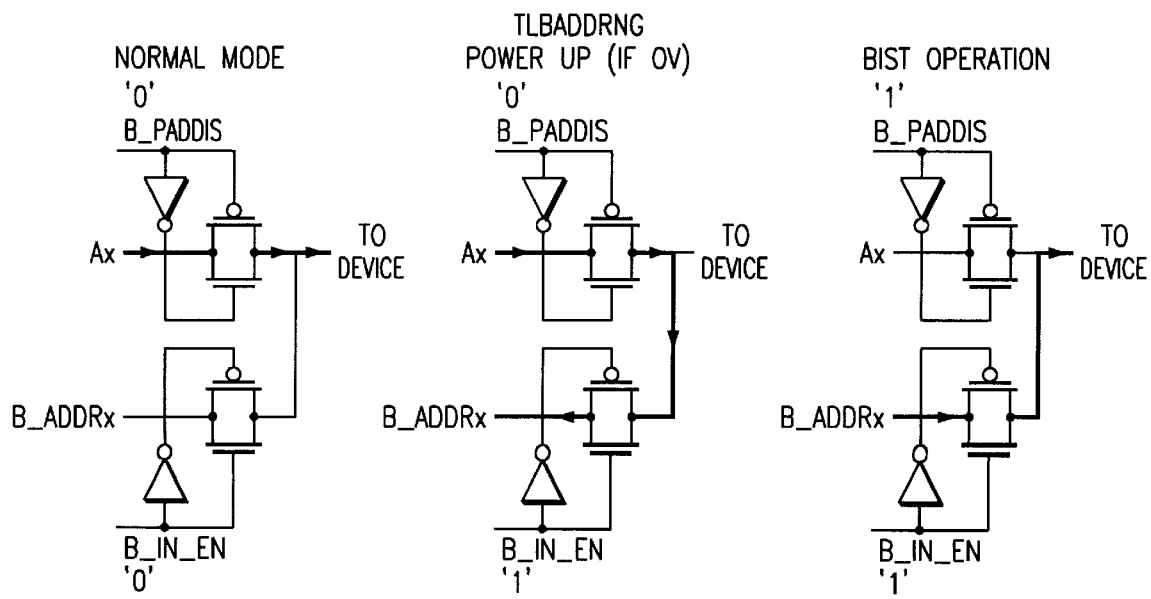
FIG. 83a –c show a diagram of the Multiplexing Circuits.

FIG. 44 presents the logic schematic diagram of an exemplary pass/fail circuit 430 that can be used in the built-in self-test arrangement 60. The pass/fail circuit 430 is responsive to control signals and a data bit received by way of the BIST data bus 421 from the ROM register 420 to produce a sequence of groups of data signals to be written into at least one bank of the memory array 220 in response to a write instruction from the BIST ROM 400. Pass/fail circuit 430 also receives control signals and a data bit by way of the BIST data bus 421 and read out data on a DQ bus 431 from the memory array 60, in response to a read instruction. In this instance, the data bit from the BIST data bus 421 is processed to agree with the state of a prior-existing data bit that was written into the array location/ locations from which the data on the DQ bus 431 is read. The processed data bit is referred to as an expected data bit. This expected data bit is compared with the data read from the memory array 60 and the result of the comparison is a Pass signal if the compared data are equal and is a Fail signal if the compared data are not equal. The Pass signal, indicating that the circuits traversed by the written in and read out data and the storage cell are operating correctly, is a low level signal. A Fail signal, indicating that some part of the circuits traversed by the written in and read out data or the storage cell is malfunctioning, is a high level signal.

A Fail signal is transmitted by way of a lead B_Pass/Fail to a PF register 432 where it is stored. Subsequently the stored Fail signal can be conveyed through a DQ buffer circuit 230 to an external pad of the memory device. PF register 432 is reset upon entry of the active self-test mode. Pass signals are ignored and in effect discarded because they are a low level and the PF register is reset to begin the test operation. An assumption is made that the device is operable. So a single test failure is the only information of importance to be retained.

Referring to FIG. 32, a VHDL language description of the Pass/Fail comparator is shown. VHDL language is a standard language for describing logic circuits used by designers today. Using signal CKBDI for checker board data, B_ALTERNATE for alternate data, B_RDATA for expected data (ED) and B_WDATA for write data (DAT), the data which is expected to write and to compare the read data is calculated. The read data is compared to the calculated expected data to determine if the test passed or failed.

Figure 33:
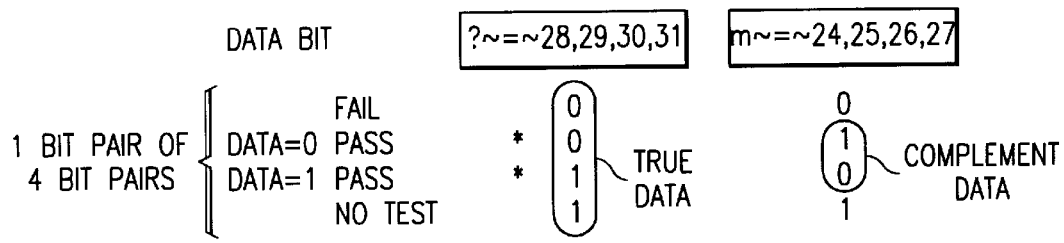
FIG. 33 is a truth table and definitions.
Figure 33A:
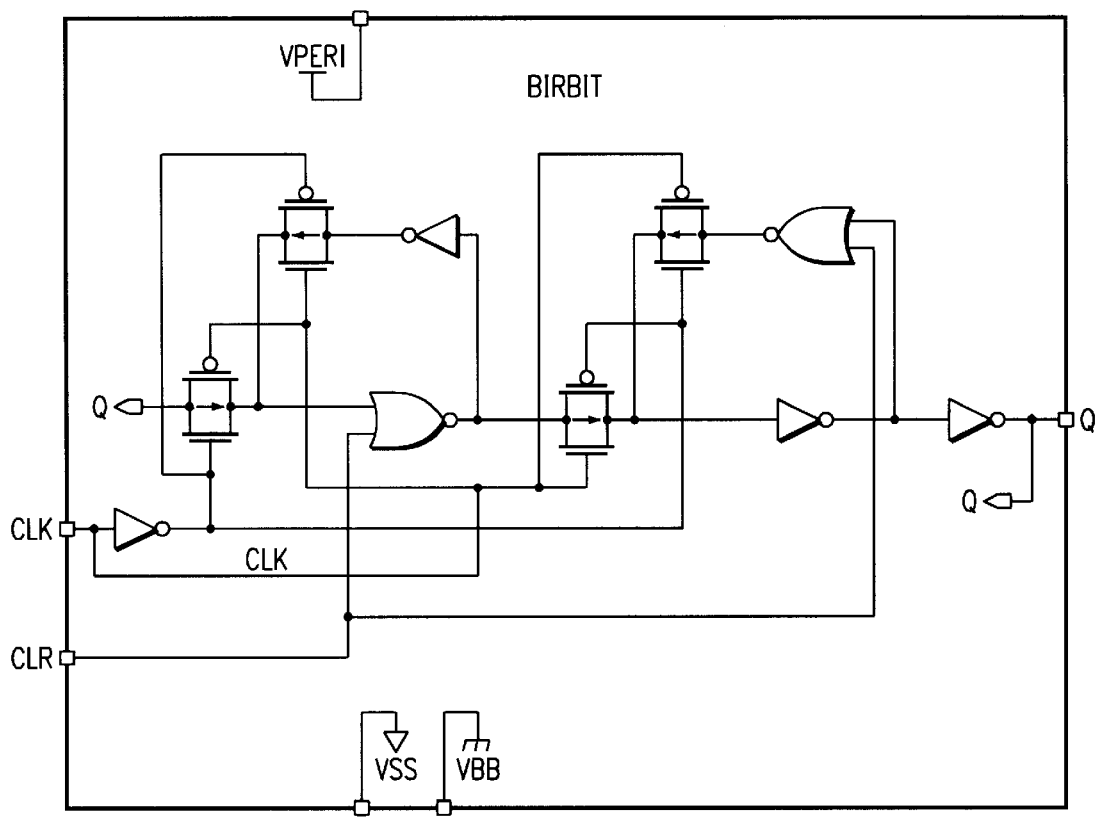
FIG. 33a shows a schematic of the Bist Internal Refresh Bit.
Figure 34:
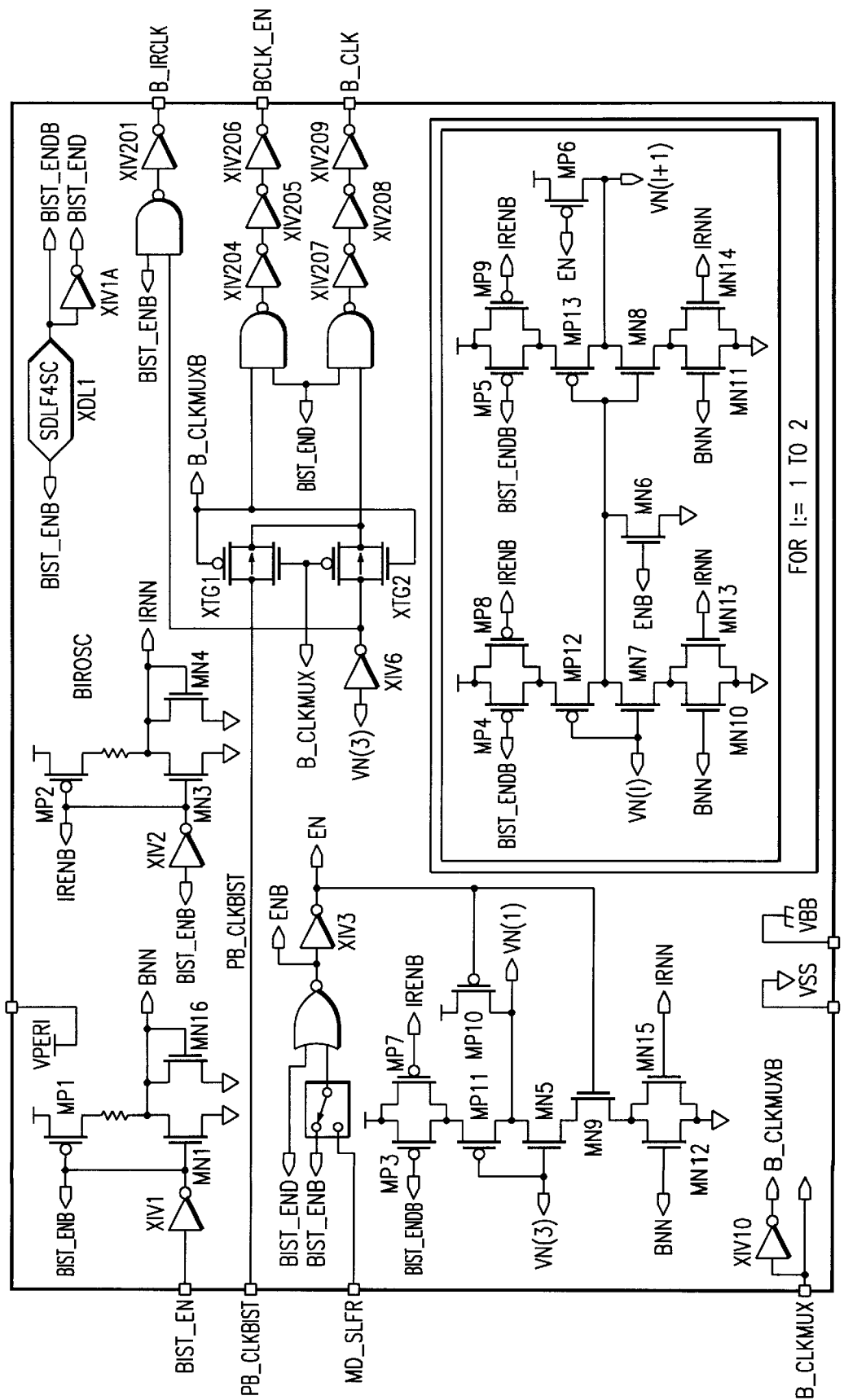
FIG. 34 shows a schematic of the Internal Refresh Oscillator
Figure 35:
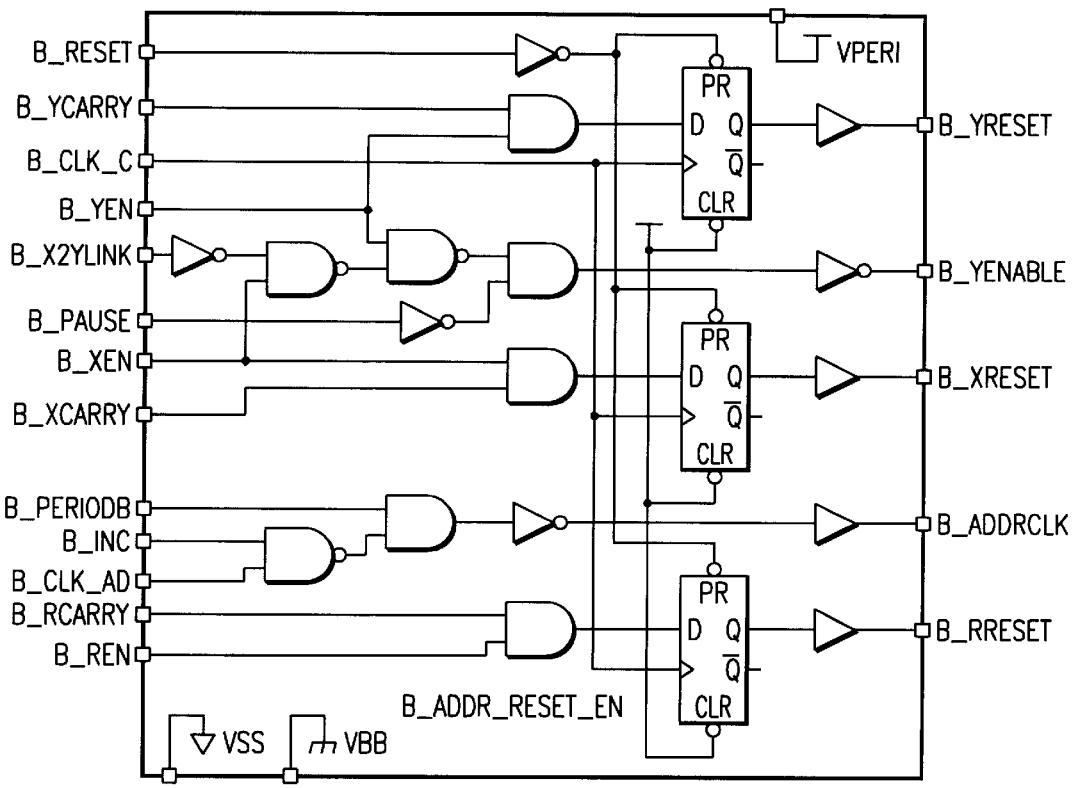
FIG. 35 shows a schematic of the Address Reset Circuitry Sheet1.
Figure 36:
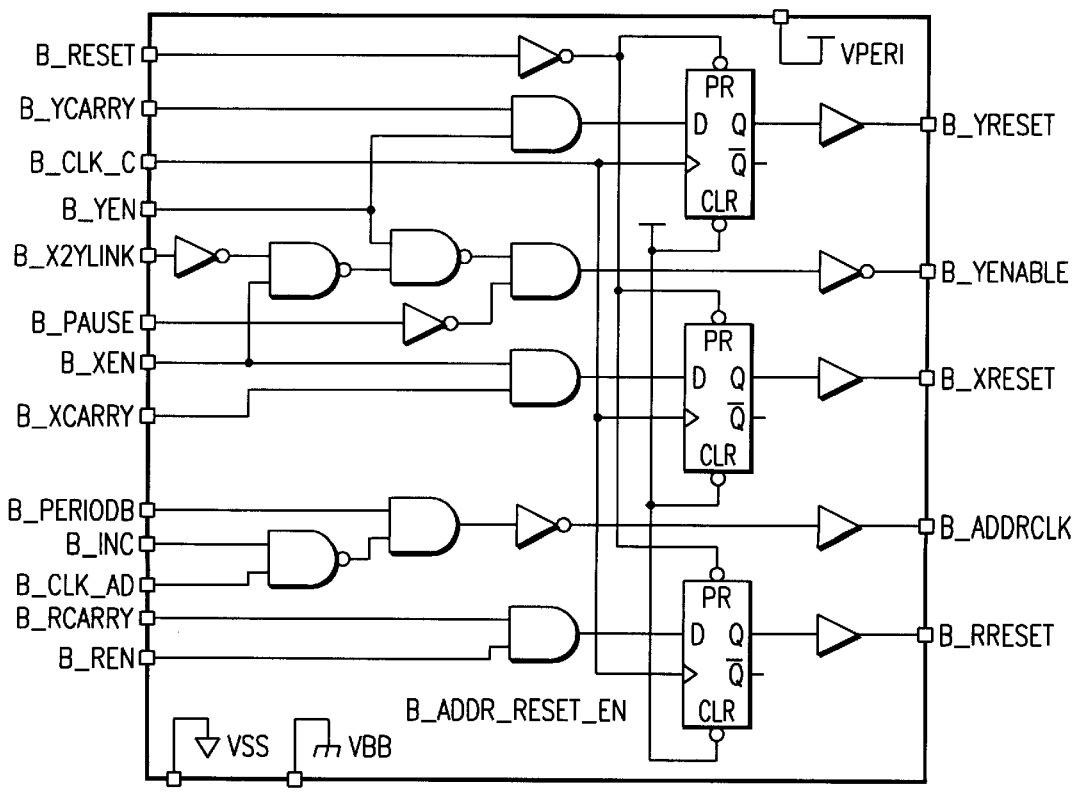
FIG. 36 shows a schematic of the Address Reset Circuitry Sheet2.
Figure 37A:
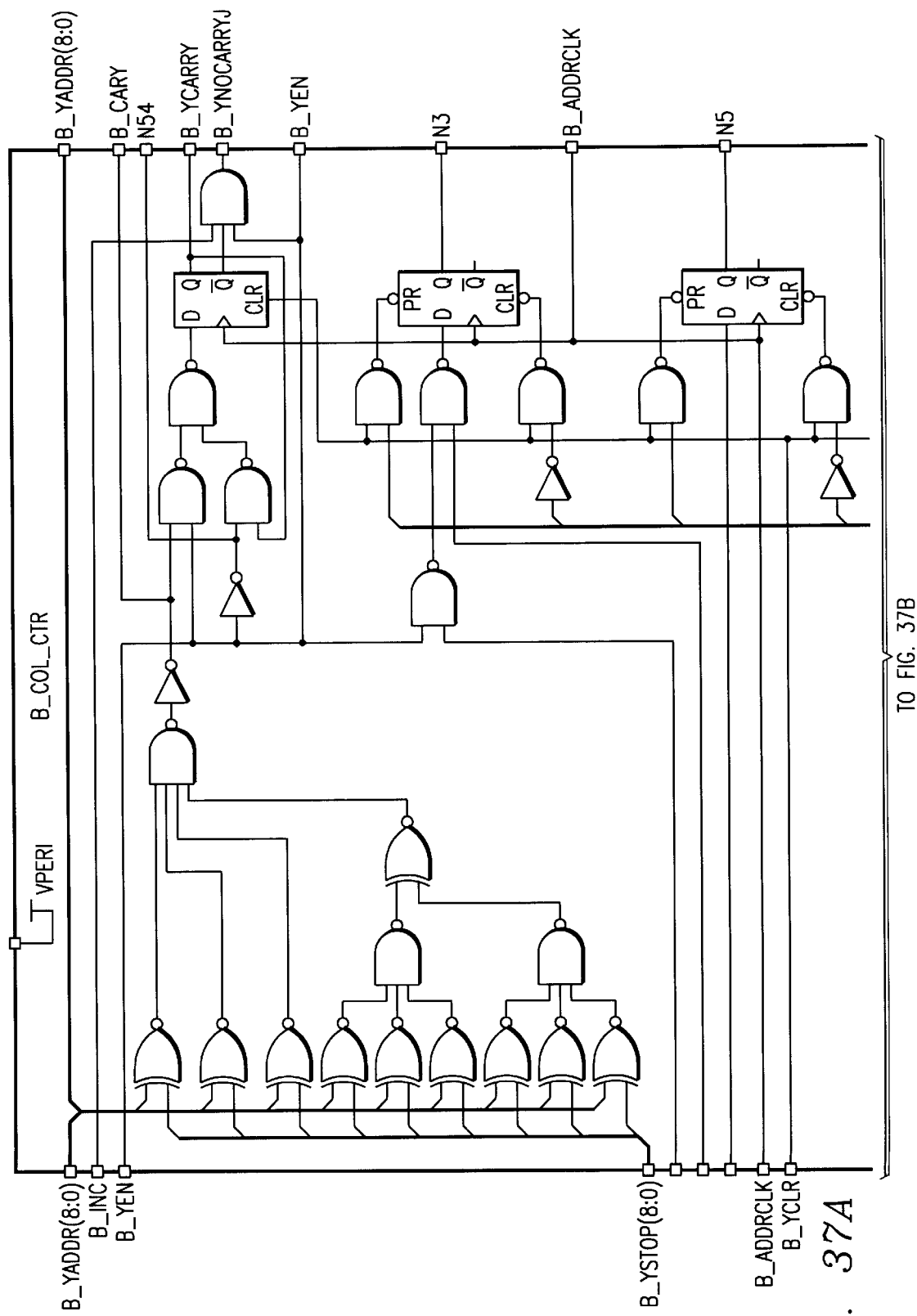
FIG. 37 shows a schematic of the Column Counter.
Figure 37B:
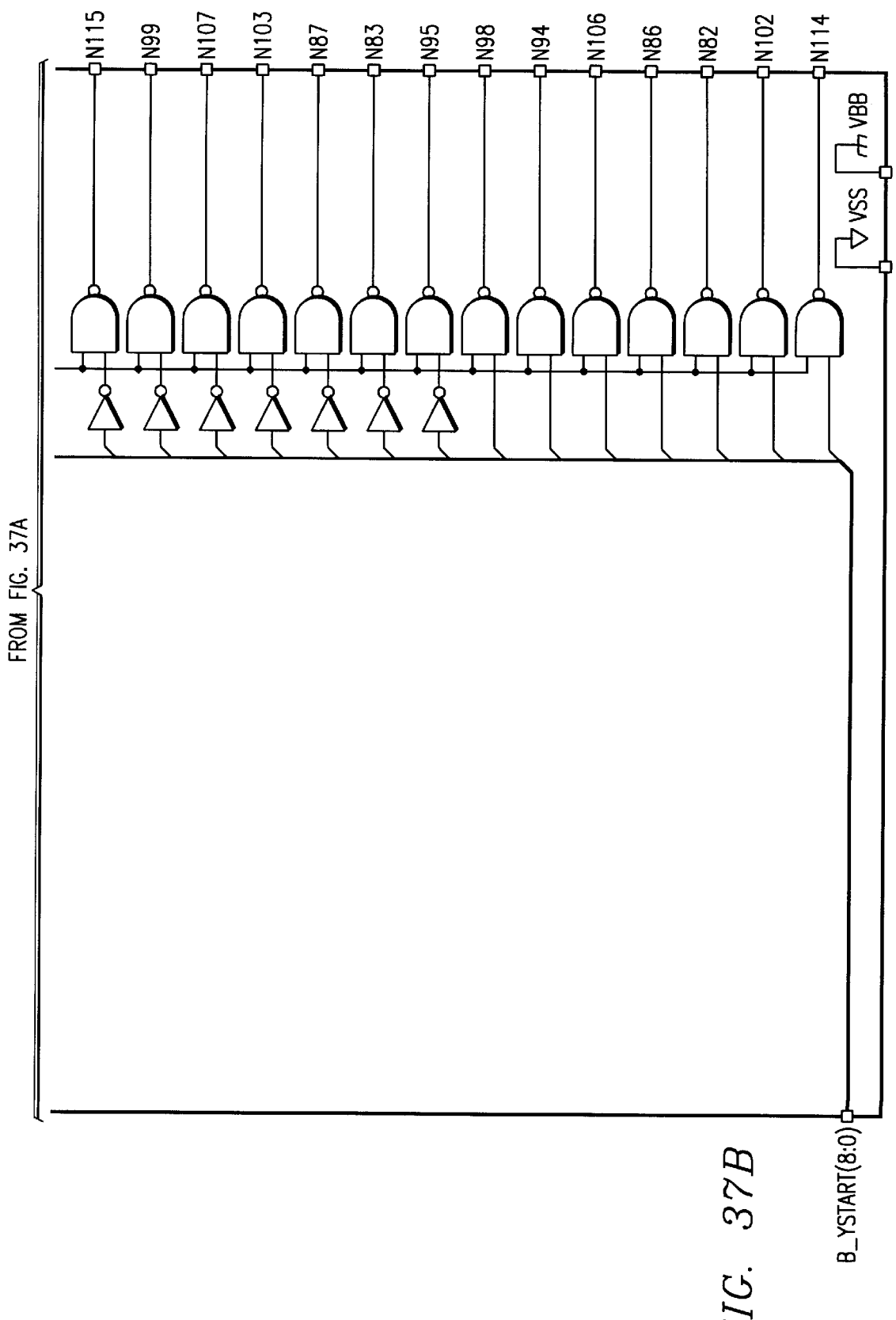
Figure 38A:
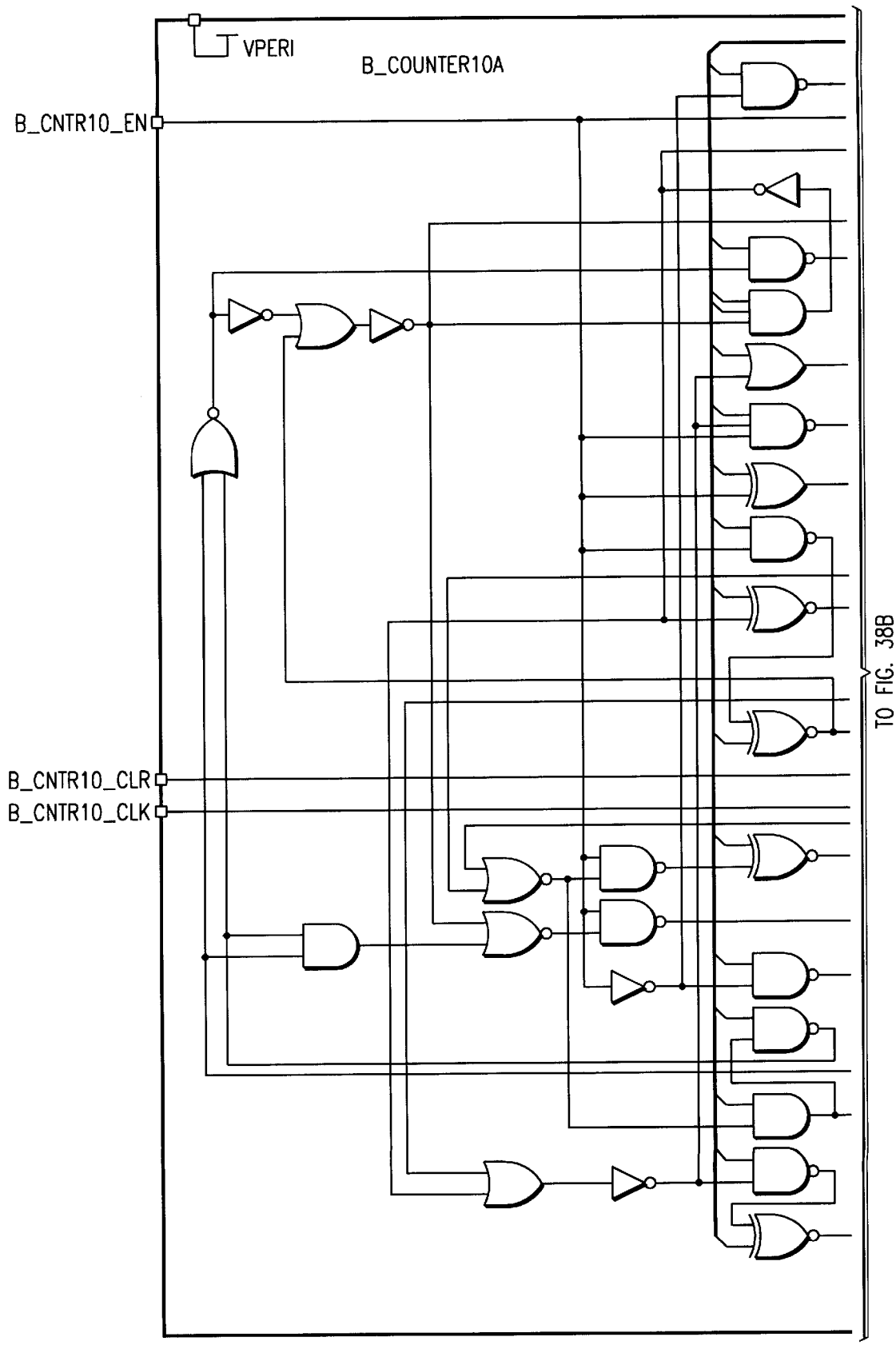
FIG. 38 shows a schematic of the 10 Bit Counter "A"
Figure 38B:
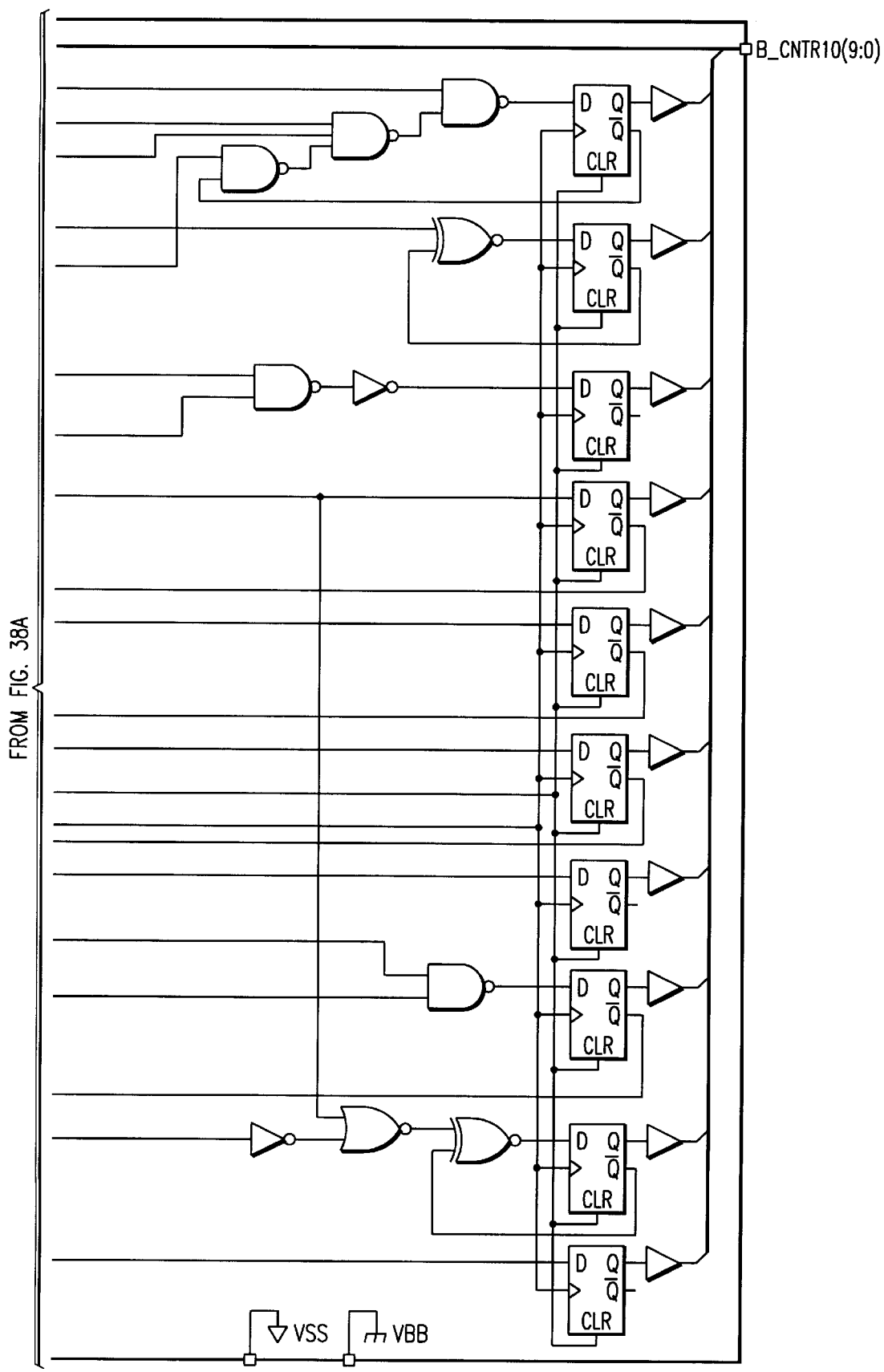
Figure 39:
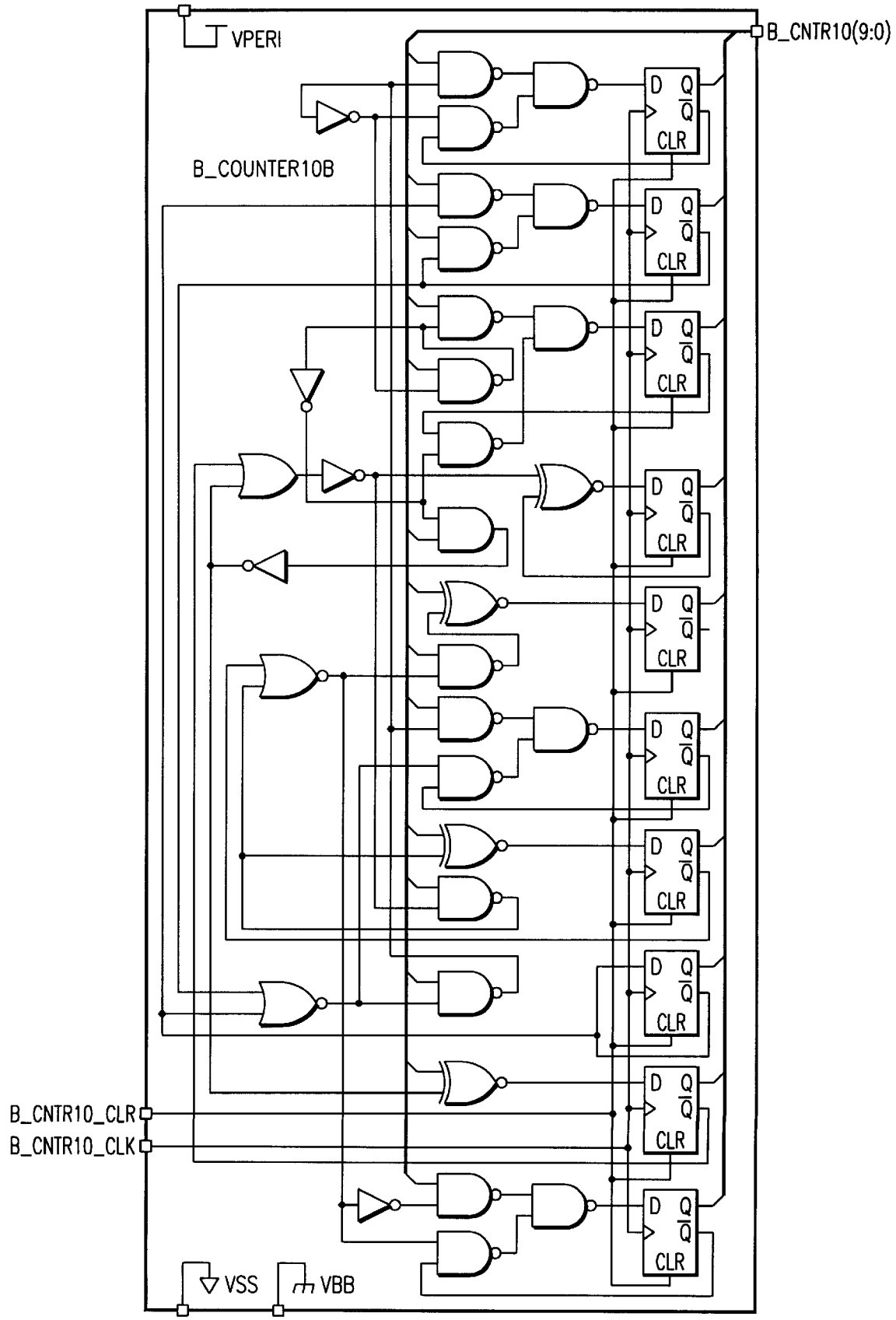
FIG. 39 shows a schematic of the 10 Bit Counter "8"
Figure 40:
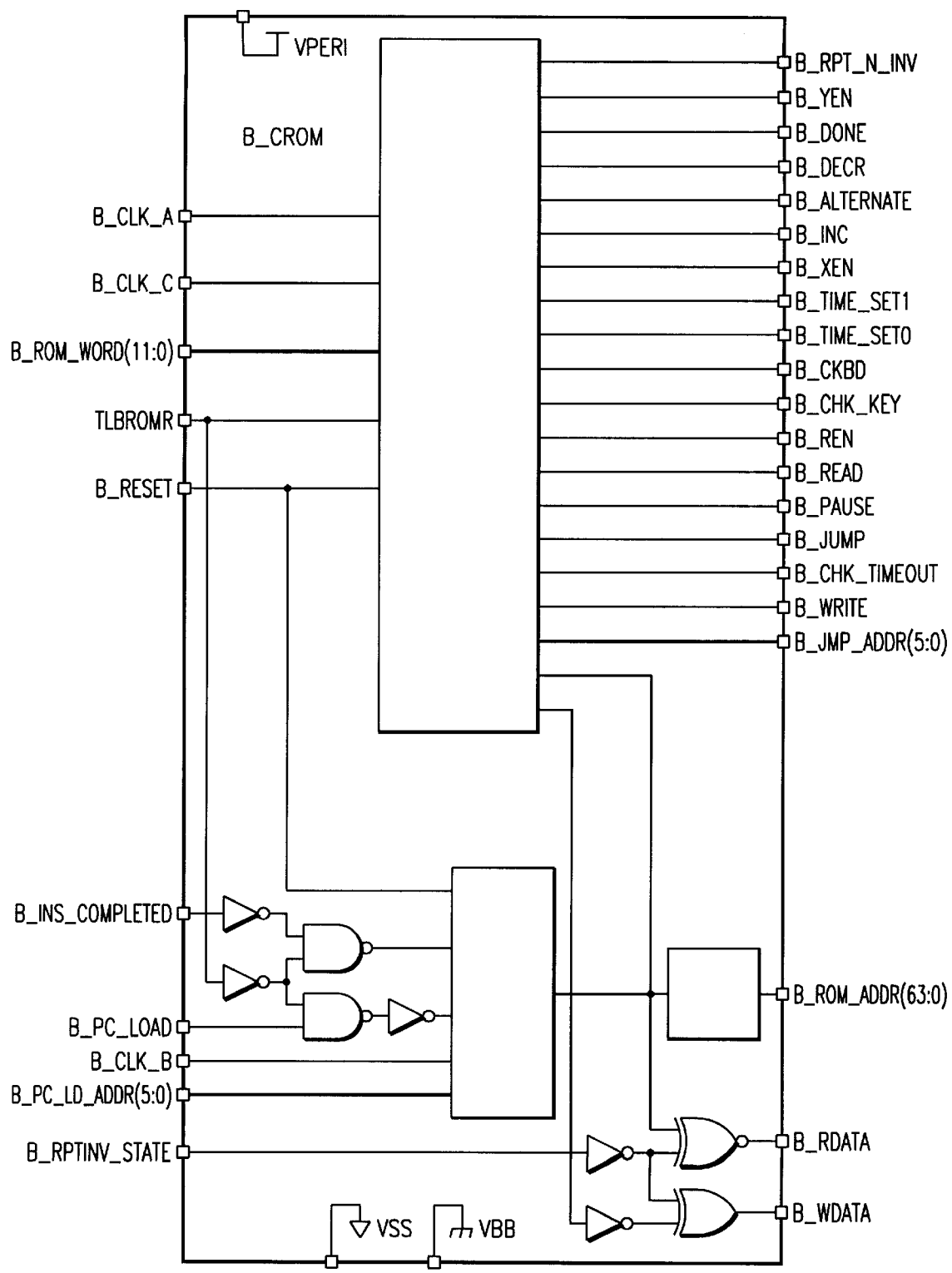
FIG. 40 shows a schematic of the Control ROM.
Figure 41A:
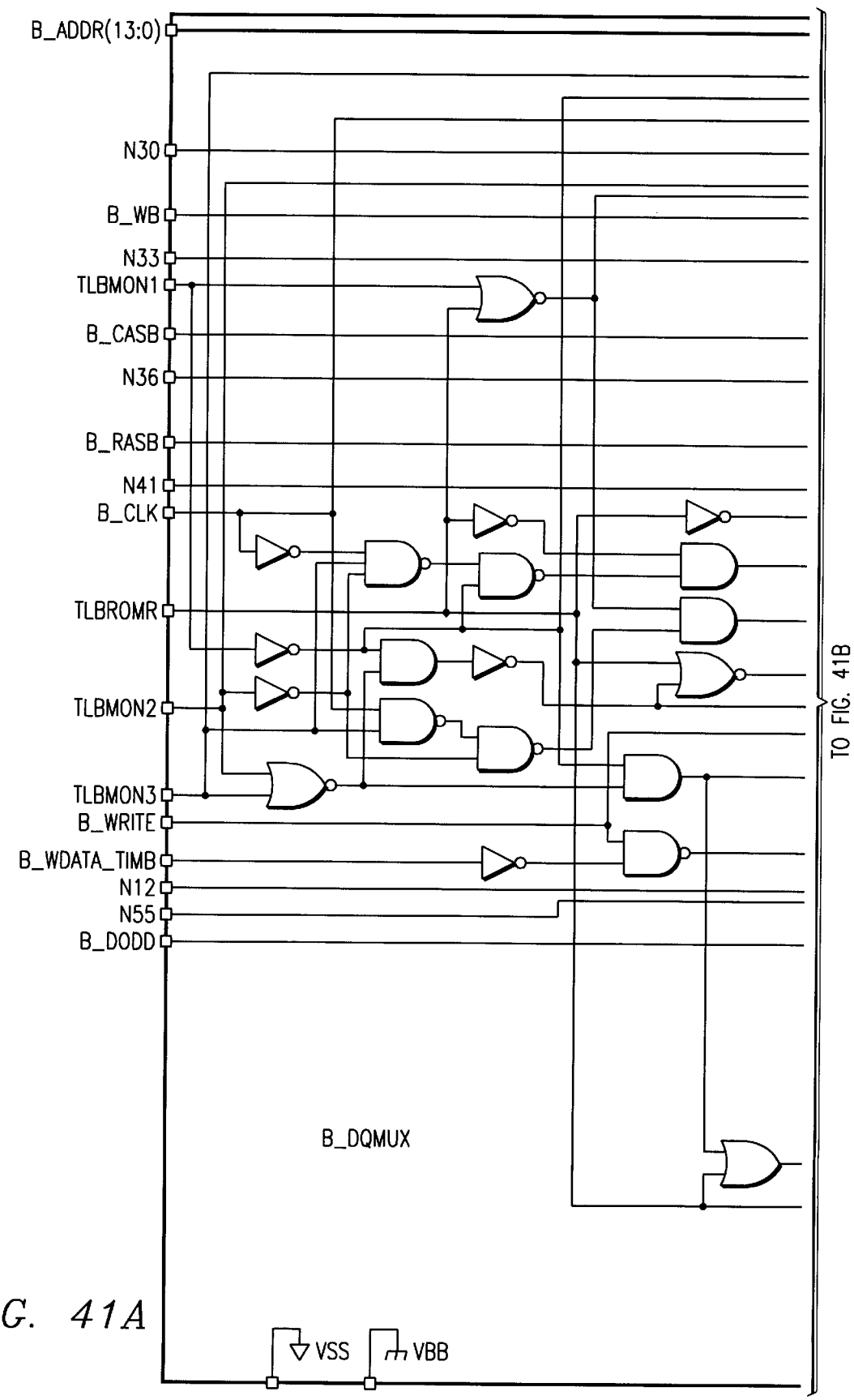
FIG. 41 shows a schematic of a Data Multiplexer (MUX)
Figure 41B:
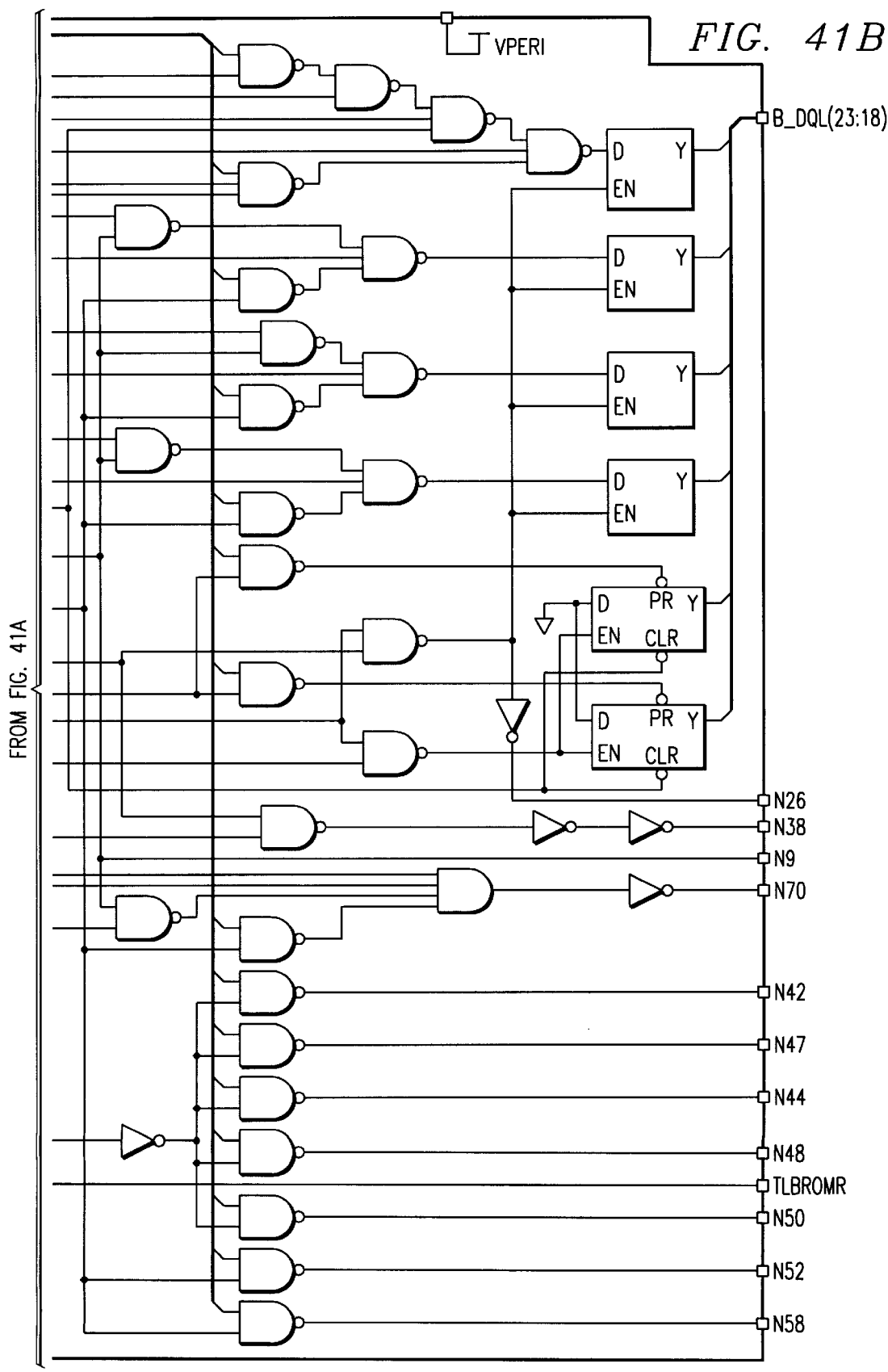
Figure 42:
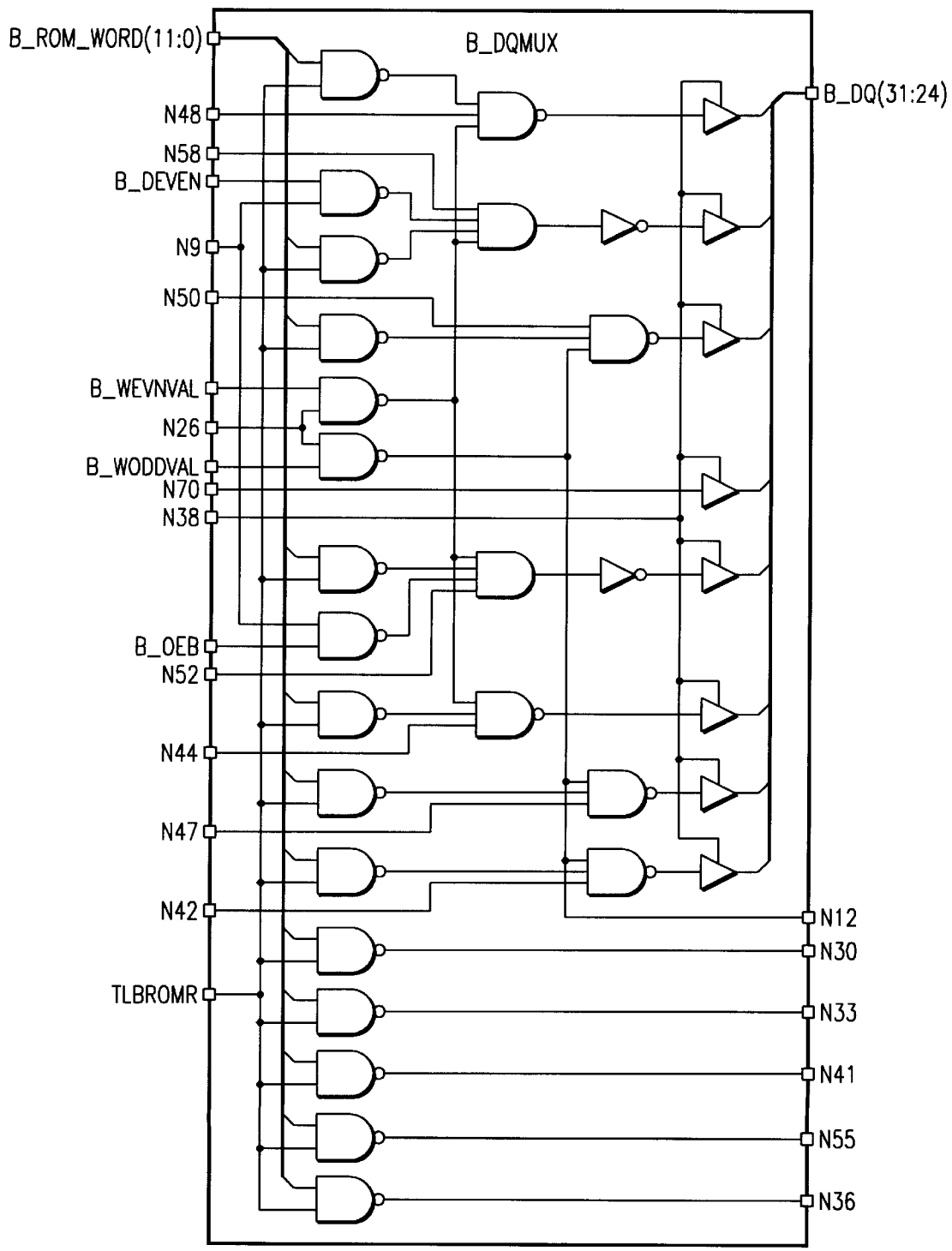
FIG. 42 shows a schematic of the Data Multiplexer (MUX) Con't)
Figure 43:
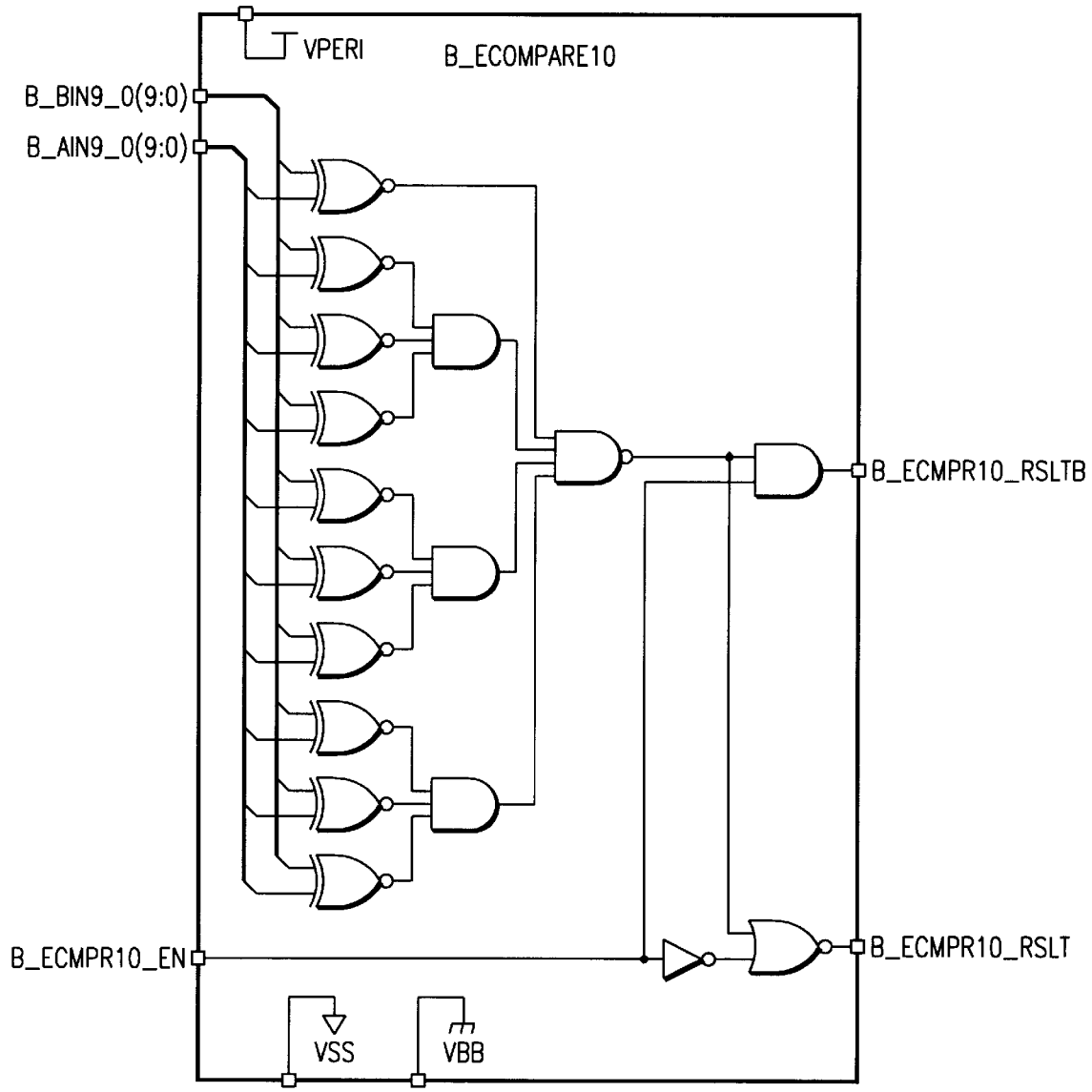
FIG. 43 shows a schematic of Compare Circuitry.

Referring to FIG. 33, the functional table is given. The 32 bits of the array 220 compressed to 4 data bits using 8 DQ lines. The compression table is shown in FIG. 33. B_PF_ results gives the pass or fail depending on the corresponding values shown in the table.

The foregoing describes the arrangement and operation of an exemplary integrated circuit memory device having built-in self-test circuitry. The described arrangement and method of and other arrangements made obvious in view there of are considered to be within the scope of the appended claims.

What is claimed is:

1. An integrated circuit operable in either normal mode or self test mode comprising:
   a plurality of memory cells arranged in an array of plural rows and plural columns,
   a Self Test Circuit coupled to the memory array and generating read and write accesses to the memory array in order to test memory cells within the memory array when the integrated circuit is operating in self test mode, the Self Test Circuit operating under the control of a test clock signal; and
   a Test Clock Circuit connected to the Self Test Circuit and generating the test clock signal, the Test Clock Circuit choosing between an external clock and an internal clock in generating the test clock signal.

2. The integrated circuit of claim 1, wherein the Self Test Circuit comprises a memory unit for storing a plurality of test algorithms.

3. The integrated circuit of claim 2 further including a Test Program Counter and Test Memory Address Decoder, and wherein the Test Program Counter and Test Memory Address Decoder access the test algorithms in the memory unit in response to the test clock signal.

4. The integrated circuit of claim 1 further including a Test Enable Circuit including an internal clock option register which is loaded by an externally applied signal and wherein the Test Clock Circuit chooses between the external clock and the internal clock based on the signal loaded into the internal clock option register.

5. The integrated circuit of claim 2 further including a Test Enable Circuit comprising:
   an internal clock option register which is loaded by a first externally applied signal and wherein the Test Clock Circuit chooses between the external clock and the internal clock based on the signal loaded into the internal clock option register; and
   test selection data registers loaded by other externally applied signals different from the first externally applied signal to indicate whether the test algorithms stored in the ROM are enabled.

6. The Test Enable Circuit of claim 4, wherein the external clock is derived from a clock signal applied to an external pin of the integrated circuit and the internal clock is generated within the integrated circuit.

7. The Test Enable Circuit of claim 6, wherein the externally applied signal which is loaded into the internal clock option register is a signal applied to at least one address pin of the integrated circuit.

8. The Test Enable Circuit of claim 5, wherein the external clock is derived from a clock signal applied to an external pin of the integrated circuit and the internal clock is generated within the integrated circuit.

9. The Test Enable Circuit of claim 8, wherein at least some of the externally applied signals loaded into the test selection data registers or the internal clock option register are applied to address pins of the integrated circuit.

10. The Test Enable Circuit of claim 6, wherein the internal clock is generated by an oscillator circuit in the integrated circuit.

11. The integrated circuit of claim 1, wherein the Self Test circuitry further generates test addresses that correspond to particular memory cells within the memory array and also generates test data to be applied to those memory cells during the generated write accesses.

12. The integrated circuit of claim 2, wherein the memory unit for storing the plurality of test algorithms is read only memory (ROM).

13. An integrated circuit operable in either normal mode or self test mode comprising:
   a plurality of memory cells arranged in an array of plural rows and plural columns, the memory cells formed at intersections of the rows and columns;
   a Self Test Circuit coupled to the array of memory cells and including circuitry to generate test addresses in order to allow test data to be written into memory cells corresponding to the generated test addresses, the Self Test Circuit operating under the control of a test clock signal; and
   a Test Clock Circuit connected to the Self Test Circuit and generating the test clock signal, the Test Clock Circuit choosing between an external clock source and an internal clock source in generating the test clock signal.

14. The integrated circuit of claim 13, wherein the Self Test Circuit also generates the test data to be written into the memory cells corresponding to the generated test addresses.

15. The Self Test Circuit of claim 13, further generating write accesses to write the test data into at least some of the memory cells during the self test mode.

16. The Self Test Circuit of claim 15 further generating read accesses to read the test data from specific locations in the array of memory cells, the Self Test Circuit comparing the data read with expected data.

17. The integrated circuit of claim 13, wherein the Self Test Circuit comprises a memory unit for storing a plurality of test algorithms which control the write accesses.

18. The integrated circuit of claim 17, wherein the memory unit is a read only memory unit (ROM).

19. The integrated circuit of claim 18 further including a Test Program Counter and a ROM Address Decoder, and wherein the Test Program Counter and ROM Address Decoder access the test algorithms in the ROM in response to the test clock signal.

20. The integrated circuit of claim 13 further including a Test Enable Circuit including an internal clock option register which is loaded by a first signal applied to at least one external pin of the integrated circuit and wherein the Test Clock Circuit chooses between the external clock source and the internal clock source based on the signal loaded into the internal clock option register.

21. The Test Enable Circuit of claim 18 further including test selection data registers loaded by other signals applied to external pins of the integrated circuit different from the first signal applied to the external pins of the integrated circuit to indicate whether the test algorithms stored in the ROM are enabled.

22. The integrated circuit of claim 13, wherein the external clock source is derived from a clock signal applied to an external pin of the integrated circuit and the internal clock source is generated within the integrated circuit.

23. The Test Enable Circuit of claim 20, wherein the at least one external pin of the integrated circuit is an address pin.

24. The Test Enable Circuit of claim 20, wherein the external clock source is derived from a clock signal applied to an external pin of the integrated circuit and the internal clock source is generated within the integrated circuit.

25. The Test Enable Circuit of claim 21, wherein at least some of the signals applied to external pins of the integrated circuit and loaded into the test selection data registers or the internal clock option register are applied to address pins of the integrated circuit.

26. The integrated circuit of claim 22, wherein the internal clock source is generated by an oscillator circuit in the integrated circuit.

27. The integrated circuit of claim 15, wherein the write accesses are also operating under the control of the test clock signal during the self test mode.

28. The integrated circuit of claim 16, wherein the read accesses are also operating under the control of the test clock signal during the self test mode.

29. An integrated circuit operable in either normal mode or self test mode comprising:
a plurality of memory cells organized in an array of plural rows and plural columns;
a Self Test Circuit coupled to the memory array and including circuitry to generate test data to be written into the memory array during the self test mode, the Self Test Circuit operating under the control of a test clock signal; and
a Test Clock Circuit connected to the Self Test Circuit and generating the test clock signal, the Test Clock Circuit choosing between an externally applied clock signal and an internally generated clock signal in generating the test clock signal.

30. The integrated circuit of claim 29, wherein the Self Test Circuit also generates test addresses, wherein the test data is written into the memory cells corresponding to the generated test addresses during the self test mode.

31. The integrated circuit of claim 29, wherein the Self Test Circuit also generates write accesses in order to write the test data into at least some of the memory cells during the self test mode.

32. The integrated circuit of claim 30, wherein the Self Test Circuit also generates write accesses in order to write the test data into at least some of the memory cells corresponding to the generated test addresses during the self test mode.

33. The Self Test Circuit of claim 31 further generating read accesses to read data from specific locations in the array of memory cells.

34. The Self Test Circuit of claim 32 further generating read accesses to read data from specific locations in the array of memory cells, the Self Test Circuit comparing the data read with expected data.

35. The integrated circuit of claim 29, wherein the circuitry to store a plurality of test algorithms is a memory unit.

36. The integrated circuit of claim 35 wherein the memory unit is a read only memory unit (ROM).

37. The integrated circuit of claim 36 further including a Test Program Counter and a ROM Address Decoder, and wherein the Test Program Counter and ROM Address Decoder access the test algorithms in the ROM in response to the test clock signal.

38. The integrated circuit of claim 29 further including a Test Enable Circuit including an internal clock option register which is loaded by a first signal applied to at least one external pin of the integrated circuit and wherein the Test Clock Circuit chooses between the externally applied clock signal and the internally generated clock signal based on the signal loaded into the internal clock option register.

39. The integrated circuit of claim 29, wherein the externally applied clock signal is derived from a clock signal applied to an external pin of the integrated circuit and the internally generated clock signal is generated by an oscillator circuit located within the integrated circuit.

40. The Test Enable Circuit of claim 38, wherein the at least one external pin of the integrated circuit is an address pin.

41. The integrated circuit of claim 29, wherein the Test Clock Circuit includes a multiplexer comprising a first CMOS pass gate for selecting the externally applied clock signal to generate the test clock signal and a second CMOS pass gate for selecting the internally generated clock signal to generate the test clock signal.

42. The integrated circuit of claim 13, wherein the Test Clock Circuit includes a multiplexer comprising a first CMOS pass gate for selecting the external clock source to generate the test clock signal and a second CMOS pass gate for selecting the internal clock source to generate the test clock signal.

43. The integrated circuit of claim 1, wherein the Test Clock Circuit includes a multiplexer comprising a first CMOS pass gate for selecting the external clock signal to generate the test clock signal and a second CMOS pass gate for selecting the internal clock signal to generate the test clock signal.

* * * * *